United States Patent
Sekikawa

(10) Patent No.: US 9,947,708 B2
(45) Date of Patent: Apr. 17, 2018

(54) SEMICONDUCTOR DEVICE AND MANUFACTURING METHOD OF THE SAME

(71) Applicant: Renesas Electronics Corporation, Koutou-ku, Tokyo (JP)

(72) Inventor: Hiroaki Sekikawa, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 42 days.

(21) Appl. No.: 14/910,688

(22) PCT Filed: Feb. 13, 2015

(86) PCT No.: PCT/JP2015/053997
§ 371 (c)(1),
(2) Date: Feb. 6, 2016

(87) PCT Pub. No.: WO2016/129109
PCT Pub. Date: Aug. 18, 2016

(65) Prior Publication Data
US 2016/0372509 A1    Dec. 22, 2016

(51) Int. Cl.
*H01L 27/146* (2006.01)
*H01L 21/82* (2006.01)
(Continued)

(52) U.S. Cl.
CPC ........ *H01L 27/14636* (2013.01); *H01L 21/82* (2013.01); *H01L 27/14* (2013.01);
(Continued)

(58) Field of Classification Search
CPC ................................................. H01L 27/14607
(Continued)

(56) References Cited

U.S. PATENT DOCUMENTS 5,345,098 A     9/1994  Hirabayashi et al.
2006/0249654 A1* 11/2006 Silsby ............... H01L 27/14603
                                                      250/208.1
(Continued)

FOREIGN PATENT DOCUMENTS

JP    H03-174770 A    7/1991
JP      2600250 B2    4/1997
(Continued)

OTHER PUBLICATIONS

International Search Report from International Patent Application No. PCT/JP2015/053997, dated Feb. 13, 2015.

*Primary Examiner* — Mozzam Hossain
*Assistant Examiner* — Omar Mojaddedi
(74) *Attorney, Agent, or Firm* — Shapiro, Gabor and Rosenberger, PLLC

(57) ABSTRACT

A semiconductor device includes a plurality of wirings (WR11) which are formed in the same layer above a semiconductor substrate, and a plurality of wirings (WR12) which are formed in the same layer as that of the plurality of wirings (WR11). The plurality of wirings (WR11) are extended in an X axis direction and arranged at a pitch (PT11) in a Y axis direction intersecting with the X axis direction when seen in a plan view, and the plurality of wirings (WR12) are extended in the X axis direction and arranged at a pitch (PT12) in the Y axis direction when seen in a plan view. The plurality of wirings (WR11) are electrically connected to the plurality of wirings (WR12), and the pitch (PT11) is smaller than the pitch (PT12).

20 Claims, 49 Drawing Sheets

(51) Int. Cl.
*H01L 27/14* (2006.01)
*H01L 23/522* (2006.01)

(52) U.S. Cl.
CPC .. *H01L 27/14607* (2013.01); *H01L 27/14612* (2013.01); *H01L 27/14621* (2013.01); *H01L 27/14623* (2013.01); *H01L 27/14627* (2013.01); *H01L 27/14643* (2013.01); *H01L 27/14683* (2013.01); *H01L 27/14687* (2013.01); *H01L 23/522* (2013.01)

(58) Field of Classification Search
USPC .......................................................... 257/443
See application file for complete search history.

(56) References Cited

U.S. PATENT DOCUMENTS

| | | | |
|---|---|---|---|
| 2007/0273779 A1* | 11/2007 | Abe | H01L 27/14636 348/294 |
| 2008/0111159 A1* | 5/2008 | Gambino | H01L 27/14603 257/225 |
| 2013/0020468 A1* | 1/2013 | Mitsuhashi | H01L 27/14645 250/208.1 |
| 2016/0219238 A1* | 7/2016 | Tsuboi | H04N 5/37457 |

FOREIGN PATENT DOCUMENTS

| | | |
|---|---|---|
| JP | 2001-036051 A | 2/2001 |
| JP | 2001-306641 A | 11/2001 |
| JP | 2003-273342 A | 9/2003 |
| JP | 3478796 B2 | 12/2003 |
| JP | 3551437 B2 | 8/2004 |
| JP | 2006-059847 A | 3/2006 |
| JP | 2006-294707 A | 10/2006 |
| JP | 2007-088851 A | 4/2007 |
| JP | 4004302 B2 | 11/2007 |
| JP | 2007-317870 A | 12/2007 |
| JP | 4419658 B2 | 2/2010 |
| JP | 2010-098095 A | 4/2010 |

* cited by examiner

SEMICONDUCTOR DEVICE AND MANUFACTURING METHOD OF THE SAME

TECHNICAL FIELD

The present invention relates to a semiconductor device and a manufacturing method thereof and can be suitably used to, for example, a semiconductor device including a solid-state image pickup element and a manufacturing method thereof.

BACKGROUND ART

As a solid image pickup element (hereinafter, simply referred to as "image pickup element") used in a digital camera, the development of a CMOS image sensor using a CMOS (Complementary Metal Oxide Semiconductor) is ongoing.

The image pickup element as a semiconductor device provided with the CMOS image sensor includes a plurality of pixels formed in the upper surface of a semiconductor substrate. The plurality of pixels are arranged in a matrix shape when seen in a plan view for detecting light. In addition, a photoelectric conversion element such as a photo diode to generate electric charges is formed in each of the plurality of pixels.

Japanese Patent No. 2600250 (Patent Document 1) discloses a technique in which a plurality of light collecting units are arranged on a plurality of light receiving units in a solid-state image pickup device. Japanese Patent No. 3478796 (Patent Document 2) discloses a technique in which photoelectric conversion areas are two-dimensionally arranged in a solid-state image pickup device. Japanese Patent No. 3551437 (Patent Document 3) discloses a technique in which a plurality of light receiving units, a plurality of color filters, and a plurality of light collecting units are provided on a substrate in a solid-state image pickup device. Japanese Patent No. 4419658 (Patent Document 4) discloses a technique in which a plurality of light receiving units and a plurality of on-chip lenses are provided in a solid-state image pickup device. Japanese Patent No. 4004302 (Patent Document 5) discloses a technique in which a plurality of pixels configured of a light receiving element, a color filter, and a micro lens are disposed in a matrix shape in an image pickup element. Japanese Patent Application Publication Laid-Open No. 2007-88851 (Patent Document 6) discloses a technique in which an image pickup element including a light receiving element and a micro lens, and an image pickup lens are provided in an image pickup device.

RELATED ART DOCUMENTS

Patent Documents

Patent Document 1: Japanese Patent No. 2600250
Patent Document 2: Japanese Patent No. 3478796
Patent Document 3: Japanese Patent No. 3551437
Patent Document 4: Japanese Patent No. 4419658
Patent Document 5: Japanese Patent No. 4004302
Patent Document 6: Japanese Patent Application Laid-Open Publication No. 2007-88851

SUMMARY OF THE INVENTION

Problems to be Solved by the Invention

Such an image pickup element as the semiconductor device includes a light shielding film formed above the semiconductor substrate. The light shielding film shields unnecessary light so as to make the light appropriately enter the photo diode formed in each of the plurality of pixels. On the other hand, an opening is formed in a portion on each photo diode in the light shielding film.

Here, the light entering the pixel disposed on the peripheral side of the array of the plurality of pixels is inclined with respect to a direction perpendicular to the upper surface of the semiconductor substrate. In such a case, a part of the light entering each pixel does not enter the photo diode of the subject pixel, thereby degrading a photo diode PD in sensibility (that is, shading is generated).

In order to prevent or suppress the shading, it is considered that a process of shrinking the opening formed in the light shielding film with the center position of the array of the plurality of pixels as the center (that is, a shrink process) is performed to make the opening deviate. However, since the light entering the respective pixels is reflected on a wiring included in a wiring layer different from the light shielding film above the semiconductor substrate only by performing the shrink process on the opening of the light shielding film, it is difficult to prevent or suppress the shading. Therefore, the CMOS image sensor is degraded in sensibility, and the semiconductor device is degraded in performance.

Other objects and novel features will be apparent through the explanation and the accompanying drawings of this specification.

Means for Solving the Problems

According to an embodiment, a semiconductor device includes a plurality of first wirings which are formed in the same layer above a semiconductor substrate, and second wirings which are formed in the same layer as that of the plurality of first wirings, respectively. The plurality of first wirings are extended in a first direction and arranged at a first pitch in a second direction intersecting with the first direction when seen in a plan view, and the plurality of second wirings are extended in the first direction and arranged at a second pitch in the second direction when seen in a plan view. The plurality of first wirings are electrically connected to the plurality of second wirings, and the first pitch is smaller than the second pitch.

Effects of the Invention

According to an embodiment, it is possible to improve the performance of a semiconductor device.

BRIEF DESCRIPTIONS OF THE DRAWINGS

FIG. 1 is a plan view illustrating a configuration of a semiconductor device of a first embodiment;
FIG. 2 is a cross-sectional view illustrating the configuration of the semiconductor device of the first embodiment;
FIG. 3 is a cross-sectional view illustrating the configuration of the semiconductor device of the first embodiment;
FIG. 4 is a plan view illustrating a wiring layout of a wiring layer of a first layer in the first embodiment;
FIG. 5 is a plan view illustrating the wiring layout of the wiring layer of the first layer in the first embodiment;
FIG. 6 is a plan view illustrating wiring layout data of a wiring layer of the uppermost layer in the first embodiment;
FIG. 7 is a plan view illustrating the wiring layout data of the wiring layer of the uppermost layer in the first embodiment FIG. 8 is a plan view illustrating the wiring layout data of the wiring layer of the uppermost layer in the first embodiment;

DETAILED DESCRIPTION OF PREFERRED EMBODIMENTS

Figure 1:
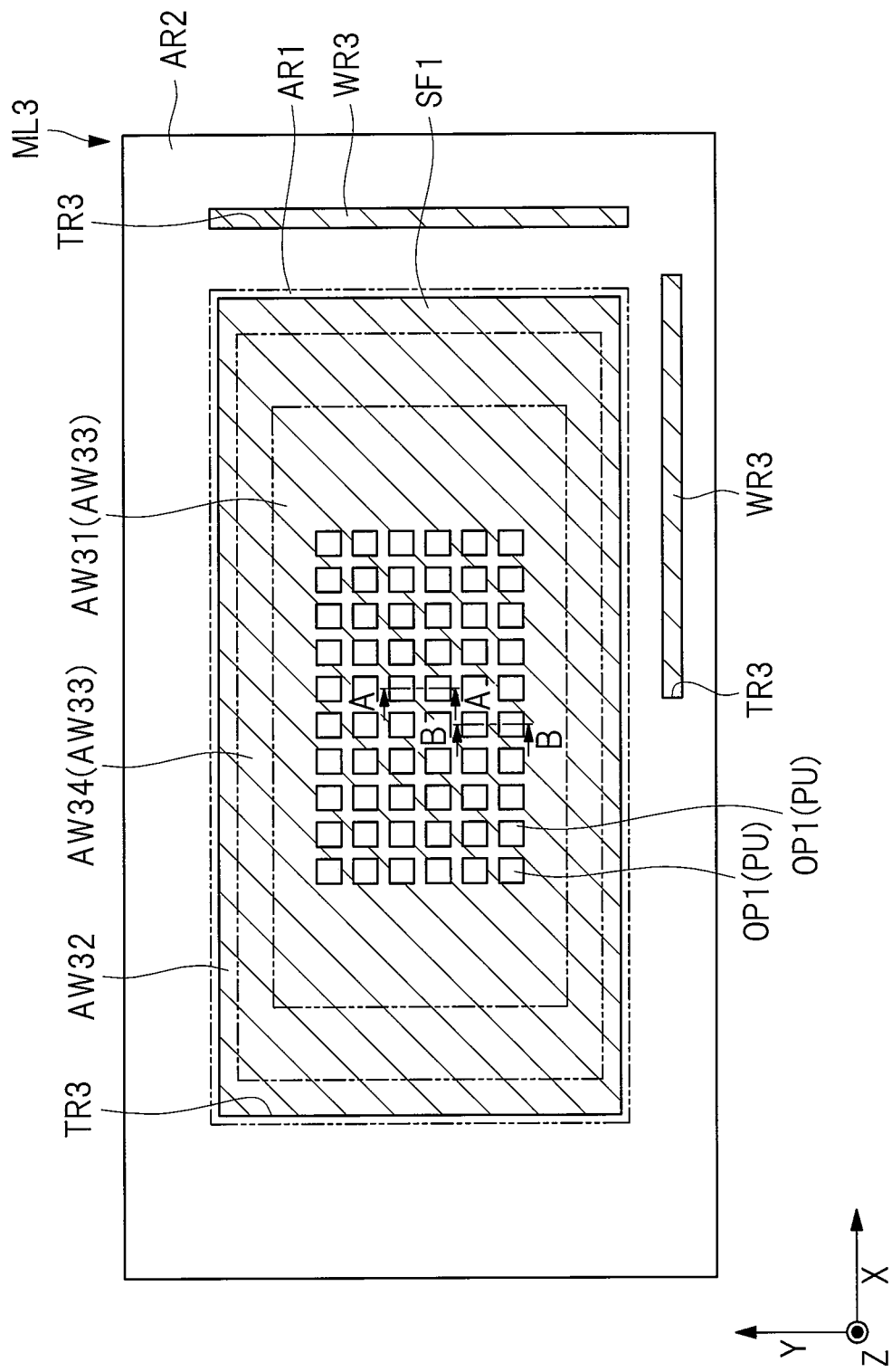

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Further, in the embodiments described below, when referring to the number of elements (including number of pieces, values, amount, range, and the like), the number of the elements is not limited to a specific number unless otherwise stated or except the case where the number is apparently limited to a specific number in principle.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that members having the same function are denoted by the same reference symbols throughout all drawings for describing the embodiments, and the repetitive description thereof will be omitted. In addition, the description of the same or similar portions is not repeated in principle unless particularly required in the following embodiments.

Further, in some drawings used in the embodiments, hatching is omitted in some cases even in a cross-sectional view so as to make the drawings easy to see. Still further, hatching is used in some cases even in a plan view so as to make the drawings easy to see.

In a cross-sectional view and a plan view, the size of each region does not correctly correspond to an actual device, and a specific region may be displayed relatively larger in order to make the drawing easier to see. Even when a plan view and a sectional view correspond to each other, each region may be displayed in a different size.

First Embodiment

Hereinafter, a structure and a manufacturing process of an image pickup element as a semiconductor device of a first embodiment will be described in detail with reference to the drawings. In the first embodiment, the description will be made about an example in which the image pickup element as the semiconductor device is provided with a CMOS image sensor.

<Configuration of Semiconductor Device>

First, a configuration of the image pickup element as the semiconductor device of the first embodiment will be described.

Figure 2:
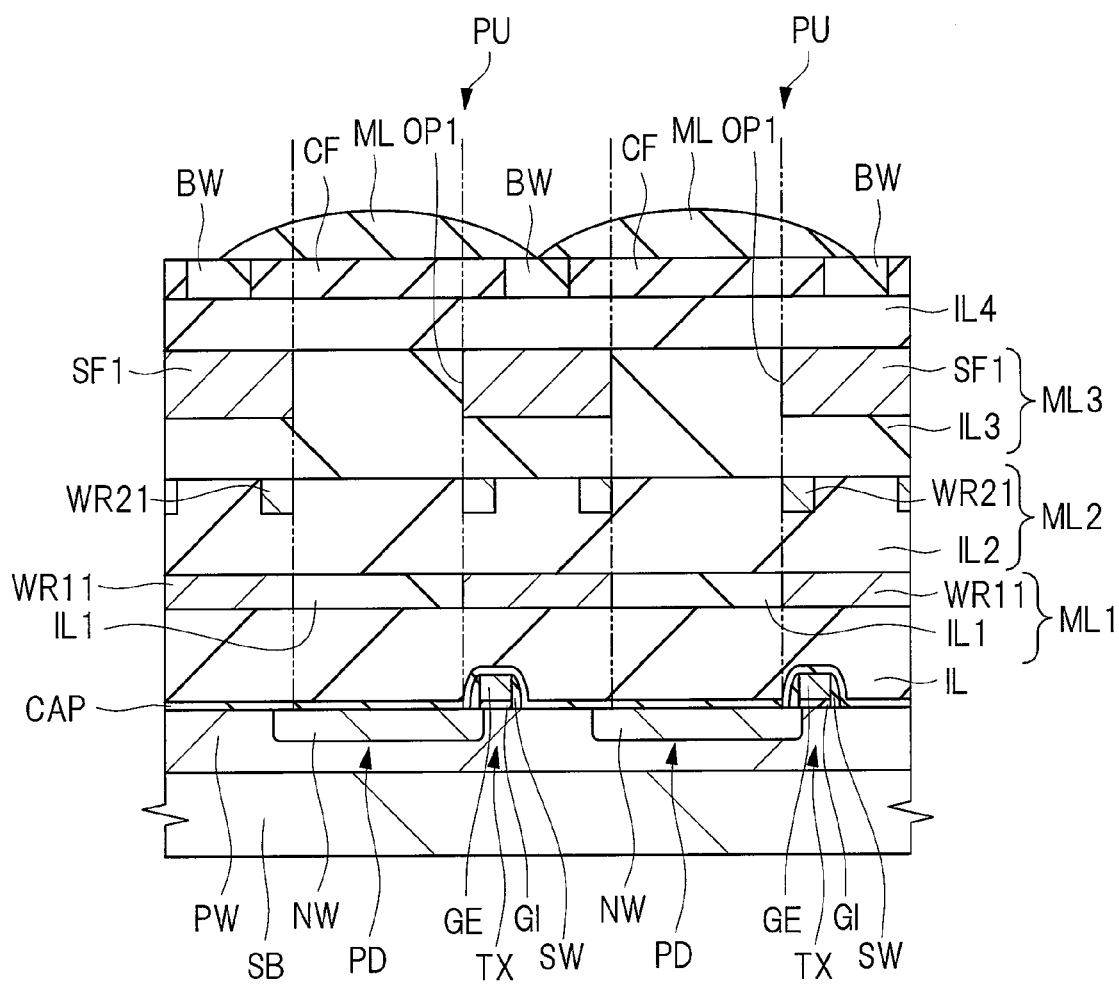
Figure 3:
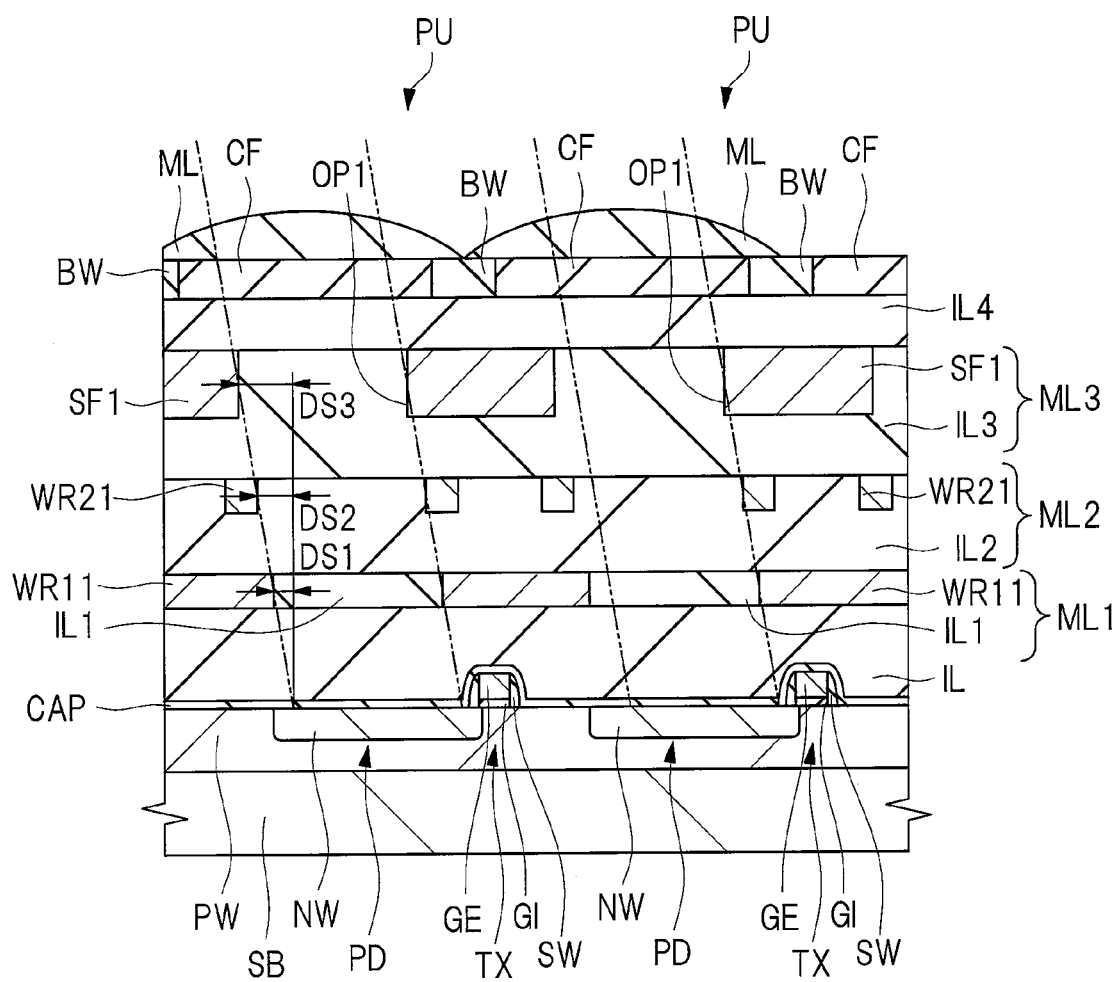

FIG. 1 is a plan view illustrating the configuration of the semiconductor device of the first embodiment. FIGS. 2 and 3 are cross-sectional views illustrating the configuration of the semiconductor device of the first embodiment. FIG. 2 is a cross-sectional view taken along a line A-A of FIG. 1, and FIG. 3 is a cross-sectional view taken along a line B-B of FIG. 1.

As illustrated in FIGS. 1 to 3, the semiconductor device of the first embodiment includes, for example, a semiconductor substrate SB made of single crystal silicon (Si). The semiconductor substrate SB includes an area AR1 which is an area of the upper surface serving as a main surface of the semiconductor substrate SB, and an area AR2 which is an area of the upper surface serving as the main surface of the semiconductor substrate SB and disposed on the peripheral side of the semiconductor substrate SB from the area AR1.

The semiconductor device of the first embodiment includes a plurality of pixels PU which are formed in the area AR1 in the upper surface of the semiconductor substrate SB. In other words, the area AR1 is a pixel area where the plurality of pixels PU are formed.

In the upper surface as the main surface of the semiconductor substrate SB, two directions intersecting (preferably, orthogonal) with each other are defined as an X-axis direction and a Y-axis direction. In addition, a direction perpendicular to the upper surface as the main surface of the semiconductor substrate SB is defined as a Z-axis direction. At this point, the plurality of pixels PU are arranged in a matrix shape in the X axis direction and the Y axis direction when seen in a plan view.

Further, the plan view denoted in the specification of this application means a view seen in the Z-axis direction perpendicular to the upper surface as the main surface of the semiconductor substrate SB.

While not illustrated in the drawing, the image pickup element as the semiconductor device of the first embodiment includes a peripheral circuit which is formed in the area AR2 in the upper surface of the semiconductor substrate SB. In other words, the area AR2 is a peripheral circuit area where the peripheral circuit is formed. The peripheral circuit is formed in the upper surface of the semiconductor substrate SB and includes, for example, a plurality of transistors used for switching the plurality of pixels PU and a wiring layer formed on the plurality of transistors.

Each of the plurality of pixels PU includes a photo diode PD, a transmission transistor TX, and an amplification transistor (not illustrated). In addition, each of the plurality of pixels PU includes a color filter CF and a micro lens ML. Furthermore, the semiconductor device includes a light shielding film SF1. The light shielding film SF1 shields unnecessary light to make the light appropriately enter the photo diode PD included in each of the plurality of pixels PU. On the other hand, an opening OP1 is formed in a portion in the light shielding film SF1 where corresponds to each photo diode PD. The color filter CF transmits only the light of a desired wavelength to make the light of the subject wavelength enter the photo diode PD. The micro lens ML collects the light to make the light appropriately enter the photo diode PD.

The photo diode PD is a photoelectric conversion element which receives the incident light and converts the light into electric charges. The transmission transistor TX is a transistor used to transfer the electric charges generated by converting the incident light by the photo diode PD. The photo diode PD is formed in the area AR1 in the upper surface of the semiconductor substrate SB.

In the area AR1, a p-type semiconductor layer PW introduced with a p-type impurity (for example, boron (B)) is formed on the upper surface of the semiconductor substrate SB. On the other hand, in the area AR1, an n-type semiconductor layer NW introduced with an n-type impurity (for example, phosphorus (P) or arsenic (As)) is formed in the upper portion of the p-type semiconductor layer PW. Therefore, in the area AR1, the p-type semiconductor layer PW is formed immediately below the n-type semiconductor layer NW. The p-type semiconductor layer PW and the n-type semiconductor layer NW are made in pn junction to form the photo diode PD. In other words, in the area AR1, a plurality of photo diodes PD are formed in the upper surface of the semiconductor substrate SB.

In the upper surface of the semiconductor substrate SB, for example, a gate electrode GE made of a polysilicon film is formed through a gate insulating film GI made of a silicon oxide ($SiO_2$) film. In a side surface of the gate electrode GE, for example, a side wall SW made of the silicon oxide film is formed. The gate electrode GE is the gate electrode of the transmission transistor TX. On the other hand, the n-type semiconductor layer NW forming the photo diode PD also serves as a source region of the transmission transistor TX.

Further, a drain region of the transmission transistor TX is not illustrated in FIGS. 2 and 3. In addition, the photo diode PD is connected to a transistor such as an amplification transistor for amplifying a signal output from the photo diode PD through the transmission transistor TX. However, only the transmission transistor TX is illustrated herein, and an element separation region is not illustrated.

In the areas AR1 and AR2, for example, an interlayer insulating film IL made of the silicon oxide film is formed on the upper surface of the semiconductor substrate SB to cover the photo diode PD and the transmission transistor TX. In addition, the upper surface of the interlayer insulating film IL is flattened by a CMP (Chemical Mechanical Polishing) method.

Further, for example, a cap insulating film CAP made of a silicon nitride film may be formed in the upper surface of the photo diode PD, the upper surface of the gate electrode GE, and the surface of the side wall SW formed in the side surface of the gate electrode GE. In such a case, the interlayer insulating film IL is formed on the photo diode PD and the transmission transistor TX through the cap insulating film CAP.

In addition, after the interlayer insulating film IL is formed, a plurality of contact plugs (not illustrated) can be formed to pass through the interlayer insulating film IL and reach the semiconductor substrate SB. In this case, the upper surface of the contact plug and the upper surface of the interlayer insulating film IL are flattened by the CMP method.

On the interlayer insulating film IL, for example, an interlayer insulating film IL1 made of the silicon oxide ($SiO_2$) film is formed.

In the interlayer insulating film IL1, a plurality of wiring trenches are formed to pass through the interlayer insulating film IL1. A wiring WR11 is formed in each of the plurality of wiring trenches by burying, for example, each of the plurality of wiring trenches with a copper (Cu) film. The wiring WR11 is electrically connected to a semiconductor element such as the photo diode PD or the transmission transistor TX formed in the upper surface of the semiconductor substrate SB through the contact plugs.

Further, the interlayer insulating film IL1 and the wiring WR11 form a wiring layer ML1 of a first layer.

The wiring WR11 is disposed between two adjacent pixels PU. Therefore, it is possible to prevent or suppress the incident light from being blocked by the wiring WR11 when the light enters the photo diode PD included in each of the plurality of pixels PU. Further, the upper surfaces of the wiring WR11 and the interlayer insulating film IL1 may be flattened by the CMP method.

On the interlayer insulating film IL1 and the wiring WR11, for example, an interlayer insulating film IL2 made of a carbon-containing silicon oxide (SiOC) film is formed.

The plurality of wiring trenches are formed in the upper surface of the interlayer insulating film IL2, and a plurality of via holes (not illustrated) are formed in the bottom surface of the wiring trenches to pass through the interlayer insulating film IL2. A wiring WR21 is formed in each of the plurality of wiring trenches by burying, for example, each of the plurality of wiring trenches and the plurality of via holes with a copper (Cu) film, and a via (not illustrated) is formed in each of the plurality of via holes. The wiring WR21 is electrically connected to the wiring WR11 through the via.

Further, the interlayer insulating film IL2, the wiring WR21, and the via (not illustrated) form a wiring layer ML2 of a second layer.

The wiring WR21 is disposed between two adjacent pixels PU. Therefore, it is possible to prevent or suppress the incident light from being blocked by the wiring WR21 when the light enters the photo diode PD included in each of the plurality of pixels PU. Further, the upper surfaces of the wiring WR21 and the interlayer insulating film IL2 are flattened by the CMP method. For example, an interlayer insulating film IL3 made of a carbon-containing silicon oxide (SiOC) film is formed on the interlayer insulating film IL2 and the wiring WR21.

The plurality of wiring trenches are formed in the upper surface of the interlayer insulating film IL3. The light shielding film SF1 is formed in each of the plurality of wiring trenches by burying, for example, the plurality of wiring trenches with a copper (Cu) film.

Further, in the area AR2, a wiring WR3 is formed in the same layer as that of the light shielding film in a wiring trench TR3. In addition, the interlayer insulating film IL3, the light shielding film SF1, and the wiring WR3 form a wiring layer ML3 of a third layer.

The light shielding film SF1 is disposed between two adjacent pixels PU. Therefore, it is possible to prevent or suppress the incident light from being blocked by the light shielding film SF1 when the light enters the photo diode PD included in each of the plurality of pixels PU. Further, the upper surfaces of the light shielding film SF1 and the interlayer insulating film IL3 are flattened by the CMP method.

Further, the light shielding film SF1 is integrally formed in the area AR1 as illustrated in FIG. 1. Therefore, a plurality of openings OP1 are formed in a matrix shape in the X-axis direction and the Y-axis direction in the light shielding film SF1, and the pixel PU is formed in each of the plurality of openings OP1.

In this way, the semiconductor device of the first embodiment includes the plurality of wiring layers ML1, ML2, and ML3 which are formed in the areas AR1 and AR2, that is, the upper surface of the semiconductor substrate SB. In addition, the wiring WR11 is included in the wiring layer ML1 lower than the wiring layer ML3 of the uppermost layer, and the wiring WR21 is included in the wiring layer ML2 lower than the wiring layer ML3 of the uppermost layer.

Further, the light shielding film SF1 may be included in the wiring layer lower than the wiring layer of the uppermost layer, and the wiring WR11 or the wiring WR21 may be included in the wiring layer upper than the light shielding film.

For example, an insulating film IL4 made of a silicon nitride film is formed on the interlayer insulating film IL3, the light shielding film SF1, and the wiring WR3.

For example, a barrier wall BW made of the silicon oxide film is formed between two adjacent pixels PU on the insulating film IL4.

The color filter CF is formed between the adjacent barrier walls BW. The color filter CF is a film which transmits the light of a specific color, for example, red (R), green (G), or blue (B), and does not transmit the light of other colors.

The image pickup element of the semiconductor device of the first embodiment receives the light emitted from the main surface of the semiconductor substrate SB (that is, the upper surface) to each pixel PU as the incident light by the photo diode PD included in the respective pixels PU and converts the light into the electric charges, and reads the converted electric charges as signal information, so that image information data is acquired.

The micro lens ML having a convex surface as the upper surface is formed on the color filter CF. The micro lens ML is a convex lens of which the upper surface is bent, and includes a film which transmits the light. The micro lens ML collects the light emitted from the main surface of the semiconductor substrate SB (that is, the upper surface) to the respective pixels PU onto the photo diode PD.

As illustrated in FIG. 3, in the first embodiment, when seen in a plan view, a relative position of the wiring WR11 in each pixel PU adjacent to the center portion of the array of the plurality of pixels PU with respect to the photo diode PD included in the subject pixel PU is shifted toward the center portion of the array of the plurality of pixels PU as it goes to the peripheral side of the array of the plurality of pixels PU. In addition, when seen in a plan view, a relative position of the wiring WR21 in each pixel PU adjacent to the center portion of the array of the plurality of pixels PU with respect to the photo diode PD included in the subject pixel PU deviates toward the center portion of the array of the plurality of pixels PU as it goes to the peripheral side of the array of the plurality of pixels PU. Furthermore, when seen in a plan view, a relative position of the opening OP1 included in each pixel PU with respect to the photo diode PD included in the subject pixel PU deviates toward the center portion of the array of the plurality of pixels PU as it goes to the peripheral side of the array of the plurality of pixels PU. Then, a displacement amount DS1 of the wiring WR11, a displacement amount DS2 of the wiring WR21, and a displacement amount DS3 of the opening OP1 in the same pixel PU are increased in this order.

<Wiring Layout>

Next, a wiring layout in the wiring layer will be described. In the following, the description will be made about an example of the wiring layout in the wiring layer ML1 of the first layer. However, the wiring layout in a wiring layer (for example, the second layer) other than the first layer may be similarly applied.

Figure 4:
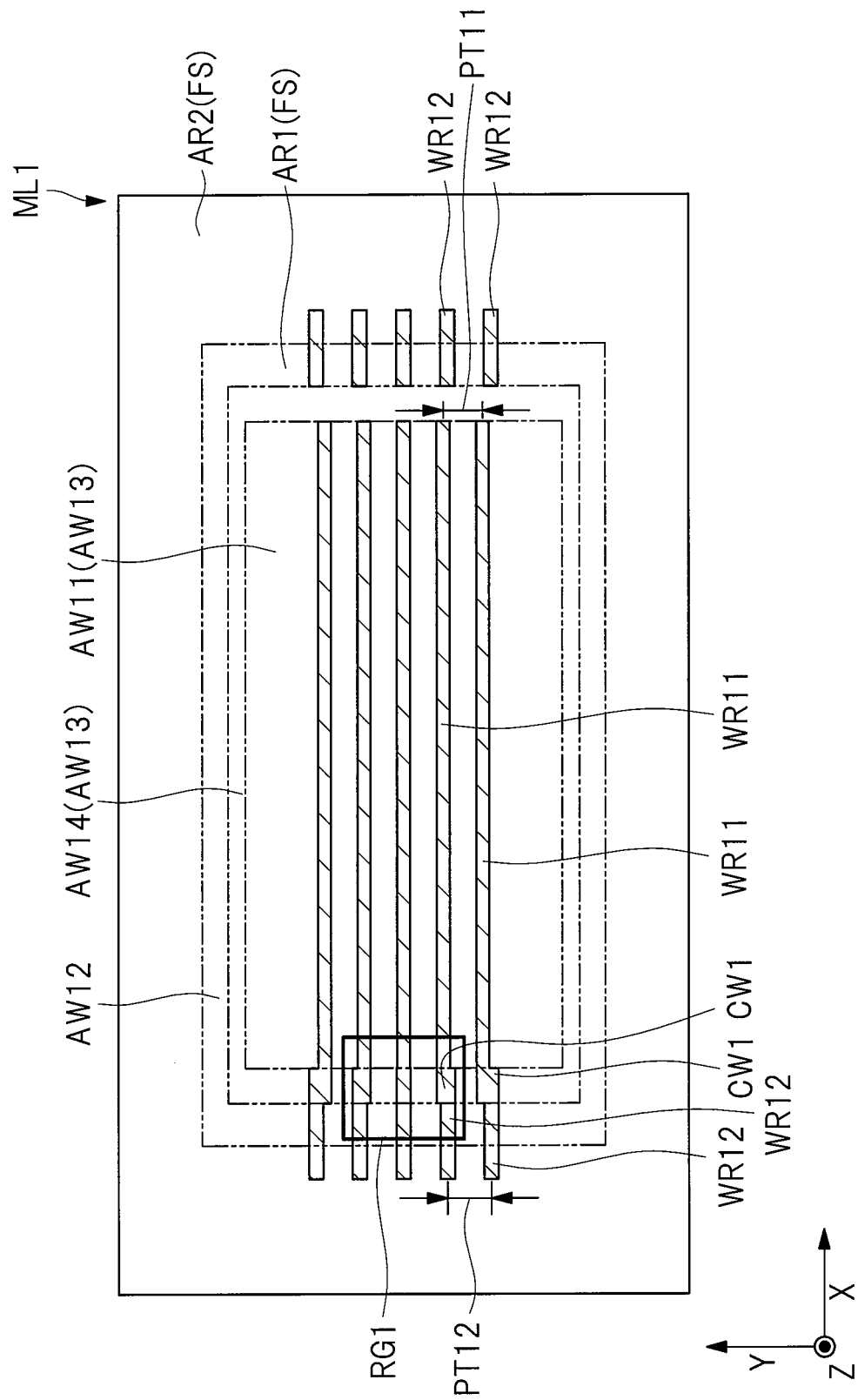
Figure 5:
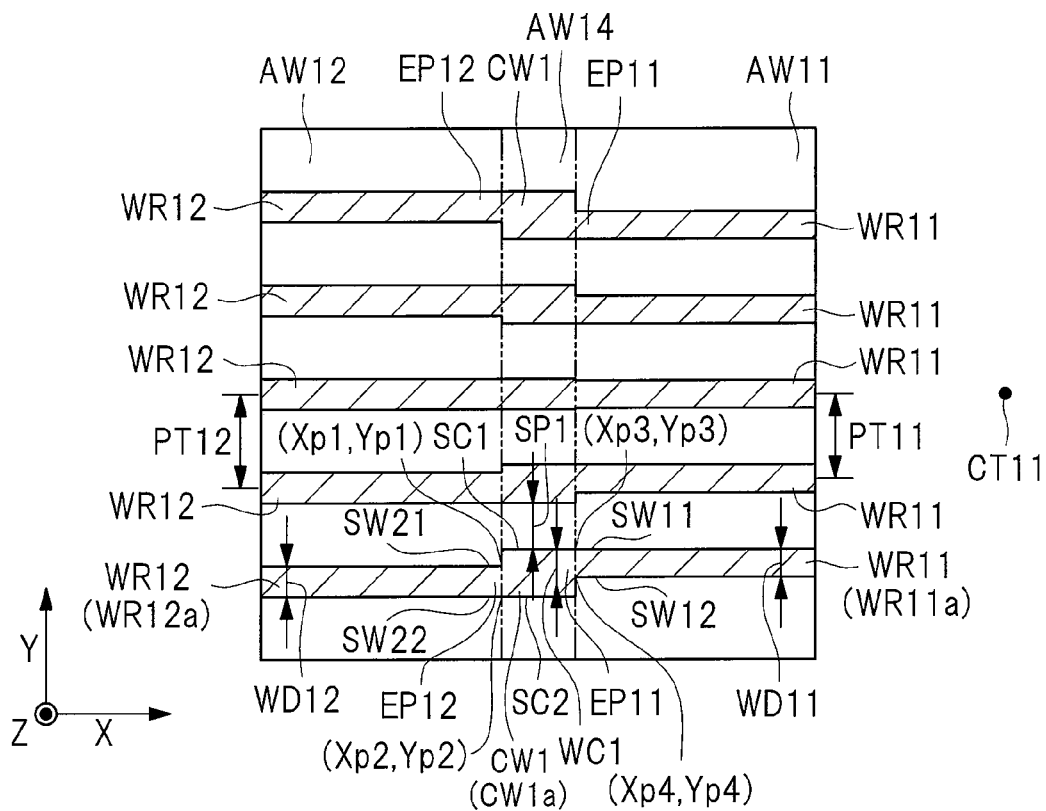

FIGS. 4 and 5 are plan views illustrating the wiring layout of the wiring layer of the first layer in the first embodiment. FIG. 5 is an enlarged plan view of a region RG1 of FIG. 4.

As illustrated in FIGS. 4 and 5, the wiring layer ML1 of the first layer includes the plurality of wirings WR11 and a plurality of wirings WR12. The plurality of wirings WR11 are formed in the same wiring layer ML1 of the first layer in an area AW11 of the upper surface as the main surface of the semiconductor substrate SB (see FIG. 3). The plurality of wirings WR12 are formed in the same layer as that of the plurality of wirings WR11 in an area AW12 of the upper surface as the main surface of the semiconductor substrate SB (see FIG. 3). The area AW12 is an area set on one side of the area AW11 in the X-axis direction when seen in a plan view. In addition, while not illustrated in FIG. 4, the plurality of pixels PU (see FIG. 1) are formed in the area AW11, and the peripheral circuit is formed in the area AW12.

The plurality of wirings WR11 are extended in the X-axis direction in the area AW11 and arranged at a pitch PT11 in the Y-axis direction when seen in a plan view. The plurality of wirings WR12 are extended in the area AW12 in the X-axis direction and arranged at a pitch PT12 in the Y-axis direction when seen in a plan view.

In the example illustrated in FIGS. 4 and 5, the wiring layer ML1 of the first layer includes a plurality of connection wirings CW1. In other words, the plurality of connection wirings CW1 are formed in the same layer as that of the plurality of wirings WR11. The plurality of wirings WR11 each are connected to the plurality of wirings WR12 through the plurality of connection wirings CW1. Through such a layout, the plurality of wirings WR11 each are electrically connected to the plurality of wirings WR12.

The plurality of wirings WR12 are connected to, for example, transistors included in the peripheral circuit. Therefore, the plurality of wirings WR11 each are connected to the peripheral circuit through the plurality of wirings WR12.

As illustrated in FIGS. 4 and 5, the pitch PT11 is smaller than the pitch PT12. Through such a layout, an interval between two adjacent wirings WR11 in the area AW11 where the pixels PU (see FIG. 1) are formed can be more shortened than the interval between two adjacent wirings WR12 in the area AW12 where the peripheral circuit is formed.

As illustrated in FIG. 5, preferably, a width WD11 in the Y axis direction of an end portion EP11 of each wiring WR11 on the side closer to the area AW12 is narrower than a width WD12 in the Y axis direction of an end portion EP12 of the wiring WR12 connected to the subject wiring WR11 on the side closer to the area AW11 in the plurality of wirings WR12.

As described below using FIGS. 12 to 16, a portion disposed in the area AW13 is cut out of mask data DAT1 which is extended in the X-axis direction and includes wirings arranged in the Y-axis direction over an area from the area AW12 to an area AW13. Then, after a shrink process is performed on the cut-out portion with a position (hereinafter, referred to as "shrink center position") CT11 in the cut-out portion as the center, the cut-out portion is attached to the original mask data DAT1 again. Therefore, mask data DAT1a including the plurality of wirings WR11 and the plurality of wirings WR12 can be easily manufactured.

In such a case, any wiring WR11 in the plurality of wirings WR11 is disposed to be shifted toward a shrink center position CT11 in the Y-axis direction compared to the wiring WR12 connected to the subject wiring WR11 in the plurality of wirings WR12 when seen in a plan view. In addition, the wiring WR11 disposed at the end portion on the negative side in the Y axis direction of the array of the plurality of wirings WR11 in the plurality of wirings WR11 is disposed to be shifted toward the positive side in the Y axis direction compared to the wiring WR12 connected to the subject wiring WR11 in the plurality of wirings WR12 when seen in a plan view.

Further, in a case where the widths WD11 of the respective wirings WR11 are equal to each other and the widths WD12 of the respective wirings WR12 are equal to each other, the widths WD11 of the respective wirings WR11 may be narrower than the widths WD12 of the respective wirings WR12.

As illustrated in FIG. 5, a width WC1 in the Y axis direction of each connection wiring CW1 of the plurality of connection wirings CW1 is wider than the width WD11 in the Y axis direction of the end portion EP11 on the side closer to the area AW12 of the wiring WR11 connected to the subject connection wiring CW1 in the plurality of wirings WR11. In addition, the width WC1 in the Y-axis direction of each connection wiring CW1 is equal to or more than the width WD12 in the Y-axis direction of the end portion EP12 on the side closer to the area AW11 of the wiring WR12 connected to the subject connection wiring CW1 in the plurality of wirings WR12.

Therefore, even in a case where the wirings WR11 and WR12 having widths different to each other in the Y axis direction are disposed to be shifted in the Y axis direction, the entire side surface on the side closer to the area AW12 in the X axis direction of the end portion EP11 of the wiring WR11 can be connected to the connection wiring CW1. In addition, the entire side surface on the side closer to the area AW11 in the X-axis direction of the end portion EP12 of the wiring WR12 can be connected to the connection wiring CW1.

As illustrated in FIG. 5, a connection wiring CW1a in the plurality of connection wirings CW1 is connected to a wiring WR11a in the plurality of wirings WR11, and connected to a wiring WR12a in the plurality of wirings WR12. The side surface of the connection wiring CW1a on the side closer to the shrink center position CT11 in the Y-axis direction is set as a side surface SC1, and the side surface of the connection wiring CW1a on the opposite side to the shrink center position CT11 in the Y-axis direction is set as a side surface SC2. In addition, the side surface of the end portion EP11 of the wiring WR11a on the side closer to the shrink center position CT11 in the Y-axis direction is set as a side surface SW11, and the side surface of the end portion EP11 of the wiring WR11a on the opposite side to the shrink center position CT11 in the Y axis direction is set as a side surface SW12. Furthermore, the side surface of the end portion EP12 of the wiring WR12a on the side closer to the shrink center position CT11 in the Y axis direction is set as a side surface SW21, and the side surface of the end portion EP12 of the wiring WR12a on the opposite side to the shrink center position CT11 in the Y axis direction is set as a side surface SW22.

At this point, preferably, the side surface SC1 and the side surface SW11 are formed in the same surface, and the side surface SC2 and the side surface SW22 are formed in the same surface. Therefore, the entire side surface of the end portion EP11 of the wiring WR11a on the side closer to the area AW12 in the X axis direction can be connected to the connection wiring CW1a, and the entire side surface of the end portion EP12 of the wiring WR12a on the side closer to the area AW11 in the X axis direction can be connected to the connection wiring CW1a. Further, the width WC1 of the connection wiring CW1a can be made as narrow as possible.

<Design Method of Wiring Layout>

Next, a design method of the wiring layout in the wiring layer will be described in addition to a manufacturing method of an exposure mask. In the following, first, the design method of the wiring layout in the wiring layer of the uppermost layer will be described, and then the design method of the wiring layout in the wiring layer lower than the uppermost layer will be described. Further, the layout of each layer other than the wiring layer (for example, a chip layout) can also be designed in the same manner.

FIGS. 6 to 10 are plan views illustrating wiring layout data of the wiring layer of the uppermost layer in the first embodiment.

First, chip layout data is created. In this step, the chip layout data for creating the mask data used in the each manufacturing step of the image pickup element as the semiconductor device is created as GDS2 stream data.

Figure 6:
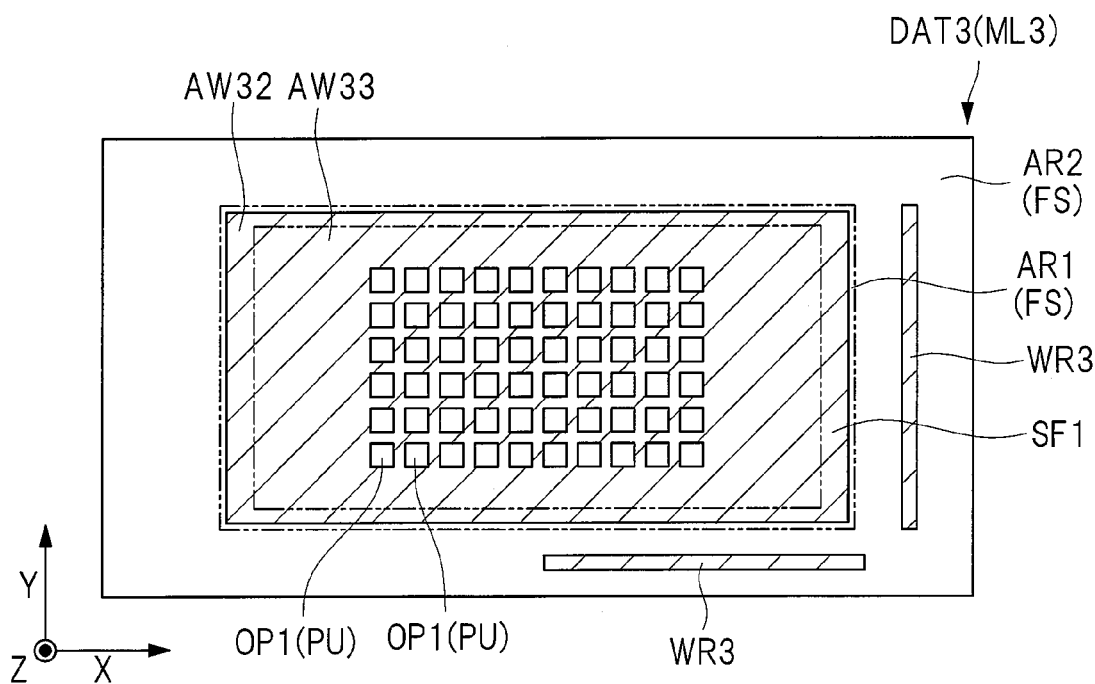

Next, the mask data is created as illustrated in FIG. 6. A shape difference between an exposure pattern formed in the surface of a reticle as the exposure mask and a resist pattern formed on the semiconductor substrate is caused by a mask size effect or an optical proximity effect. Therefore, in order to correct the shape difference, the layout data in each layer is subjected to a correction process such as a so-called OPC process so as to create the mask data as pattern data of each layer. At this point, mask data DAT3 as the pattern data is created for the wiring layer ML3 of the uppermost layer as illustrated in FIG. 6.

The mask data DAT3 includes the area AR1 as a partial area of a flat surface FS and the area AR2 as a partial area of the flat surface FS. The area AR1 is, for example, an area (that is, a pixel area) in which the plurality of pixels PU are arranged in a matrix shape in the X-axis direction and the Y-axis direction. The area AR2 is an area (that is, a peripheral circuit area) in which the peripheral circuit is formed.

As illustrated in FIG. 6, in the mask data DAT3, the light shielding film SF1 is disposed in the area AR1, and the wiring WR3 is disposed in the area AR2. In addition, the opening OP1 is disposed for each pixel PU in a portion where the pixels PU are formed (that is, a portion which the light enters) in the light shielding film SF1 in order to make the light enter the photo diode PD (see FIG. 2) included in the pixel PU.

Figure 7:
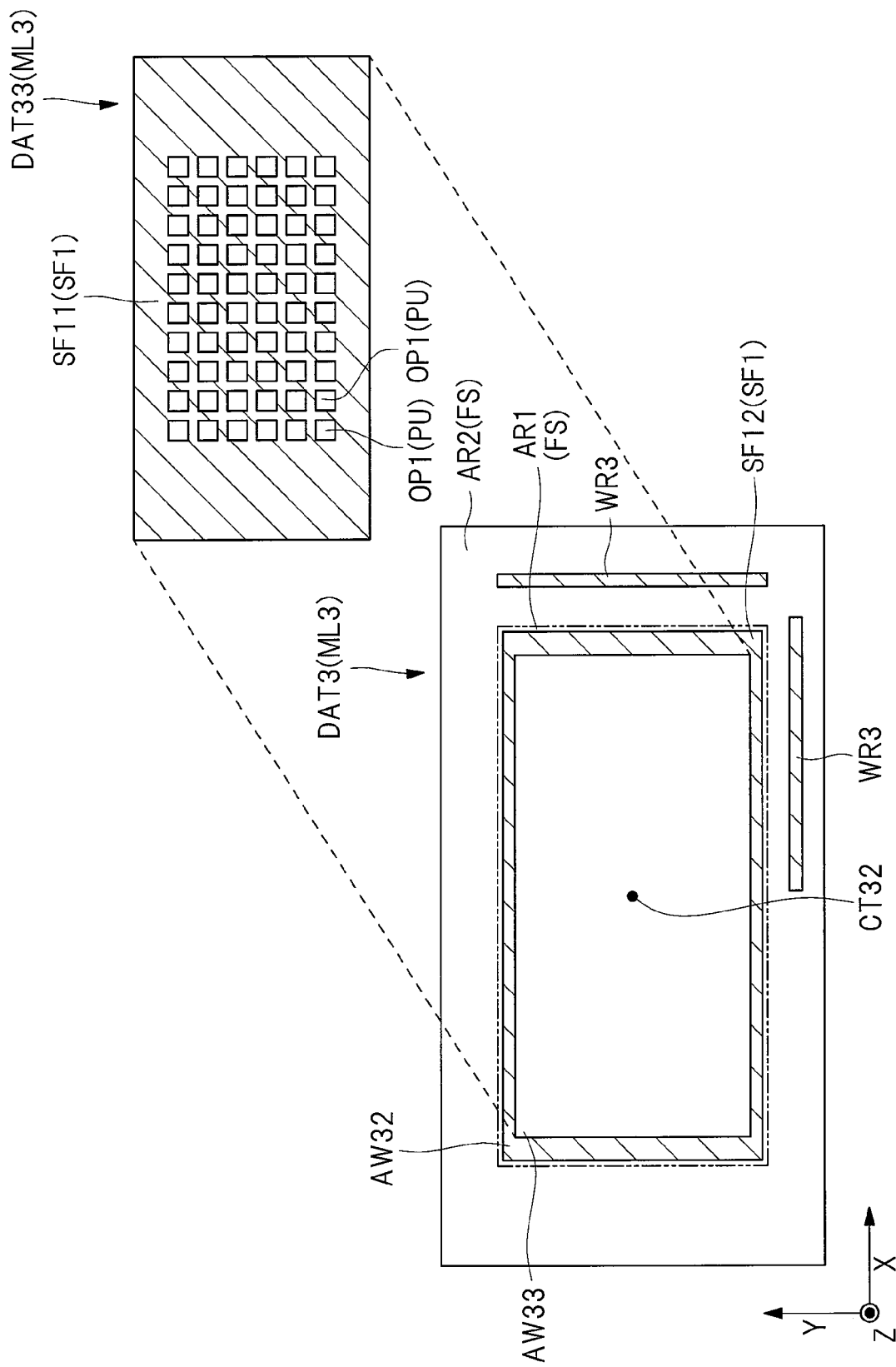

Next, partial mask data is cut out as illustrated in FIG. 7. In this step, partial mask data DAT33 as the pattern data of the portion disposed in an area AW33 is cut out of the mask data DAT3 of the wiring layer ML3 of the uppermost layer.

Here, the area AW33 includes an area where the plurality of pixels PU are formed in the area AR1. In addition, the area other than the area AW33 in the areas AR1 and AR2 is set to an area AW32.

In the light shielding film SF1, a portion disposed in the area AW33 is set to a light shielding film SF11. In addition, in the light shielding film SF1, a portion disposed in the area AW32 is set to a light shielding film SF12.

Figure 8:
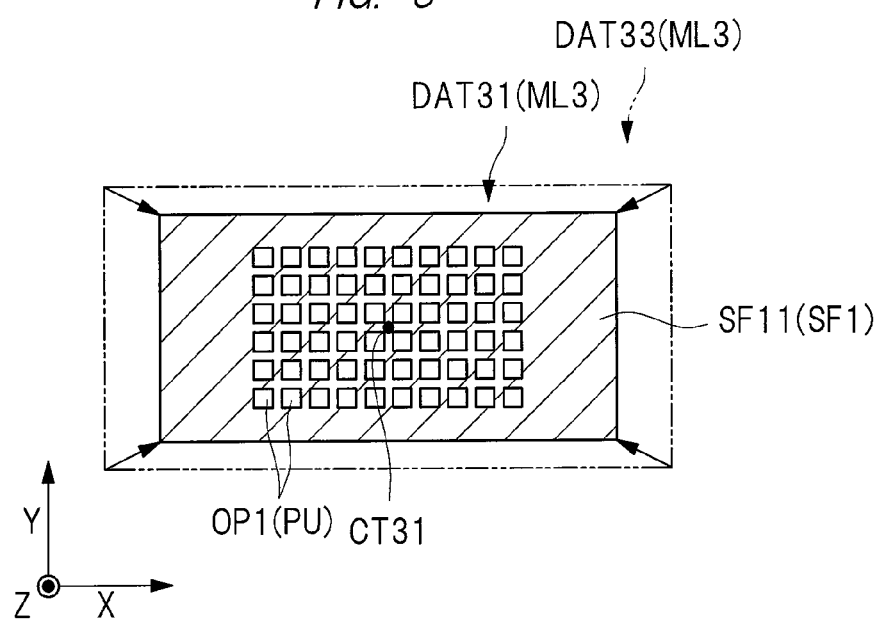

Next, the shrink process is performed as illustrated in FIG. 8. In this step, a process of shrinking the cut-out partial mask data DAT33 by a constant magnification (that is, the shrink process) is performed with a position CT31 in the partial mask data DAT33 as the center. Therefore, the mask data of partially shrunk region DAT 31 having the light shielding film SF11 with the plurality of shrink openings OP1 formed therein is created as the pattern data.

Figure 9:
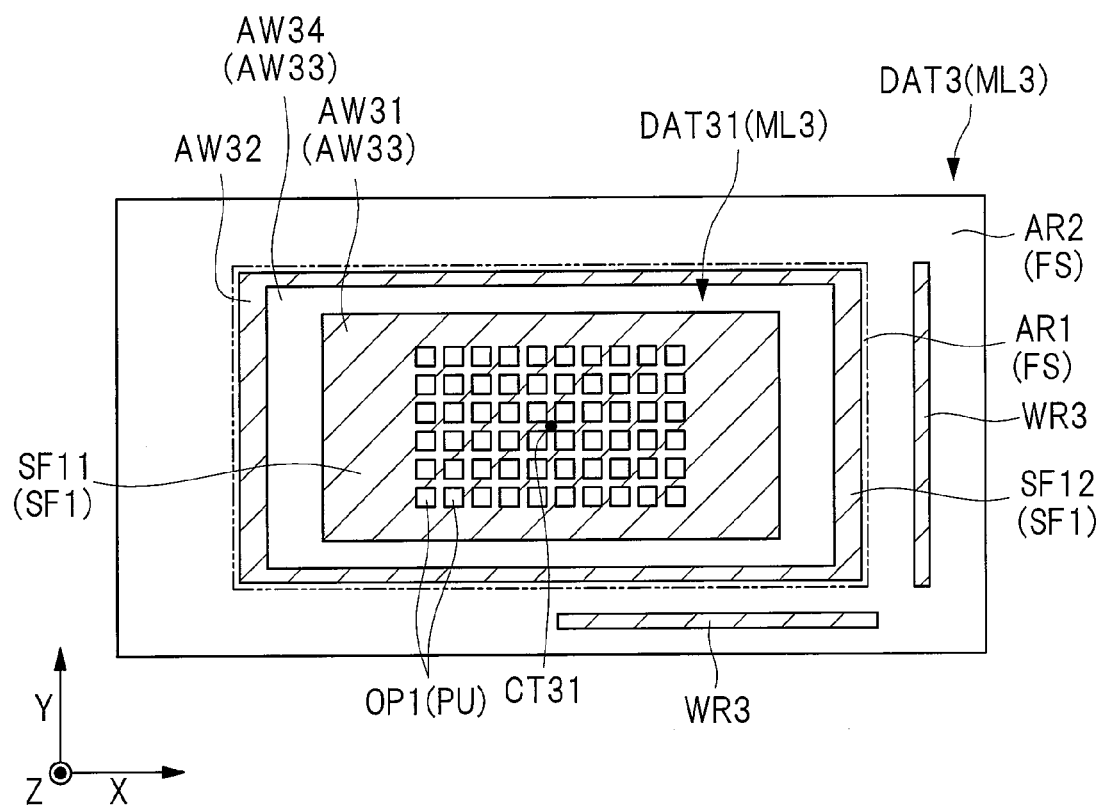
FIG. 9 is a plan view illustrating the wiring layout data of the wiring layer of the uppermost layer in the first embodiment.

Next, the mask data of partially shrunk region is attached as illustrated in FIG. 9. In this step, the mask data of partially shrunk region DAT31 is attached in an area AW31 which is in the area AW33 of the flat surface FS and separated from the area AW32 so that the position CT31 in the mask data of partially shrunk region DAT31 is settled down at the same coordinates as those of a position CT32 (see FIG. 7) in the center of the area AW33. At this point, the area between the areas AW31 and AW32 is a gap area AW34 having no mask data created.

Figure 10:
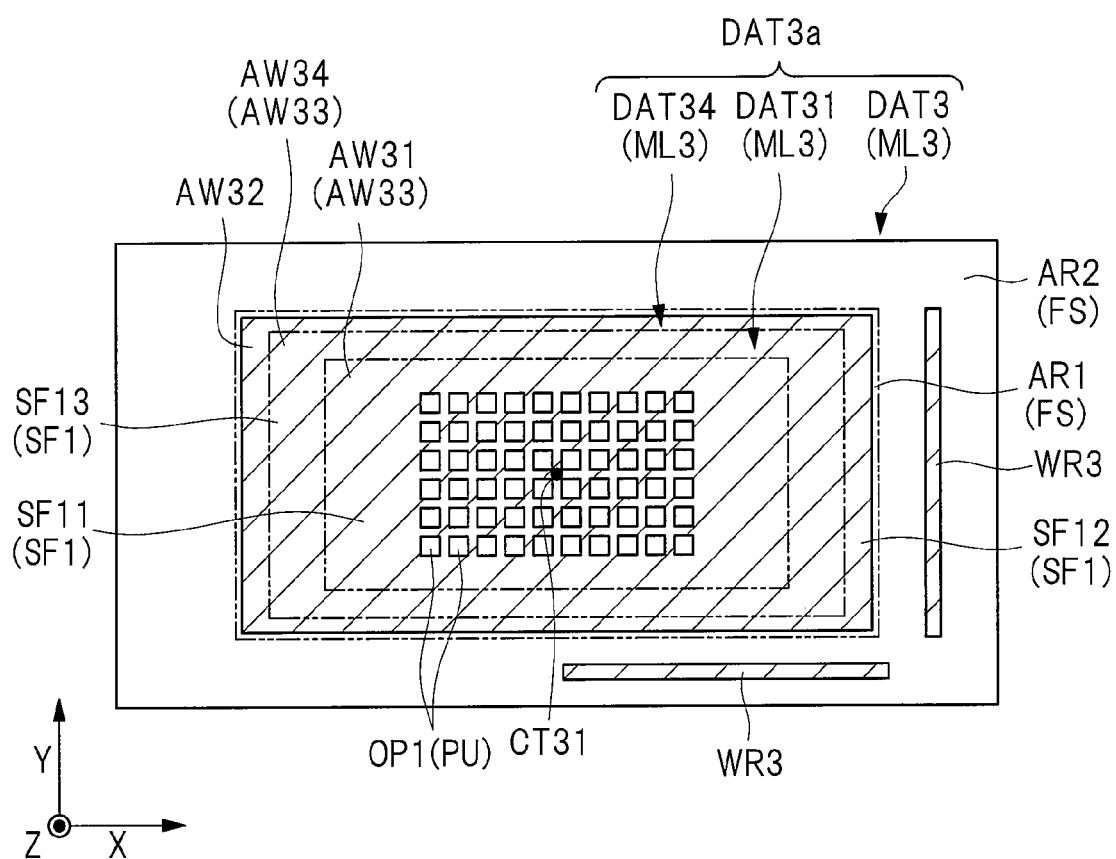
FIG. 10 is a plan view illustrating the wiring layout data of the wiring layer of the uppermost layer in the first embodiment.

Next, gap partial mask data is created as illustrated in FIG. 10. In this step, in the gap area AW34, gap partial mask data DAT34 as the pattern data is formed, and the gap area AW34 is filled with the gap partial mask data DAT34. Therefore, mask data DAT3a including t the mask data of partially shrunk region DAT31, the gap partial mask data DAT34, and the mask data DAT3 is created as the pattern data.

Since the mask data DAT3a is wiring layout data in the wiring layer ML3 of the uppermost layer, the gap partial mask data DAT34 is made of a light shielding film SF13 disposed in the entire gap area AW34. Therefore, the light shielding film SF1 made of the light shielding films SF11, SF12, and SF13 is disposed.

Next, the design method of the wiring layout in the wiring layer lower than the uppermost layer will be described in addition to the manufacturing method of the exposure mask.

Figure 11:
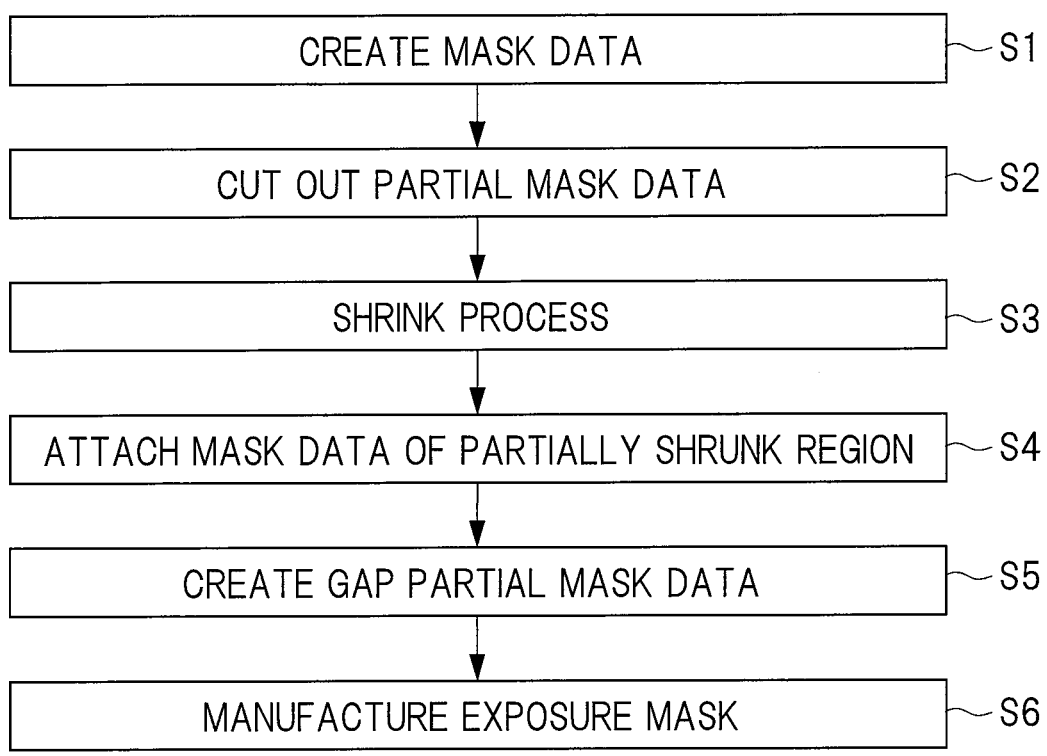
FIG. 11 is a process flow diagram illustrating a part of a design process of the wiring layout and a manufacturing process of an exposure mask.

FIG. 11 is a process flow diagram illustrating a part of a design process of the wiring layout and a manufacturing process of an exposure mask. FIGS. 12 to 16 are plan views illustrating the wiring layout data of the wiring layer of the first layer in the first embodiment.

Further, in the following, the description will be made about an example of the design method in the wiring layer ML1 of the first layer. However, the design method in the wiring layer (for example, the wiring layer ML2 of the second layer) other than the first layer may also be applied. In addition, in the following, the description in common with the design method in the wiring layer ML3 of the uppermost layer will be omitted.

Figure 12:
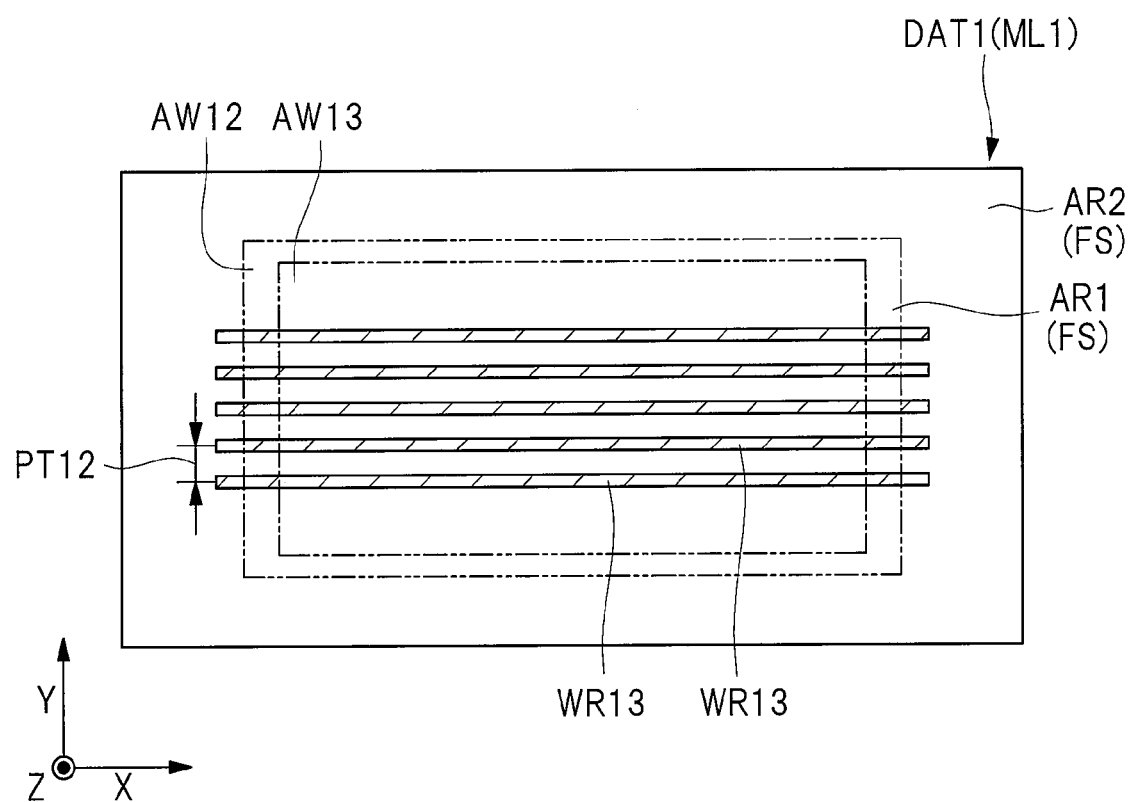
FIG. 12 is a plan view illustrating wiring layout data of the wiring layer of the first layer in the first embodiment.

First, after the chip layout data is created, the mask data is created as illustrated in FIG. 12 (Step S1 of FIG. 11). In Step S1, the layout data in the first wiring layer ML1 is subjected to a correction process such as a so-called OPC process so as to prepare the mask data DAT1 as the pattern data of the wiring layer ML1 of the first layer. The mask data DAT1 includes the area AR1 as a partial area of the flat surface FS and the area AR2 as a partial area of the flat surface FS. While not illustrated in FIG. 12, the plurality of pixels PU (see FIG. 6) are disposed in the area AW13 which is a partial area of the area AR1 as the pixel area. In addition, the area other than the area AW13 in the areas AR1 and AR2 is set to the area AW12.

As illustrated in FIG. 12, a plurality of wirings (wiring pattern) WR13 are disposed over an area from the area AR1 to the area AR2 in the mask data DAT1. The plurality of wirings WR13 are extended in the X-axis direction, and arranged at the pitch PT12 in the Y-axis direction. In other words, the mask data DAT1 includes the plurality of wirings (wiring pattern) WR13 which are extended in the X axis direction and arranged at the pitch PT12 in the Y direction in the area AW13, and the plurality of wirings (wiring pattern) WR13 which are extended in the X axis direction and arranged at the pitch PT12 in the Y axis direction in the area AW12.

Figure 13:
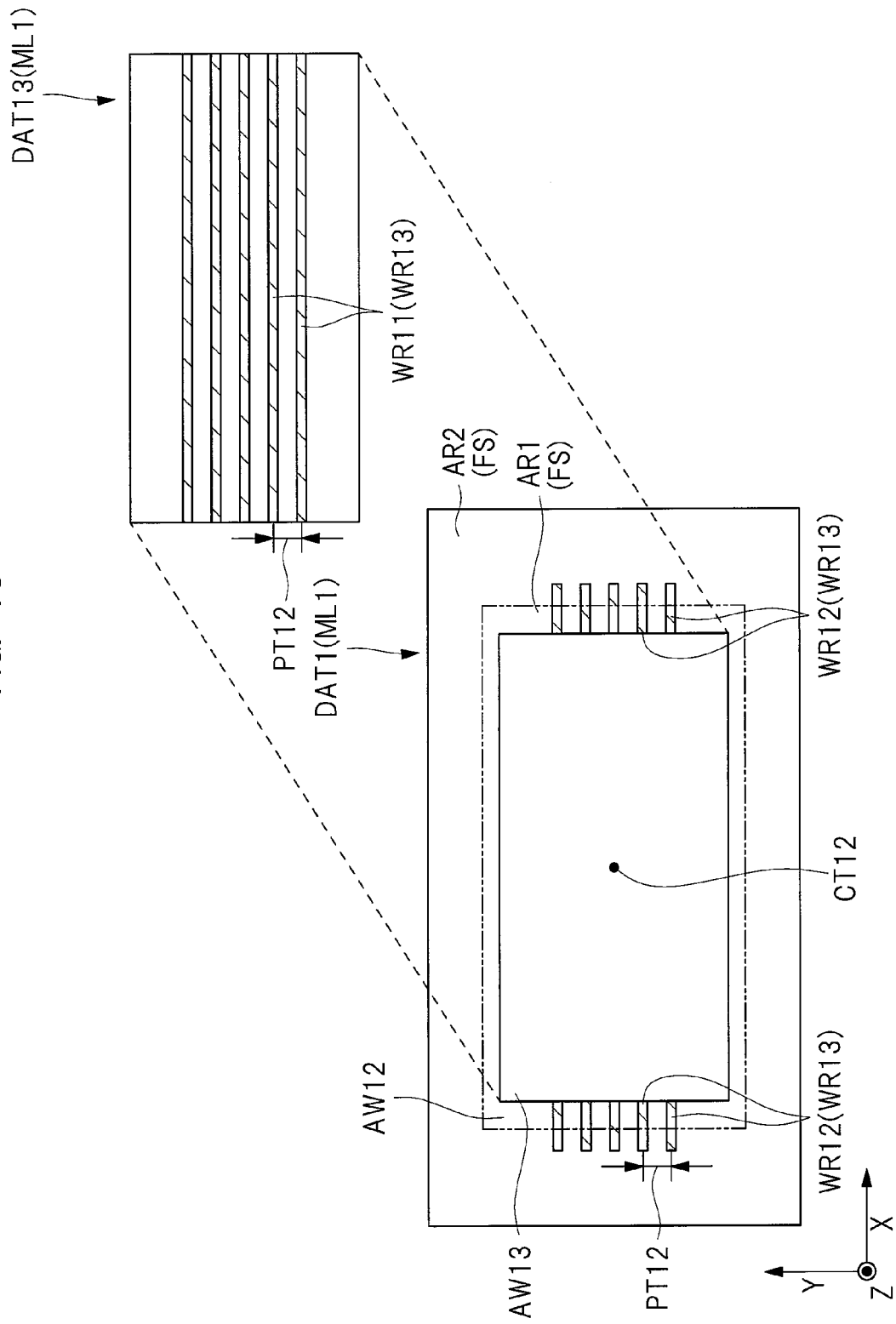
FIG. 13 is a plan view illustrating the wiring layout data of a wiring layer of the first layer in the first embodiment.

Next, the partial mask data is cut out as illustrated in FIG. 13 (Step S2 of FIG. 11). In Step S2, partial mask data DAT13 as the pattern data of a portion disposed in the area AW13 is cut out of the mask data DAT1 of the wiring layer ML1 of the first layer.

In the wirings WR13, a portion disposed in the area AW13 is set for the wirings (wiring pattern) WR11. In addition, in the wirings WR13, a portion disposed in the area AW12 is set for the wirings (wiring pattern) WR12. At this point, the plurality of wirings WR11 are extended in the X-axis direction, and arranged at the pitch PT12 in the Y-axis direction. In addition, the plurality of wirings WR12 are extended in the X-axis direction, and arranged at the pitch PT12 in the Y-axis direction.

Figure 14:
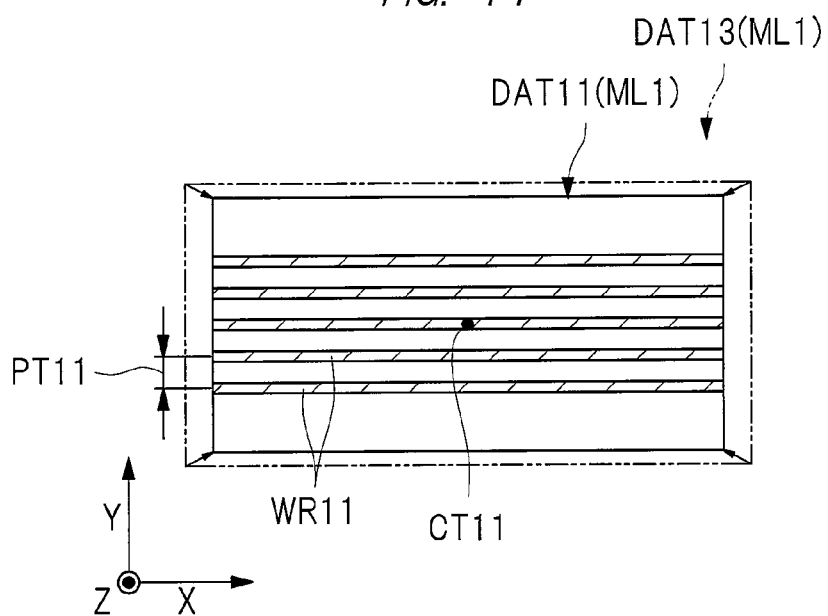
FIG. 14 is a plan view illustrating the wiring layout data of a wiring layer of the first layer in the first embodiment.

Next, the shrink process is performed as illustrated in FIG. 14 (Step S3 of FIG. 11). In Step S3, a process of shrinking the cut-out partial mask data DAT13 by a constant magnification (that is, the shrink process) is performed with the position CT11 in the partial mask data DAT13 as the center. Therefore, the mask data of partially shrunk region DAT11 of the plurality of shrink wirings (wiring pattern) WR11 is created as the pattern data. The plurality of wirings WR11 are extended in the X-axis direction, and arranged at the pitch PT11 in the Y-axis direction. The pitch PT11 is smaller than the pitch PT12.

Figure 15:
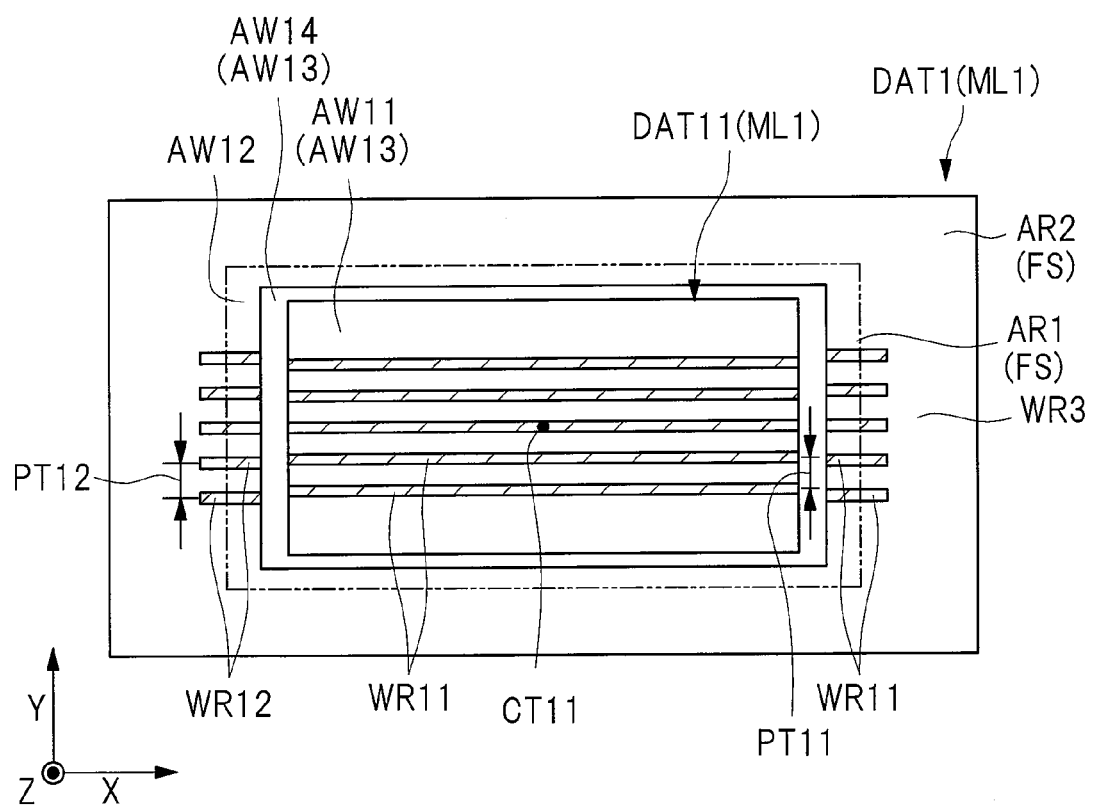
FIG. 15 is the plan view illustrating the wiring layout data of a wiring layer of the first layer in the first embodiment.

Next, the mask data of partially shrunk region is attached as illustrated in FIG. 15 (Step S4 of FIG. 11). In Step S4, the mask data of partially shrunk region DAT11 is attached in an area AW11 which is in the area AW13 of the flat surface FS and separated from the area AW12 so that the position CT11 in the mask data of partially shrunk region DAT11 is settled down at the same coordinates as those of a position CT12 (see FIG. 13) in the area AW13. At this point, the area between the area AW11 and the area AW12 is a gap area AW14 having no mask data created.

Figure 16:
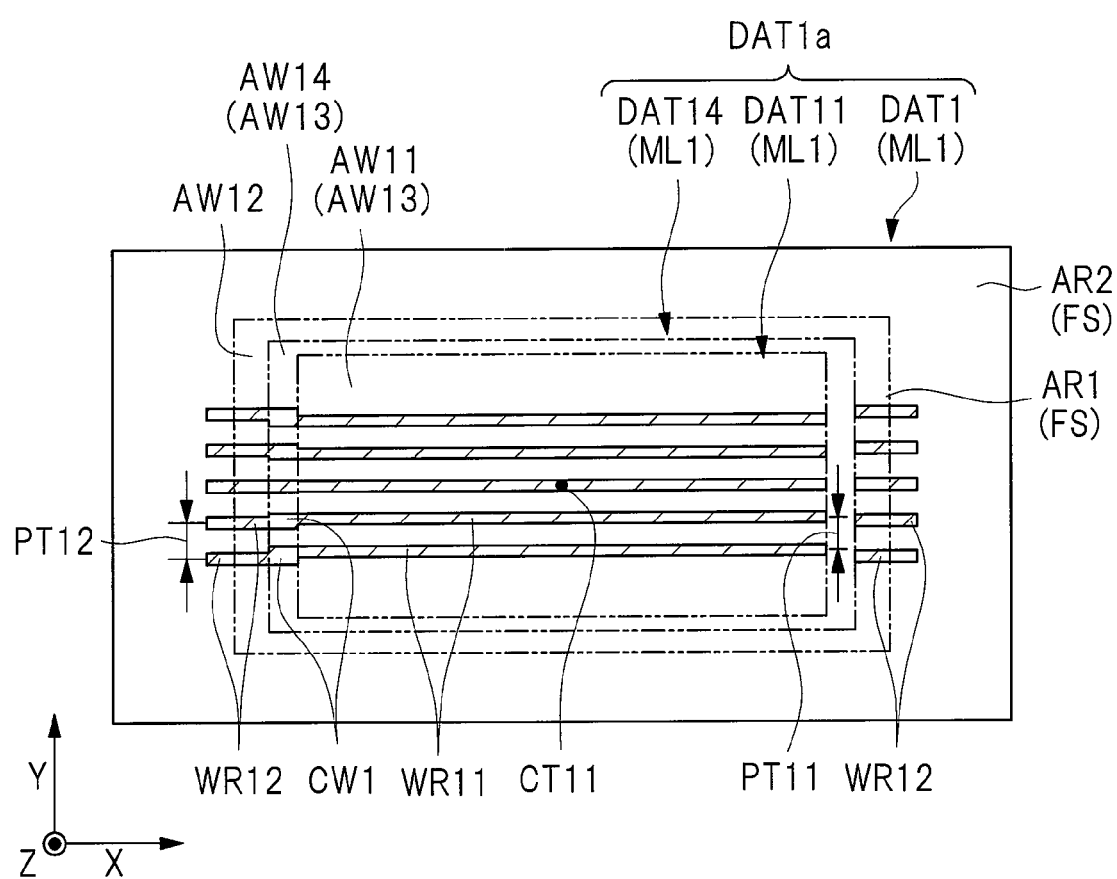
FIG. 16 is a plan view illustrating the wiring layout data of a wiring layer of the first layer in the first embodiment.

Next, gap partial mask data is created as illustrated in FIG. 16 (Step S5 of FIG. 11). In Step S5, in the gap area AW14, the gap partial mask data DAT14 as the pattern data is formed, and the gap area AW14 is filled with the gap partial mask data DAT14. Therefore, the mask data DAT1a including the mask data of partially shrunk region DAT11, the gap partial mask data DAT14, and the mask data DAT1 is created as the pattern data.

The gap partial mask data DAT14 includes the plurality of connection wirings (wiring pattern) CW1. The plurality of connection wirings CW1 connect the plurality of wirings WR11 and the plurality of wirings WR12.

In the example illustrated in FIG. 5, the coordinates of the corner formed by the side surface on the positive side in the X axis direction of the end portion EP12 of the wiring WR12a and the side surface SW21 on the positive side in the Y axis direction of the end portion EP12 of the wiring WR12a are set to (Xp1, Yp1). In addition, the coordinates of the corner formed by the side surface on the positive side in the X axis direction of the end portion EP12 of the wiring WR12a and the side surface SW22 on the negative side in the Y axis direction of the end portion EP12 of the wiring WR12a are set to (Xp2, Yp2). On the other hand, the coordinates of the corner formed by the side surface on the negative side in the X axis direction of the end portion EP11 of the wiring WR11a and the side surface SW11 on the positive side in the Y axis direction of the end portion EP11 of the wiring WR11a are set to (Xp3, Yp3). In addition, the coordinates of the corner formed by the side surface on the negative side in the X axis direction of the end portion EP11 of the wiring WR11a and the side surface SW12 on the negative side in the Y axis direction of the end portion EP11 of the wiring WR11a are set to (Xp4, Yp4).

Here, a minimum line width is set to a width W00 in consideration of the mask size effect or the OPC process of the wiring layer ML1 of the first layer, and a shrink rate as a shrink magnification in the shrink process on the wiring layer ML1 of the first layer is set to α. At this point, the wiring WR11 is disposed such that the width WD11 of the wiring WR11 becomes equal to or more than a width W1 defined in the following Equation (1).

$$W1 = W00 + (1-\alpha) \times |Yp2| \quad (1)$$

In the example illustrated in FIG. 5, a rectangular shape is generated such that the coordinates of the corner on the negative side in the X axis direction of the connection wiring CW1 and on the positive side in the Y axis direction (the left upper portion in FIG. 5) are set to (Xp1, Yp3), and the coordinates of the corner on the positive side in the X axis direction of the connection wiring CW1 and on the negative side in the Y axis direction (the right lower portion in FIG. 5) are set to (Xp4, Yp2). Therefore, the connection wiring (wiring pattern) CW1 having the rectangular shape can be easily created.

In other words, in the example illustrated in FIG. 5, the connection wiring (wiring pattern) CW1 is created by being extended up to the gap area AW14 such that the wiring (wiring pattern) WR11 disposed in the area AW11 and the wiring (wiring pattern) WR12 disposed in the area AW11 are overlapped with each other.

At this point, a space width SP1 in the Y-axis direction between two connection wirings CW1 adjacent in the Y-axis direction is set to be equal to or more than a minimum space width in consideration of the mask size effect or the OPC process in the wiring layer ML1 of the first layer.

Further, a length in the X axis direction of the area where the wiring WR11 and the wiring WR12 are overlapped may be set to be shorter than that in the X axis direction of the gap area AW14, or may be set to be longer than that in the X axis direction of the gap area AW14. Even in this case, the same effect as that of FIG. 5 is achieved.

Next, the exposure mask is manufactured (Step S6 of FIG. 11). In Step S6, an exposure mask MSK is manufactured using the mask data DAT1a.

As described below using FIG. 21, the exposure mask MSK includes a base member BS, an exposure pattern PTN1 which is made of the light shielding film (for example, a metal film) formed in the surface of the base member BS, and an exposure pattern PTN2 which is made of the light shielding film (for example, the metal film) formed in the surface of the base member. The exposure pattern PTN1 is formed based on a plurality of wiring patterns of the mask data DAT1a, and used to form the plurality of wirings WR11. In addition, the exposure pattern PTN2 is formed based on the plurality of wiring patterns of the mask data DAT1a, and used to form the plurality of wirings WR12.

In the first embodiment, the exposure mask MSK includes an exposure pattern PTN3 which is made of the light shielding film (for example, the metal film) formed in the surface of the base member BS. The exposure pattern PTN3 is formed based on the plurality of wiring patterns of the mask data DAT1a, and used to form the plurality of connection wirings CW1.

Figure 17:
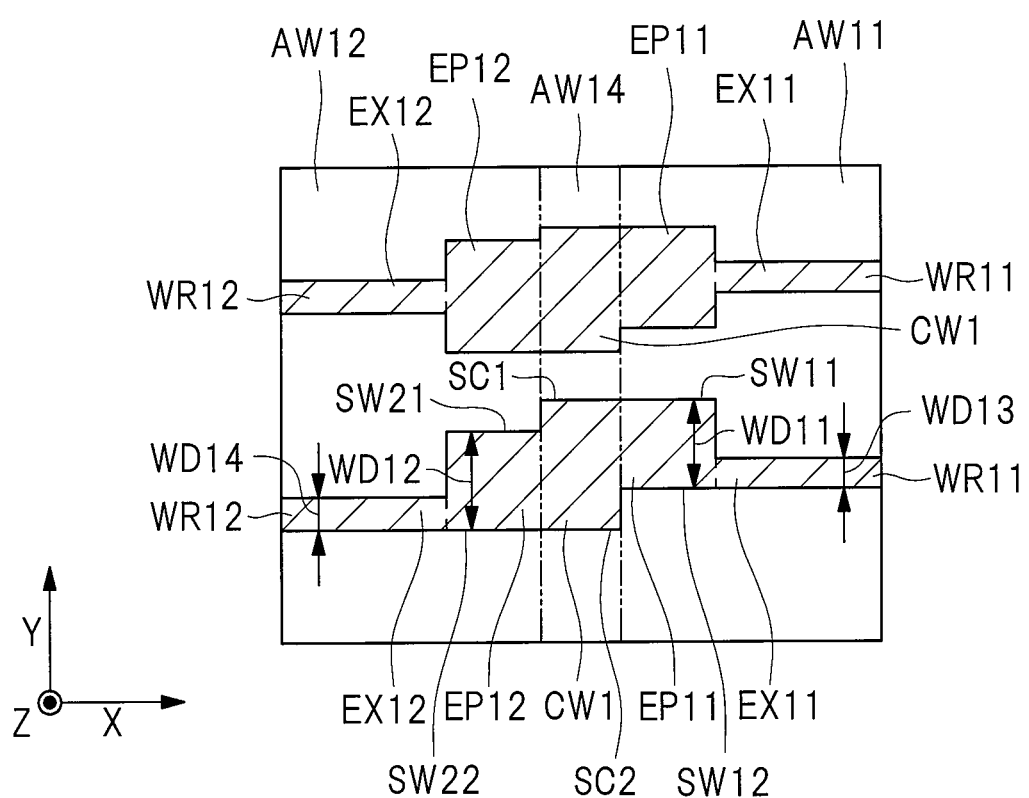
FIG. 17 is a plan view illustrating another example of a disposition layout in the wiring layer of the first layer in the first embodiment.

In addition, each of the wirings WR11 and WR12 may be formed in the rectangular shape when seen in a plan view. Such an example is illustrated in FIG. 17. FIG. 17 is a plan view illustrating another example of a disposition layout in the wiring layer of the first layer in the first embodiment.

As illustrated in FIG. 17, the wiring WR11 includes the end portion EP11 on the side closer to the area AR2 and an extending portion EX11 which is connected to the end portion EP11 and extended in the X axis direction, and the width WD11 in the Y axis direction of the end portion EP11 may be equal to or more than a width WD13 in the Y axis direction of the extending portion EX11. In addition, the wiring WR12 includes the end portion EP12 on the side closer to the area AW11 and an extending portion EX12 which is connected to the end portion EP12 and extended in the X axis direction, and the width WD12 in the Y axis direction of the end portion EP12 may be equal to or more than a width WD14 in the Y axis direction of the extending portion EX12.

At this point, in a case where the end portion EP11 is shifted toward the positive side in the Y axis direction from the end portion EP12, the side surface SC1 on the positive side in the Y axis direction of the connection wiring CW1 and the side surface SW11 on the positive side in the Y axis direction of the end portion EP11 are formed in the same surface. In addition, the side surface SC2 on the negative side in the Y-axis direction of the connection wiring CW1 and the side surface SW22 on the negative side in the Y-axis direction of the end portion EP12 are formed in the same surface.

Even in the case illustrated in FIG. 17, similarly to the case illustrated in FIG. 4, the connection pattern as the connection wiring CW1 having the rectangular shape can be easily created for the end portion EP11, the end portion EP12, and the connection wiring CW1 by the same design method as that described using FIGS. 11 to 16. Further, the same effect as that in the case illustrated in FIG. 5 is achieved.

<Manufacturing Method of Semiconductor Device>

Figure 18:
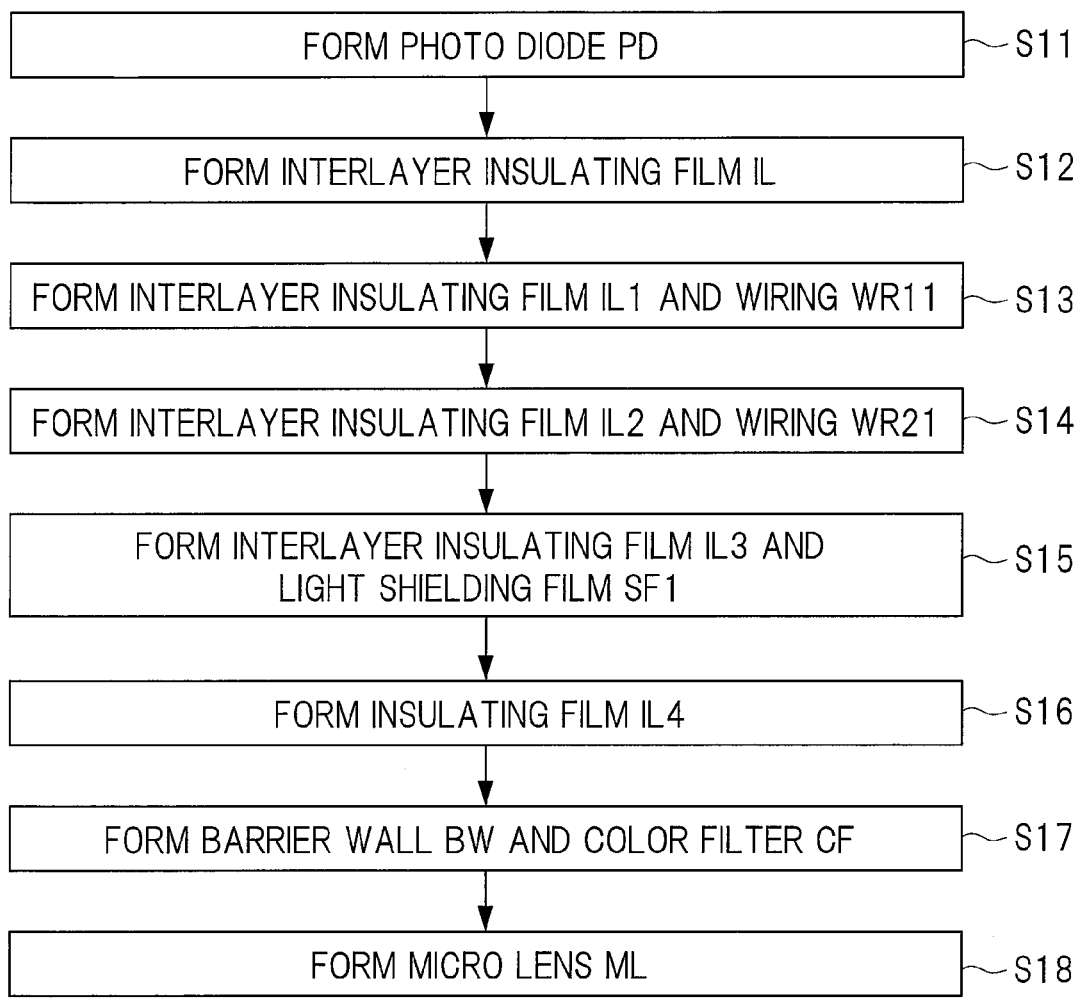
FIG. 18 is a manufacturing process flow diagram illustrating a part of a manufacturing process of the semiconductor device of the first embodiment.

Next, a manufacturing method of the semiconductor device of the first embodiment will be described. FIG. 18 is a manufacturing process flow diagram illustrating a part of the manufacturing process of the semiconductor device of the first embodiment. FIGS. 19 to 24 are cross-sectional views illustrating main parts in the manufacturing process of the semiconductor device of the first embodiment. Further, FIGS. 19 to 24 illustrate cross sections corresponding to the cross-sectional view of FIG. 3.

First, the photo diode PD is formed (Step S11 of FIG. 18).

Figure 19:
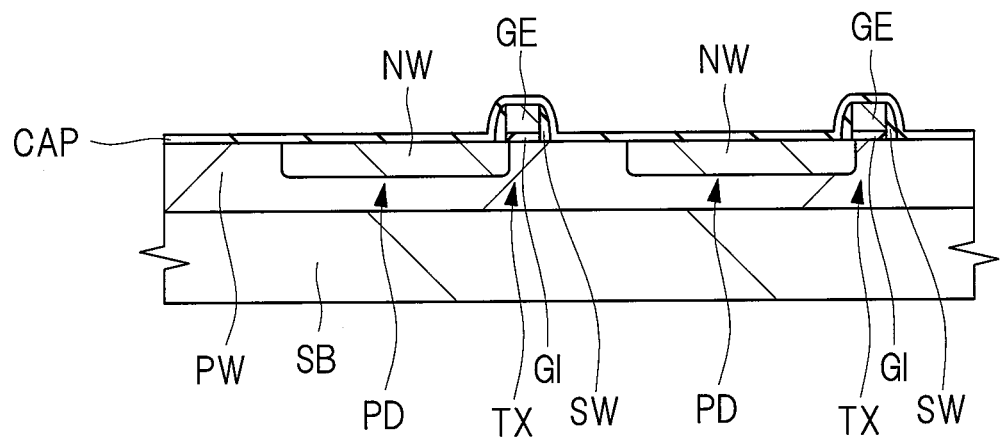
FIG. 19 is a cross-sectional view illustrating main parts in the manufacturing process of the semiconductor device of the first embodiment.

In Step S11, first, for example, the semiconductor substrate SB made of single crystal silicon (Si) is prepared as illustrated in FIG. 19.

Next, as illustrated in FIG. 19, the photo diode PD, the transmission transistor TX, and the amplification transistor of each pixel are formed in each area AR1 (see FIG. 1) which is a pixel area formed with the pixel.

In the area AR1 (see FIG. 1), the p-type semiconductor layer PW introduced with a p-type impurity (for example, boron (B)) is formed on the upper surface of the semiconductor substrate SB. On the other hand, in the area AR1, the n-type semiconductor layer NW introduced with an n-type impurity (for example, phosphorus (P) or arsenic (As)) is formed in the upper portion of the p-type semiconductor layer PW. Therefore, in the area AR1, the p-type semiconductor layer PW is formed immediately below the n-type semiconductor layer NW. The p-type semiconductor layer PW and the n-type semiconductor layer NW are made in pn junction to form the photo diode PD. In other words, in the area AR1, a plurality of photo diodes PD are formed in the upper surface of the semiconductor substrate SB.

In the area AR1 (see FIG. 1), for example, the gate electrode GE made of a polysilicon film is formed through the gate insulating film GI (for example, the silicon oxide film) in the upper surface of the semiconductor substrate SB. For example, the side wall SW made of the silicon oxide film is formed in the side surface of the gate electrode GE. The gate electrode GE is a gate electrode of the transmission transistor TX. On the other hand, the n-type semiconductor layer NW of the photo diode PD also serves as a source region of the transmission transistor TX.

Further, a drain region of the transmission transistor TX is omitted in FIG. 19. In addition, the photo diode PD is connected to a transistor such as an amplification transistor for amplifying a signal output from the photo diode PD through the transmission transistor TX. Herein, only the transmission transistor TX is illustrated, and an element separation region is omitted in the drawing.

Figure 20:
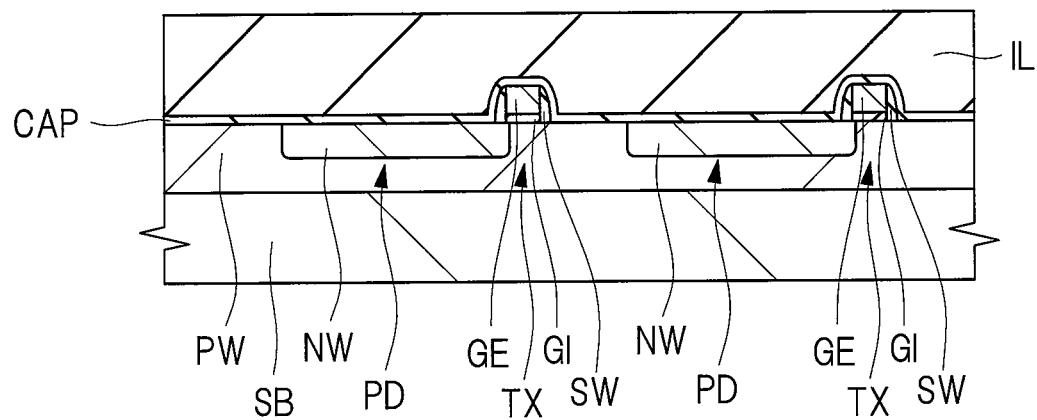
FIG. 20 is a cross-sectional view illustrating the main parts in the manufacturing process of the semiconductor device of the first embodiment.

Next, the interlayer insulating film IL is formed (Step S12 of FIG. 18). In Step S12, as illustrated in FIG. 20, in an area where each pixel PU (see FIG. 3) is formed, for example, the interlayer insulating film IL made of the silicon oxide film is formed on the upper surface of the semiconductor substrate SB to cover the semiconductor element such as the photo diode PD and the transmission transistor TX by the CVD (Chemical Vapor Deposition) method. In addition, the upper surface of the interlayer insulating film IL is flattened by the CMP method.

Further, for example, the cap insulating film CAP made of a silicon nitride film may be formed in the upper surface of the photo diode PD, the upper surface of the gate electrode GE, and the surface of the side wall SW formed in the side surface of the gate electrode GE. In such a case, the interlayer insulating film IL is formed on the photo diode PD and on the transmission transistor TX through the cap insulating film CAP.

In addition, after the interlayer insulating film IL is formed, a contact hole (not illustrated) is formed to pass through the interlayer insulating film IL to reach the semiconductor substrate SB, and the formed contact hole is filled with the metal film, so that a plurality of contact plugs (not illustrated) made of the metal film filled in the contact hole can be formed. In this case, the upper surface of the contact plug and the upper surface of the interlayer insulating film IL are flattened by the CMP method.

Figure 21:
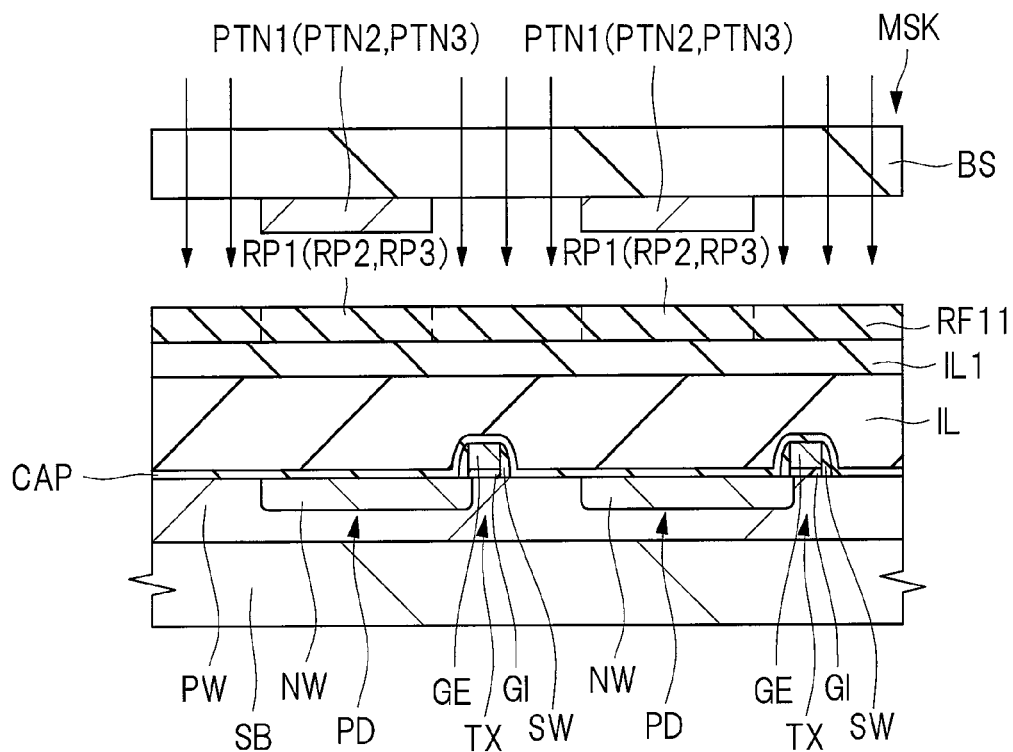
FIG. 21 is a cross-sectional view illustrating the main parts in the manufacturing process of the semiconductor device of the first embodiment.
Figure 22:
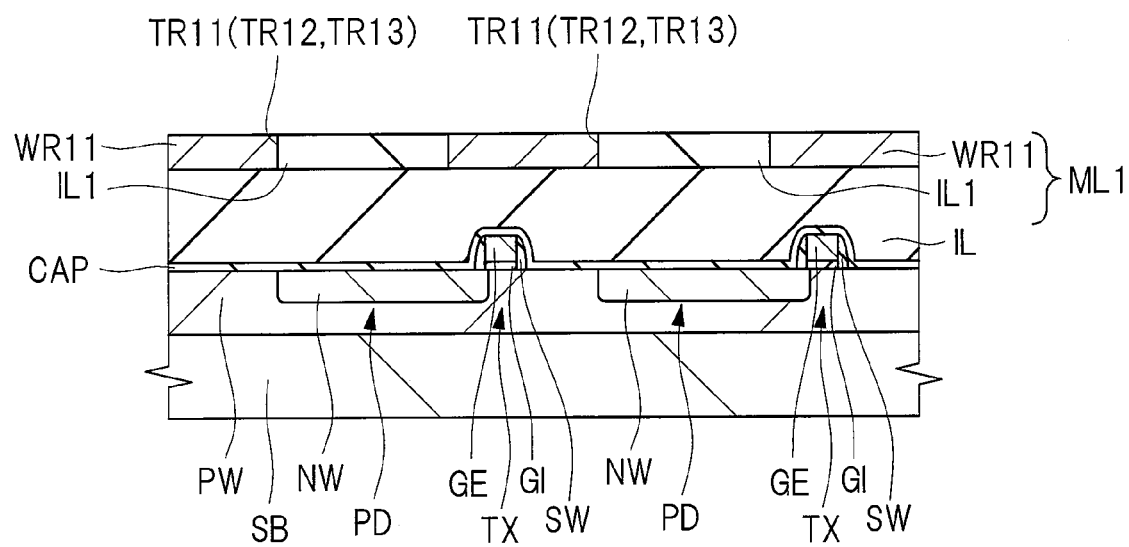
FIG. 22 is a cross-sectional view illustrating the main parts in the manufacturing process of the semiconductor device of the first embodiment.

Next, the interlayer insulating film IL1 and the wiring WR11 are formed as illustrated in FIGS. 21 and 22 (Step S13).

In Step S13, first, for example, the interlayer insulating film IL1 made of the silicon oxide ($SiO_2$) film is formed on the interlayer insulating film IL by the CVD method using a tetraethyl orthosilicate (TEOS) gas as a source gas.

Next, the wiring WR11 filled in a wiring trench TR11 of the upper surface of the interlayer insulating film IL1 is formed using a so-called single damascene method.

First, the interlayer insulating film IL1 is subjected to a photolithography and an etching step to be patterned. Therefore, the plurality of wiring trenches TR11 are formed in an area between two adjacent pixels to pass through the interlayer insulating film IL1.

In a step of patterning the interlayer insulating film IL1, first, a resist film RF1 is formed on the interlayer insulating film IL1. Next, the pattern of the resist film RF1 is exposed to the light using the exposure mask MSK.

The exposure mask MSK includes the base member BS, the exposure pattern PTN1 which is made of the light shielding film (for example, the metal film) formed in the surface of the base member BS, and the exposure pattern PTN2 which is made of the light shielding film (for example, the metal film) formed in the surface of the base member BS. The exposure pattern PTN1 is used to form the plurality of wirings WR11 (see FIG. 22), and the exposure pattern PTN2 is used to form the plurality of wirings WR12 (see FIG. 4). In addition, the exposure mask MSK includes the exposure pattern PTN3 which is made of the light shielding film (for example, the metal film) formed in the surface of the base member BS. The exposure pattern PTN3 is used to form the plurality of connection wirings CW1 (see FIG. 4).

Next, as illustrated in FIG. 21, a resist pattern RP1 is formed in the area AW11 (see FIG. 4) by developing the pattern-exposed resist film RF1 with the light for forming the plurality of wirings WR11, and a resist pattern RP2 is formed in the area AW12 (see FIG. 4) for forming the plurality of wirings WR12 (see FIG. 4). In addition, a resist pattern RP3 is formed in the gap area AW14 (see FIG. 4) for forming the plurality of connection wirings CW1 (see FIG. 4).

Next, the interlayer insulating film IL1 is etched by using the resist patterns RP1, RP2, and RP3 as an etching mask. Therefore, the plurality of wiring trenches TR11 for forming the plurality of wirings WR11, a plurality of wiring trenches TR12 for forming the plurality of wirings WR12, and a plurality of wiring trenches TR13 for forming the plurality of connection wirings CW1 are formed. In the step of etching the interlayer insulating film IL1, for example, the interlayer insulating film IL1 may be etched by a dry etching method using a fluorocarbon-containing gas as an etching gas.

Thereafter, as illustrated in FIG. 22, for example, a copper (Cu) film as a conductive film is buried in each of the plurality of wiring trenches TR11, the plurality of wiring trenches TR12, and the plurality of wiring trenches TR13. Therefore, the wiring WR11 is formed in the wiring trench TR11 in the area AW11 (see FIG. 4), the wiring WR12 is formed in the same layer as that of the wiring WR11 in the wiring trench TR12 in the area AW12 (see FIG. 4), and the connection wiring CW1 is formed in the same layer as that of the wiring WR11 in the wiring trench TR13 in the gap area AW14 (see FIG. 4). The wiring WR11 is electrically connected to the semiconductor element such as the photo diode PD or the transmission transistor TX which are formed in the upper surface of the semiconductor substrate SB through the contact plugs.

Since the wiring WR11 is formed in the area between the areas where two adjacent pixels PU (see FIG. 3) are formed, it is possible to prevent or suppress the incident light from being blocked by the wiring WR11 when the light enters the photo diode PD of each of the plurality of pixels PU. The upper surfaces of the wiring WR11 and the interlayer insulating film IL1 are flattened by the CMP method.

Further, the wiring WR11 is not limited to a copper wiring, and may be formed of an aluminum (Al) wiring. In such a case, first, a conductive film made of an aluminum film is formed on the interlayer insulating film IL, and the resist film is formed on the conductive film. Next, the pattern of the resist film is exposed to the light using the exposure mask, a first resist pattern (not illustrated) for forming the plurality of wirings WR11 is formed in the area AW11 (see FIG. 4) through development, and a second resist pattern (not illustrated) for forming the plurality of wirings WR12 is formed in the area AW12 (see FIG. 4). In addition, a third resist pattern (not illustrated) for forming the plurality of connection wirings CW1 is formed in the gap area AW14 (see FIG. 4).

Next, the conductive film is etched using the first resist pattern, the second resist pattern, and the third resist pattern as an etching mask. Therefore, the plurality of wirings WR11 made of the conductive film are formed in the same layer above the semiconductor substrate SB in the area AW11 (see FIG. 4), and the plurality of wirings WR12 made of the conductive film are formed in the same layer as that of the plurality of wirings WR11 in the area AW12 (see FIG. 4). In addition, the plurality of connection wirings CW1 made of the conductive film are formed in the same layer as that of the plurality of wirings WR11 in the gap area AW14 (see FIG. 4).

In other words, in Step S13, the plurality of wirings WR11 are formed above the semiconductor substrate SB in the area AW11 through the photolithography using the exposure mask, and the plurality of wirings WR12 are formed in the same layer as that of the plurality of wirings WR11 in the area AW12.

Figure 23:
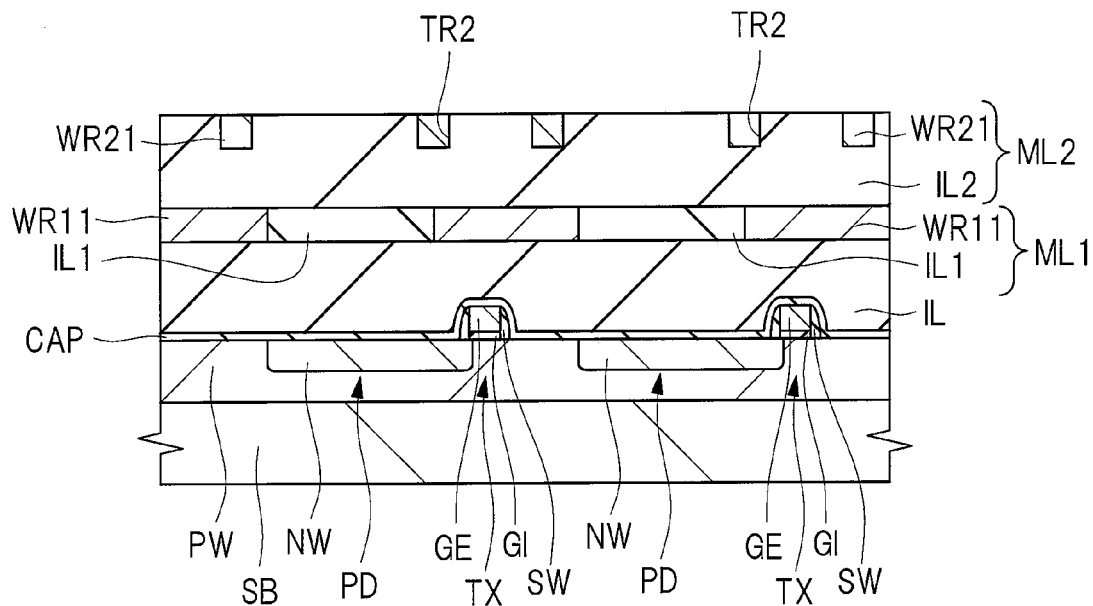
FIG. 23 is a cross-sectional view illustrating the main parts in the manufacturing process of the semiconductor device of the first embodiment.

Next, the interlayer insulating film IL2 and the wiring WR21 are formed as illustrated in FIG. 23 (Step S14). In Step S14, first, the interlayer insulating film IL2 made of a carbon-containing silicon oxide (SiOC) film is formed on the interlayer insulating film IL1 and on the wiring WR11, for example, by the CVD method using a trimethylsilane (SiH(CH$_3$)$_3$) gas and an oxygen (O$_2$) gas as the source gas.

Next, the wiring WR21 buried in the wiring trench TR2 of the upper surface of the interlayer insulating film IL2 and a via (not illustrated) for the connection of the wirings WR21 and WR11 immediately below the wiring WR21 are formed using a so-called dual damascene method.

First, the interlayer insulating film IL2 is patterned using the photolithography technique and the etching method. Through the patterning, the plurality of wiring trenches TR2 are formed in the upper surface of the interlayer insulating film IL2, and the plurality of via holes (not illustrated) passing through the interlayer insulating film IL2 are formed in the bottom surfaces of the wiring trenches TR2.

In the step of patterning the interlayer insulating film IL2, for example, the interlayer insulating film IL2 may be etched by the dry etching method using a fluorocarbon-containing gas as an etching gas.

Thereafter, for example, a copper (Cu) film is buried in each of the plurality of wiring trenches TR2 and the plurality of via holes, so that the wiring WR21 in each wiring trench and the via in each via hole are formed. The wiring WR21 is electrically connected to the wiring WR11 through the via.

Further, the interlayer insulating film IL2, the wiring WR21, and the via (not illustrated) form the wiring layer ML2 of the second layer.

The wiring WR21 is formed in an area between the areas where two adjacent pixels PU (see FIG. 3) are formed. Therefore, it is possible to prevent or suppress the light from being blocked by the wiring WR21 when the light enters the photo diode PD included in each pixel PU. Further, the upper surfaces of the wiring WR21 and the interlayer insulating film IL2 are flattened by the CMP method.

Figure 24:
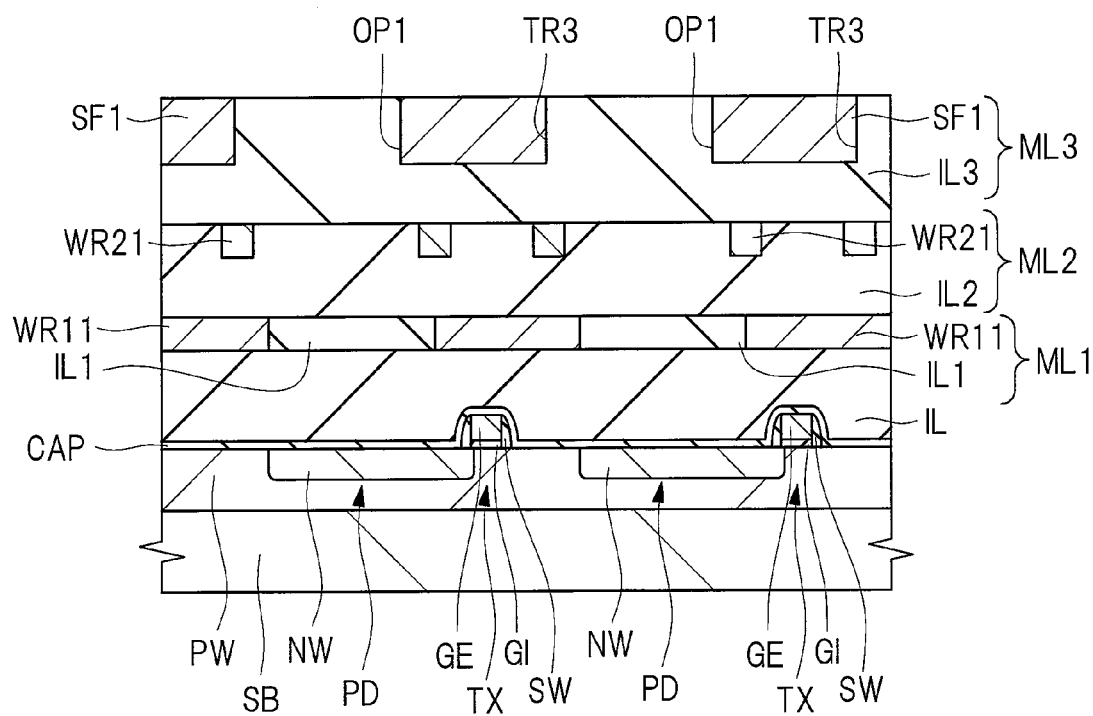
FIG. 24 is a cross-sectional view illustrating the main parts in the manufacturing process of the semiconductor device of the first embodiment.

Next, the interlayer insulating film IL3 and the light shielding film SF1 are formed as illustrated in FIG. 24 (Step S15). In Step S15, first, the interlayer insulating film IL3 made of a carbon-containing silicon oxide (SiOC) film is formed on the interlayer insulating film IL2 and on the wiring WR21, for example, by the CVD method using the trimethylsilane (SiH(CH$_3$)$_3$) gas and the oxygen (O$_2$) gas as the source gas.

Next, the wiring WR3 buried in the wiring trench of the upper surface of the interlayer insulating film IL3 and a via (not illustrated) for the connection of the wirings WR3 and WR21 immediately below the wiring WR3 are formed using a so-called dual damascene method.

First, the interlayer insulating film IL3 is patterned using the photolithography technique and the etching method. Therefore, the plurality of wiring trenches TR3 are formed in the upper surface of the interlayer insulating film IL3. In the step of patterning the interlayer insulating film IL3, for example, the interlayer insulating film IL3 may be etched by the dry etching method using a fluorocarbon-containing gas as an etching gas.

Thereafter, for example, a copper (Cu) film is buried in each of the plurality of wiring trenches TR3, so that the light shielding film SF1 is formed in each wiring trench TR3.

Further, the interlayer insulating film IL3 and the light shielding film SF1 form the wiring layer ML3 of the uppermost layer.

The light shielding film SF1 is formed in an area between the areas where two adjacent pixels PU (see FIG. 3) are formed. Therefore, it is possible to prevent or suppress the incident light from being blocked by the light shielding film SF1 when the light enters the photo diode PD included in each of the plurality of pixels PU. Further, the upper surfaces of the light shielding film SF1 and the interlayer insulating film IL2 are flattened by the CMP method.

Next, the insulating film IL4 is formed as illustrated in FIG. 3 (Step S16 of FIG. 18). In Step S16, first, for example, the insulating film IL4 made of a silicon nitride film is formed on the interlayer insulating film IL3 and on the light shielding film SF1.

Next, the barrier wall BW and the color filter CF are formed as illustrated in FIG. 3 (Step S17 of FIG. 18).

In Step S17, first, for example, a film made of the silicon oxide film is formed on the insulating film IL4 by the CVD method, and patterned using the photolithography technique and the etching method. Therefore, for example, the barrier wall BW made of the silicon oxide film is formed on the insulating film IL4 in an area between the areas where two adjacent pixels PU are formed.

In Step S17, next, the color filter CF is formed between the adjacent barrier walls BW. The color filter CF is made of films colored by, for example, red (R), green (G), and blue (B).

Next, the micro lens ML is formed as illustrated in FIG. 3 (Step S18 of FIG. 18). In Step S18, the micro lens ML is formed on the color filter CF. The micro lens ML is a convex lens of which the upper surface is bent, and made of a film which transmits the light. The micro lens ML collects the light emitted from the side of the main surface of the semiconductor substrate SB (that is, the upper surface) to the respective pixels PU into the photo diode PD.

For example, after the film is formed on the barrier wall BW and on the color filter CF, the formed film is heated and melted so as to make the shape of the film round, so that the micro lens ML is formed.

As described above, the semiconductor device of the first embodiment illustrated in FIG. 3 is completed.

<Shading>

Figure 25:
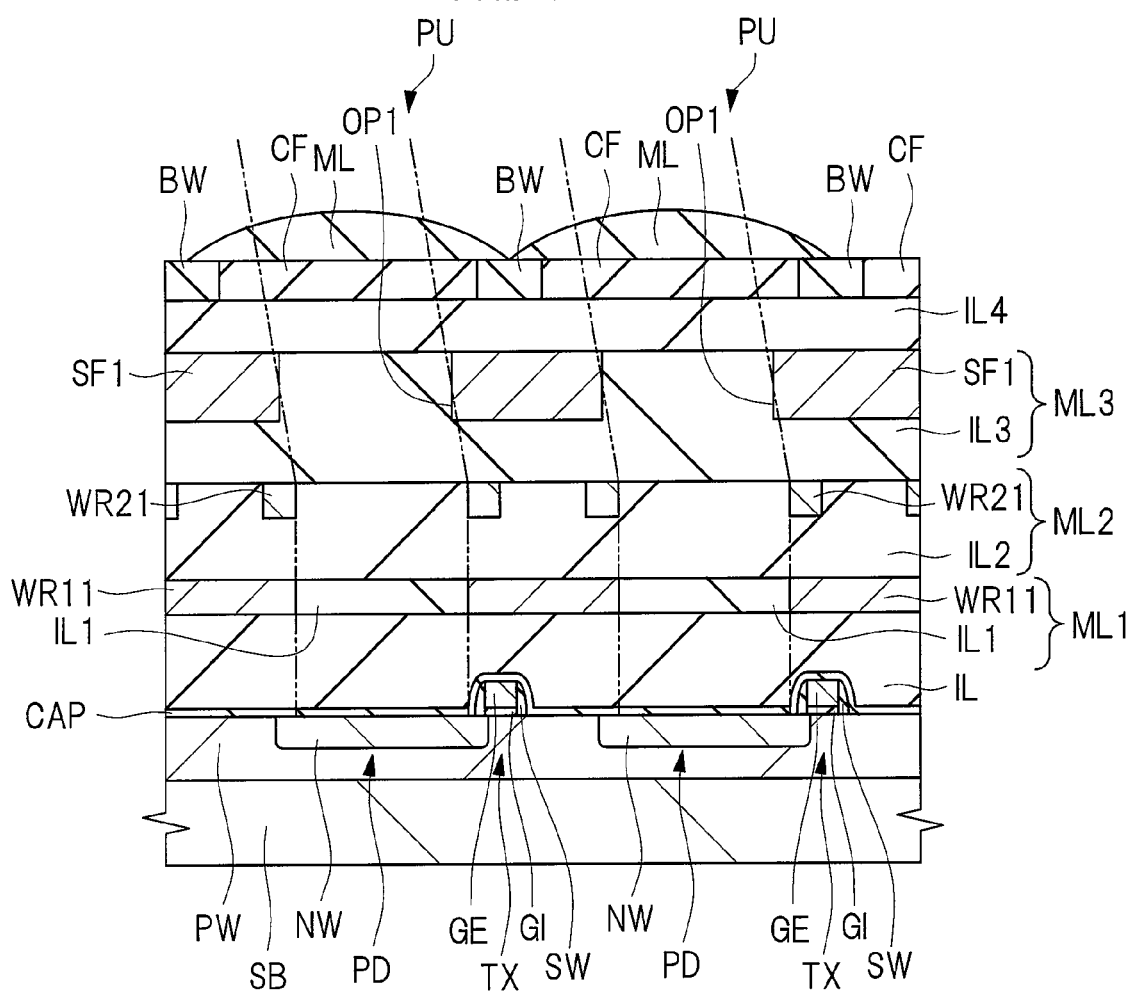
FIG. 25 is a cross-sectional view illustrating a configuration of a semiconductor device of a comparative example.
Figure 26:
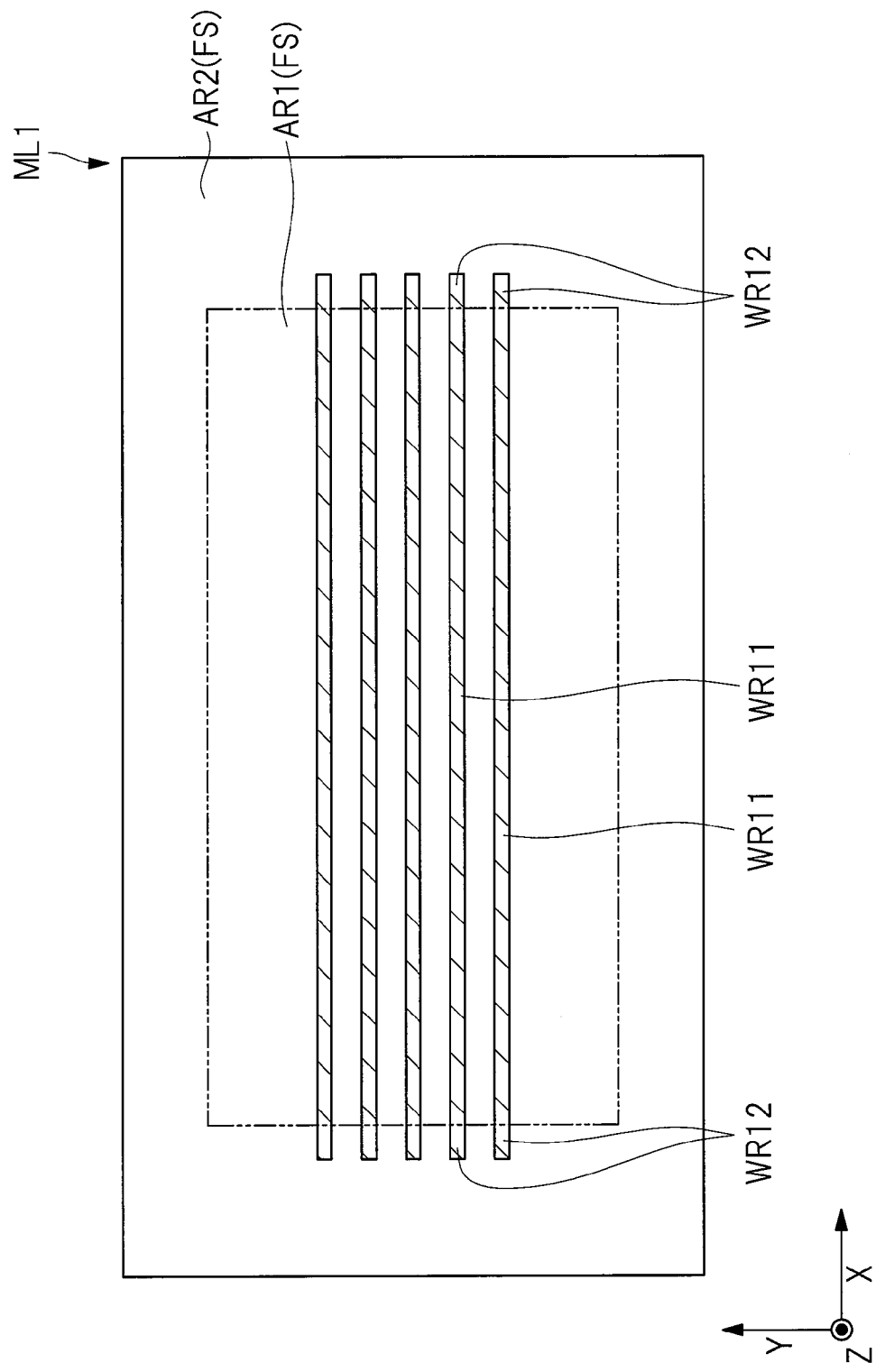
FIG. 26 is a plan view illustrating the wiring layout of the wiring layer of the first layer in the comparative example.

Next, the shading will be described in comparison with a semiconductor device of a comparative example. FIG. 25 is a cross-sectional view illustrating a configuration of the semiconductor device of the comparative example. FIG. 26 is a plan view illustrating the wiring layout of the wiring layer of the first layer in the comparative example. FIG. 25 is a cross-sectional view taken along a line B-B of FIG. 1. Further, the cross-sectional view taken along the line A-A of FIG. 1 is the same as FIG. 2.

Similarly to the image pickup element of the semiconductor device of the first embodiment, the image pickup element as the semiconductor device of the comparative example includes the CMOS image sensor.

The image pickup element as the semiconductor device of the comparative example includes the plurality of pixels PU which are formed in the upper surface of the semiconductor substrate SB in the area AR1. The plurality of pixels PU are arranged in a matrix shape in the X axis direction and the Y axis direction when seen in a plan view. Each of the plurality of pixels PU includes the photo diode PD, the transmission transistor TX, and the amplification transistor (not illustrated). The photo diode PD is a photoelectric conversion element which receives the incident light and converts the light into electric charges.

Similarly to the semiconductor device of the first embodiment, each of the plurality of pixels PU in the semiconductor device of the comparative example includes the color filter CF and the micro lens ML. Furthermore, similarly to the semiconductor device of the first embodiment, the semiconductor device of the comparative example includes the light shielding film SF1.

Here, the incident light entering each of the plurality of pixels PU may not necessarily enter the upper surface of the semiconductor substrate SB in a perpendicular direction. For example, in the plurality of pixels PU disposed in a matrix shape, the incident light entering the disposed pixel PU disposed on the peripheral side of the array of the plurality of pixels PU enters the upper surface of the semiconductor substrate SB in a direction inclined with respect to the perpendicular direction. In such a case, since apart of the light entering each pixel PU does not enter the photo diode PD included in the pixel PU, the photo diode PD is degraded in sensitivity. In other words, the shading occurs.

In order to prevent or suppress the shading, the shrink process is performed on the micro lens ML, the color filter CF, and the opening OP1 of the light shielding film SF1 to shrink these components with the center position of the array of the plurality of pixels PU as the center. In other words, the shrink process is performed to make the micro lens ML, the color filter CF, and the opening OP1 deviate.

Similarly to the first embodiment, in the semiconductor device of the comparative example, the shrink process is performed on the opening OP1 of the light shielding film SF1, the color filter CF, and the micro lens ML with a position in the area AR1 as the center where the plurality of pixels PU are disposed. In other words, in the semiconductor device of the comparative example, the shrink process is performed on the mask data of the wiring layer ML3 of the uppermost layer. However, in the semiconductor device of the comparative example, the shrink process is not performed on the mask data of the wiring layer ML1 of the first layer and the wiring layer ML2 of the second layer unlike the first embodiment. Therefore, as illustrated in FIG. 26, a pitch of the wirings WR11 in the area AR1 where the plurality of pixels PU are disposed becomes equal to the pitch of the wirings WR12 in the area AR2 where the peripheral circuit is disposed.

As illustrated in FIG. 25, in the semiconductor device of the comparative example, since the incident light entering the pixel PU disposed on the peripheral side of the array of the plurality of pixels PU is reflected on the wiring layer ML2 of the second layer or the wiring layer ML1 of the first layer lower than the wiring layer ML3 of the uppermost layer, the incident light does not appropriately enter the photo diode PD included in each pixel PU, and thereby the shading occurs.

In other words, since the light entering each pixel PU is reflected on a wiring included in the wiring layer which is above the semiconductor substrate SB and different from the light shielding film SF1 only by performing the shrink process on the opening OP1 of the light shielding film SF1, it is difficult to prevent or suppress the shading. Therefore, the CMOS image sensor is degraded in sensitivity, and the semiconductor device is degraded in performance.

In addition, in recent years, as each of the plurality of pixels PU is progressed in minimization or functionality, there is a need to increase the area of the photo diode PD included in each pixel PU and the area of the opening OP1 of the light shielding film SF1 in order to make a sufficient amount of light enter the photo diode PD. On the other hand, since each of the plurality of pixels PU is improved in functionality, the number of wirings included in the wiring layer ML1 of the first layer and the number of wirings included in the wiring layer ML2 of the second layer are increased. In such a case, in the semiconductor device of the comparative example, the shading problem of the incident light caused by the wiring layer ML1 of the first layer and the wiring layer ML2 of the second layer becomes serious.

<Main Characteristic and Effect of Present Embodiment>

In the first embodiment, when creating the mask data of the wiring layer ML1 of the first layer which is a wiring layer other than the wiring layer ML3 of the uppermost layer, the shrink process is performed with any position in the area AW13 containing the plurality of pixels PU as the center. Therefore, in the wiring layer ML1 of the first layer which is a wiring layer other than the wiring layer ML3 of the uppermost layer, the pitch of the wirings WR11 disposed in the area AW11 in the area AW13 is smaller than the pitch of the wirings WR12 disposed in the area AW12 different from the area AW13.

In the first embodiment, the shrink process is performed on the mask data of the wiring layer ML1 of the first layer with a position in the area where the plurality of pixels PU are disposed as the center. With this configuration, the pitch of the wirings WR11 can be made smaller than the pitch of the wirings WR12, and the shading caused by the wiring layer ML1 of the first layer can be prevented or suppressed. Therefore, the CMOS image sensor can be improved in sensitivity, and the semiconductor device can be improved in functionality.

As described using FIGS. 11 to 16, for example, the wiring layer ML1 of the first layer is extended in the mask data DAT1 of the wiring layer ML1 of the first layer before the shrink process, for example, in the X-axis direction, and formed by the plurality of wirings WR13 arranged in the Y-axis direction. The wiring WR13 is extended from the area AW13 where the plurality of pixels PU (see FIG. 3) are disposed to the area AW12 where the peripheral circuit is disposed.

In such a case, the outer periphery of the area AW13 of which the partial mask data DAT13 is cut out traverses the plurality of wirings WR13. Then, after the mask data of partially shrunk region DAT11 created by performing the shrink process on the partial mask data DAT13 is attached to the area AW11, the mask data is not created in the gap area AW14 between the area AW11 and the area AW12. Therefore, when the gap partial mask data DAT14 is created, it is necessary to connect the wirings WR11 and WR12 between the area AW11 and the area AW12 in consideration of a difference in pitch of the wirings WR11 before and after the shrink process.

In addition, the wiring WR11 disposed in the area AW11 is electrically connected to the wiring WR12 disposed in the area AW12 at the first time since the step of creating the gap partial mask data DAT14 is performed (Step S5 of FIG. 11). Therefore, it is insufficient only to perform the verification on whether the wiring WR11 is connected to the wiring WR12 when the chip layout data is created, and thus it is necessary to perform the verification even after the mask data DAT1a is created.

In the first embodiment, since the coordinates of the corner of the connection wiring CW1 included in the gap partial mask data DAT14 is calculated using the coordinates of the corner of the end portion EP11 of the wiring WR11 disposed in the area AW11 and the coordinates of the corner of the end portion EP12 of the wiring WR12 disposed in the area AW12, the creation can be made with ease. Therefore, it is possible to simplify a process of calculating the layout of the pattern as the connection wiring CW1 included in the gap partial mask data DAT14.

In addition, a comparative verification through a plurality of calculations may be performed on the gap partial mask data DAT14 by automatically creating the pattern as the connection wiring CW1 through the calculation, and it is possible to verify whether there is data missing in the gap partial mask data DAT14 with a relatively easy manner.

Further, the shrink process may be performed on the wiring layer other than the wiring layer ML1 of the first layer, or may be performed on the p-type semiconductor layer PW, the n-type semiconductor layer NW, or the gate electrode GE. In addition, each portion of the area subjected to the shrink process may be set to the same shrink rate $\alpha$, or may be adjusted to have different values.

Furthermore, the first embodiment has been described about an example in which the cut-out area AW13 is formed in the rectangular shape, and the wirings WR11 and WR12 are connected in the gap area AW14 between the end portion on the negative side in the X axis direction of the area AW11 and the area AW12. However, the cut-out area AW13 may be not formed in the rectangular shape. Alternatively, the wirings WR11 and WR12 may be connected in the gap area AW14 between the end portion on the positive side in the X-axis direction of the area AW11 and the area AW12. Further, the wirings WR11 and WR12 may be connected in the gap area AW14 between the end portion on the positive or negative side in the Y-axis direction of the area AW11 and the area AW12. Even in either case, the same effect as the first embodiment is achieved.

In the method of creating the pattern as the connection wiring CW1 in the first embodiment, the wiring WR11 disposed in the area AW11 is extended toward the area AW12, and the wiring WR12 disposed in the area AW12 is extended toward the area AW11. Therefore, it is possible to easily create the gap partial mask data DAT14 having the connection wiring CW1. In addition, the extending portion of the wiring WR11 and the extending portion of the wiring WR12 are overlapped in the gap area AW14, so that the pattern as the connection wiring CW1 is created. Since the width WC1 of the connection wiring CW1 which is the overlapped portion is made larger than the width W00 in consideration of the mask size effect or the OPC process of the wiring layer ML1 of the first layer, it is possible to improve an exposure margin indicating a ratio of a wiring width with respect to a processing accuracy in exposure.

Further, in a case where the shrink process is performed on the wiring included in the wiring layer ML1 of the first layer and the wiring included in the wiring layer ML2 of the second layer, the shrink process is necessarily performed on the via connecting the wiring layer ML1 of the first layer and the second wiring layer ML2. In such a case, the width (diameter) of the via is narrowed by the shrink process. For example, in a case where the width of the via is set to 0.16 μm before the shrink process and the shrink rate with respect to the via is set to 0.95, the width of the via is narrowed to 0.152 μm after the shrink process. In such a case, in the process of manufacturing the semiconductor device, a margin with respect to the processing accuracy in dimension becomes small in the lithography process of forming the via hole where the via is formed. For example, there is a concern that the via hole is not formed.

On the other hand, according to the first embodiment, the wiring WR11 is connected to the wiring WR12 through the connection wiring CW1 which is formed in the same layer as that of the wiring WR11. Therefore, since there is no need to perform the shrink process on the via, the margin with respect to the processing accuracy in dimension can be secured in the lithography process of forming the via hole, and the via hole can be formed with a good shape accuracy.

<First Modification Example of Wiring Layout and Design Method>

Next, a first modification example of the wiring layout in the wiring layer and the design method will be described.

Figure 27:
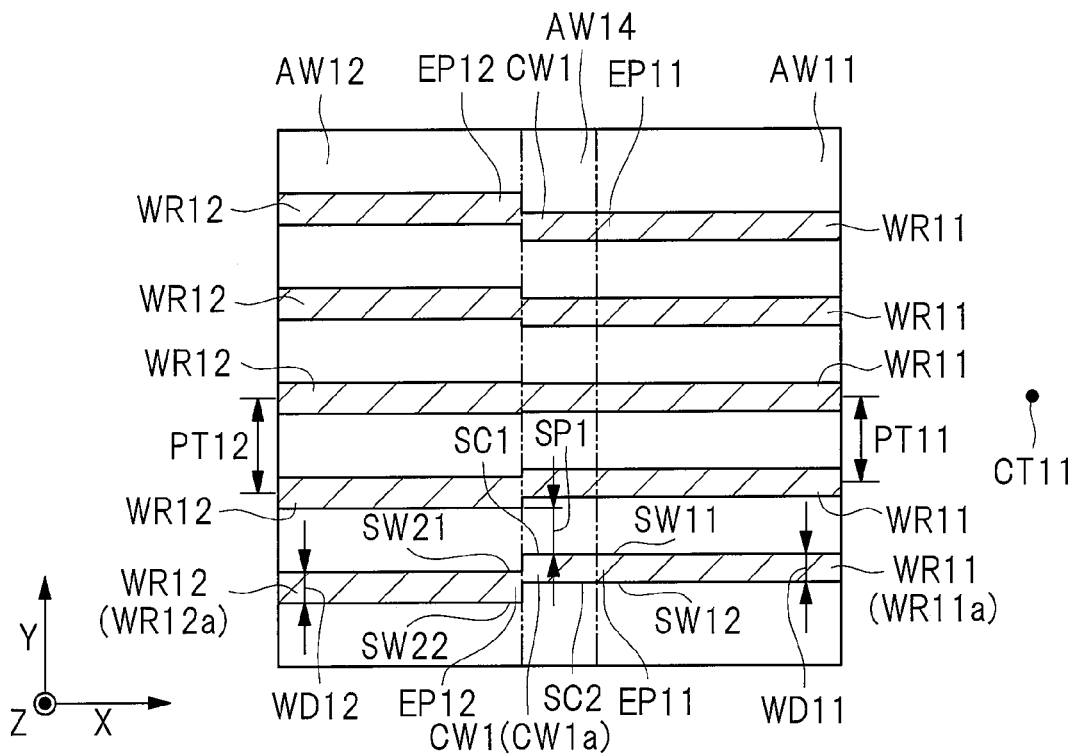
FIG. 27 is a plan view illustrating the wiring layout of the wiring layer of the first layer in a first modification example of the first embodiment.
Figure 28:
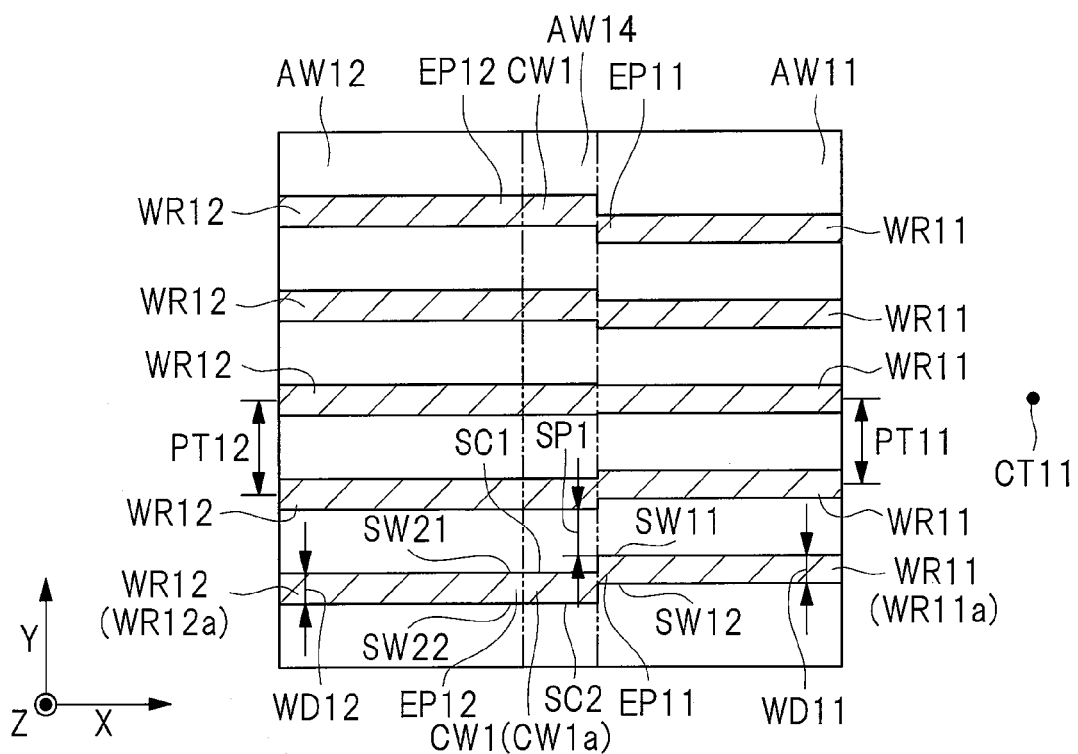
FIG. 28 is a plan view illustrating another example of the wiring layout of the wiring layer of the first layer in the first modification example of the first embodiment.
Figure 29:
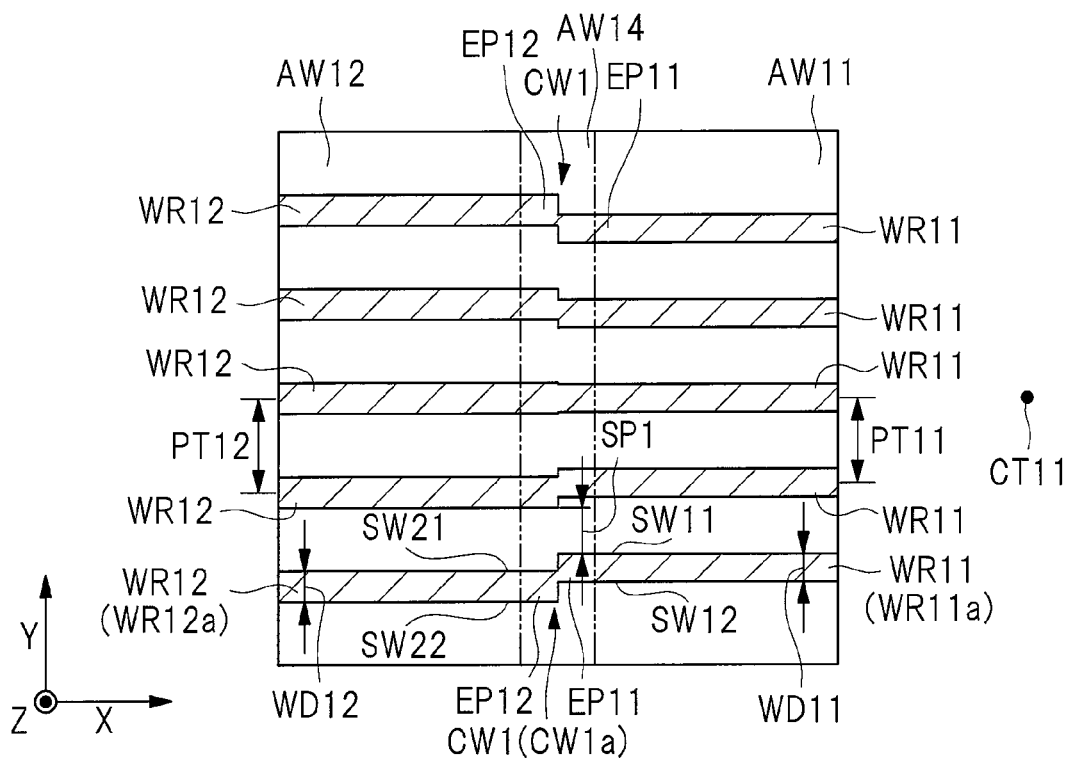
FIG. 29 is a plan view illustrating another example of the wiring layout of the wiring layer of the first layer in the first modification example of the first embodiment.
Figure 30:
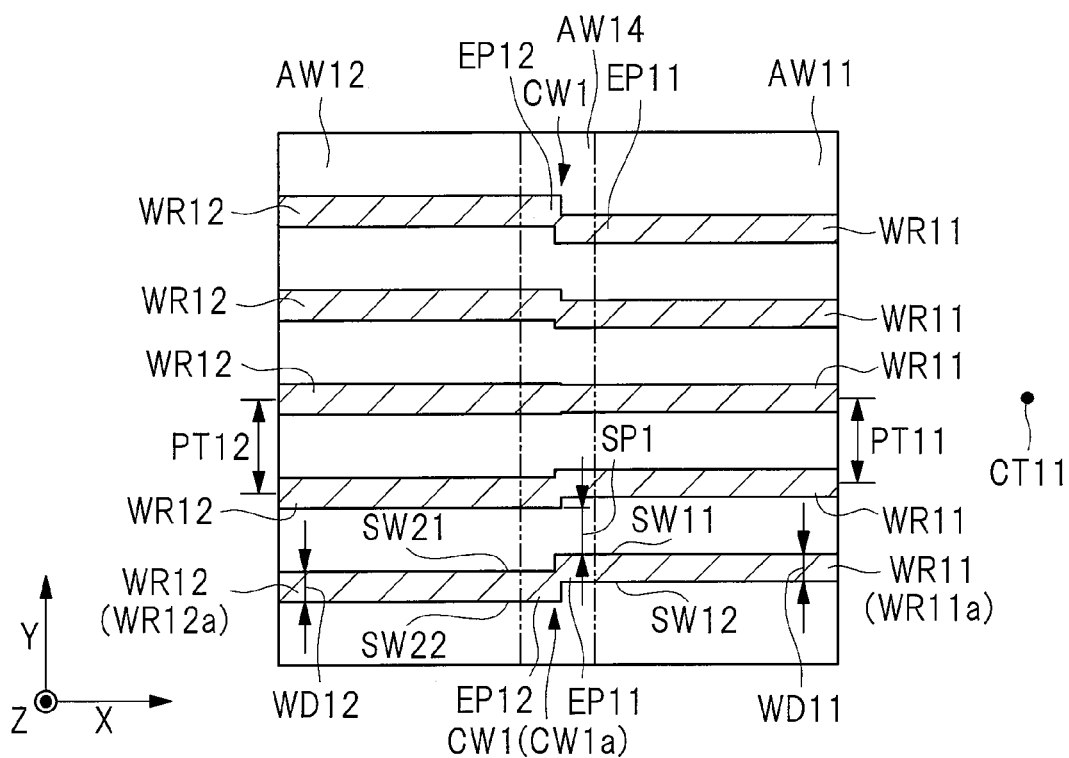
FIG. 30 is a plan view illustrating another example of the wiring layout of the wiring layer of the first layer in the first modification example of the first embodiment.

FIG. 27 is a plan view illustrating the wiring layout of the wiring layer of the first layer in the first modification example of the first embodiment. FIGS. 28 to 30 are plan views illustrating other examples of the wiring layout of the wiring layer of the first layer in the first modification example of the first embodiment.

In the first modification example, at least one of the wiring WR11 in the area AW11 and the wiring WR12 in the area AW12 is extended up to the gap area AW14 and connected to the other one. Further, a portion disposed in the gap area AW14 is the connection wiring CW1.

In either example of FIGS. 27 to 30, a connection wiring CW1a in the plurality of connection wirings CW1 is connected to the wiring WR11a in the plurality of wirings WR11, and connected to the wiring WR12a in the plurality of wirings WR12. In addition, the wiring WR11a is shifted toward the shrink center position CT11 in the Y-axis direction from the wiring WR12a.

In the example illustrated in FIG. 27, the end portion EP11 on the side closer to the area AW12 of the wiring WR11 is extended up to a portion where the end portion is connected to the area AW12 in the gap area AW14, and the extended end portion EP11 comes into contact with the end portion EP12 on the side closer to the area AW11 of the wiring WR12. In addition, the end portion EP11 of the extended portion corresponds to the connection wiring CW1. At this point, a portion on the side opposed to the shrink center position CT11 in the Y axis direction in the end portion EP11 on the side closer to the area AW12 of the wiring WR11a comes into contact with a portion on the side closer to the shrink center position CT11 in the Y axis direction in the end portion EP12 on the side closer to the area AW11 of the wiring WR12a when seen in a plan view.

In the example illustrated in FIG. 28, the end portion EP12 on the side closer to the area AW11 of the wiring WR12 is extended up to the portion where the end portion is connected to the area AW11 in the gap area AW14, and the extended end portion EP12 comes into contact with the end portion EP11 on the side closer to the area AW12 of the wiring WR11. In addition, the end portion EP12 of the extended portion corresponds to the connection wiring CW1. Even at this point, a portion on the side opposed to the shrink center position CT11 in the Y axis direction in the end portion EP11 on the side closer to the area AW12 of the wiring WR11a comes into contact with the portion on the side closer to the shrink center position CT11 in the Y axis direction in the end portion EP12 on the side closer to the area AW11 of the wiring WR12a when seen in a plan view.

In the example illustrated in FIG. 29, the end portion EP11 on the side closer to the area AW12 of the wiring WR11 is extended up to the center portion of the gap area AW14, the end portion EP12 on the side closer to the area AW11 of the wiring WR12 is extended up to the center portion in the gap area AW14, and the extended end portion EP11 comes into contact with the extended end portion EP12. At this point, the connection wiring CW1 is formed by the end portion EP11 of the extended portion and the end portion EP12 of the extended portion. In addition, the portion on the side opposed to the shrink center position CT11 in the Y axis direction in the end portion EP11 on the side closer to the area AW12 of the wiring WR11a comes into contact with the portion on the side closer to the shrink center position CT11 in the Y axis direction in the end portion EP12 on the side closer to the area AW11 of the wiring WR12a when seen in a plan view.

Further, as illustrated in FIG. 30, the extended end portion EP11 may be overlapped with the extended end portion EP12 in the X-axis direction.

In the first modification example, the space width SP1 is set to a space width in the Y axis direction between the end portion EP11 of the wiring WR11a and the end portion EP12 of the wiring WR12 which is disposed on the side closer to shrink center position CT11 in the Y axis direction of the wiring WR11a and connected to the wiring WR11 adjacent to the wiring WR11a. At this point, the space width SP1 is set to be equal to or more than a minimum space width in consideration of the mask size effect or the OPC process in the wiring layer ML1 of the first layer.

In the first modification example, the same effect as the first embodiment is achieved. In addition, since the pattern as the connection wiring CW1 is disposed by simply extending at least one of the wirings WR11 and WR12, the pattern as the connection wiring CW1 can be simply created compared to the first embodiment.

Figure 31:
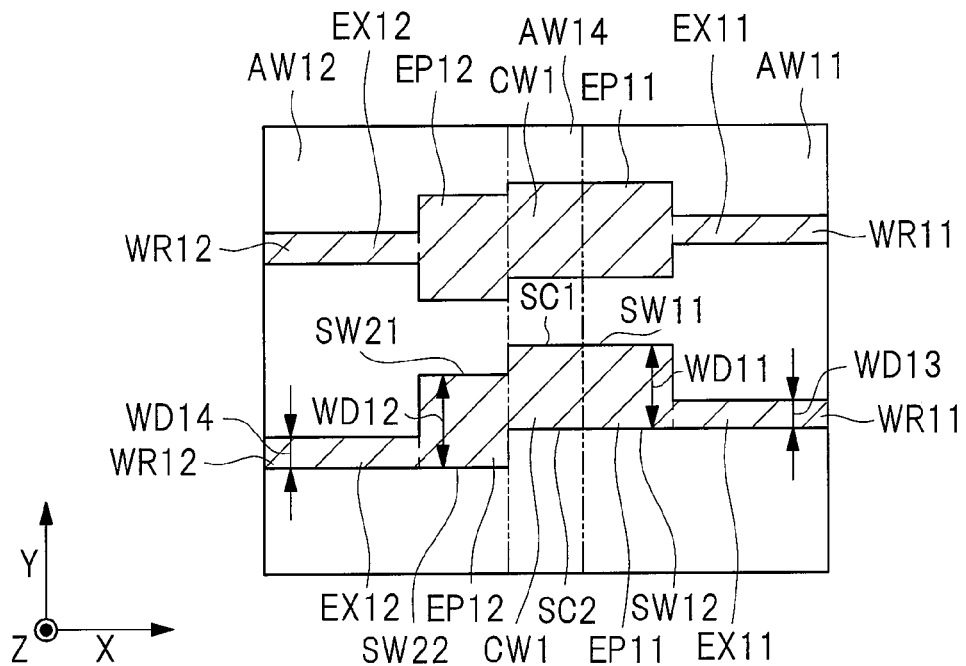
FIG. 31 is a plan view illustrating still another example of the wiring layout of the wiring layer of the first layer in the first modification example of the first embodiment.

Similarly to the first embodiment, even in the first modification example, each of the wirings WR11 and WR12 may be formed in the rectangular shape when seen in a plan view. Such an example is illustrated in FIG. 31. FIG. 31 is a plan view illustrating still another example of the wiring layout of the wiring layer of the first layer in the first modification example of the first embodiment.

As illustrated in FIG. 31, the wiring WR11 includes the end portion EP11 on the side closer to the area AW12 and the extending portion EX11 which is connected to the end portion EP11 and extended in the X axis direction, and the width WD11 in the Y axis direction of the end portion EP11 may be equal to or more than the width WD13 in the Y axis direction of the extending portion EX11. In addition, the wiring WR12 includes the end portion EP12 on the side closer to the area AW11 and the extending portion EX12 which is connected to the end portion EP12 and extended in the X axis direction, and the width WD12 in the Y axis direction of the end portion EP12 may be equal to or more than the width WD14 in the Y axis direction of the extending portion EX12.

Even in the case illustrated in FIG. 31, the end portions EP11 and EP12 can be connected by extending at least one of the end portions EP11 and EP12. Therefore, the same effect as the case illustrated in FIGS. 27 to 30 is achieved.

<Second Modification Example of Wiring Layout and Design Method>

Next, a second modification example of the wiring layout in the wiring layer and the design method will be described.

Figure 32:
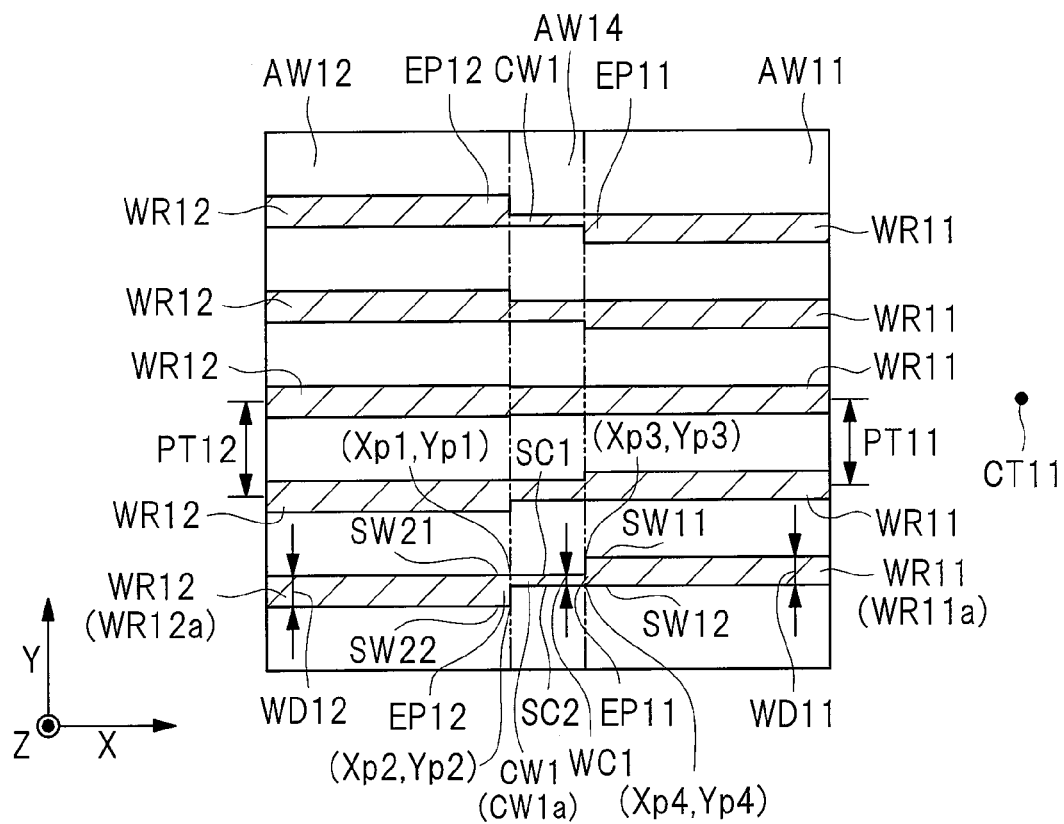
FIG. 32 is a plan view illustrating the wiring layout of the wiring layer of the first layer in a second modification example of the first embodiment.

FIG. 32 is a plan view illustrating the wiring layout of the wiring layer of the first layer in the second modification example of the first embodiment.

As illustrated in FIG. 32, even in the second modification example, the connection wiring CW1a in the plurality of connection wirings CW1 is connected to the wiring WR11a in the plurality of wirings WR11, and connected to the wiring WR12a in the plurality of wirings WR12. In addition, the wiring WR11a is shifted toward the shrink center position CT11 in the Y-axis direction from the wiring WR12a.

In the second modification example, the width WC1 in the Y axis direction of the connection wiring CW1a is narrower than the width in the Y axis direction of the wiring WR11a and the width in the Y axis direction of the wiring WR12a.

Further, in a case where the width WD11 in the Y axis direction of each wiring WR11 is equal, the width WD12 in the Y axis direction of each wiring WR12 is equal, and the width WD11 is narrower than the width WD12, the width WC1 in the Y axis direction of each connection wiring CW1 is equal to or less than the width WD11.

In the example illustrated in FIG. 32, the side surface SW12 on the side opposed to the shrink center position CT11 in the Y axis direction of the end portion EP11 of the wiring WR11 is disposed on the side opposed to the shrink center position CT11 in the Y axis direction from the side surface SW21 on the side closer to the shrink center position CT11 in the Y axis direction of the end portion EP12 of the wiring WR12 when seen in a plan view. In addition, the side surface SC1 on the side closer to the shrink center position CT11 in the Y axis direction of the connection wiring CW1a and the side surface SW21 of the end portion EP12 are formed in the same surface, and the side surface SC2 on the side opposed to the shrink center position CT11 in the Y axis direction of the connection wiring CW1a and the side surface SW12 of the end portion EP11 are formed in the same surface.

In the example illustrated in FIG. 32, the wiring WR11a is the wiring WR11 which is disposed on the negative side in the Y-axis direction from the shrink center position CT11. The coordinates of the corner formed by the side surface on the positive side in the X axis direction of the end portion EP12 of the wiring WR12a and the side surface SW21 on the positive side in the Y axis direction of the end portion EP12 of the wiring WR12a are set to (Xp1, Yp1). The coordinates of the corner formed by the side surface on the positive side in the X axis direction of the end portion EP12 of the wiring WR12a and the side surface SW22 on the negative side in the Y axis direction of the end portion EP12 of the wiring WR12a are set to (Xp2, Yp2). The coordinates of the corner formed by the side surface on the negative side in the X axis direction of the end portion EP11 of the wiring WR11a and the side surface SW11 on the positive side in the Y axis direction of the end portion EP11 of the wiring WR11a are set to (Xp3, Yp3). The coordinates of the corner formed by the side surface on the negative side in the X axis direction of the end portion EP11 of the wiring WR11a and the side surface SW12 on the negative side in the Y axis direction of the end portion EP11 of the wiring WR11a are set to (Xp4, Yp4).

Here, a minimum line width in consideration of the mask size effect or the OPC process of the wiring layer ML1 of the first layer is set to the width W00, and the shrink rate as the shrink magnification of the shrink process in the wiring layer ML1 of the first layer is set to α. At this point, the wiring WR11 is disposed such that the width WD11 of the wiring WR11 is equal to or more than the width W1 defined in Equation (1).

In the second modification example, when the gap partial mask data DAT14 is created, the rectangular shape is generated such that the left upper coordinates of the connection wiring CW1 become (Xp1, Yp1) and the right lower coordinates become (Xp4, Yp4). Here, Yp1 and Yp4 are expressed by the following Equations (2) and (3).

$$Yp1 = Yp2 + W1 \qquad (2)$$
$$= Yp2 + W00 + (1 - \alpha) \times |Yp2|$$
$$Yp4 = \alpha \times Yp2 \qquad (3)$$

In addition, in a case where a minimum value of the width WC1 of the connection wiring CW1 is set to a width YW, the width YW is expressed by the following Equation (4).

$$YW = Yp1 - Yp4 \qquad (4)$$
$$= Yp2 + W00 + (1 - \alpha) \times |Yp2| - \alpha Yp2$$
$$= W00 + Yp2 + |Yp2| - \alpha |Yp2| - \alpha Yp2$$

Here, since Yp2 is a negative value, Yp2 and |Yp2| are in reverse polarity to each other. Therefore, Yp2+|Yp2| and α|Yp2|−αYp2 each are canceled, and finally the width YW becomes equal to the width W00.

Similarly to the first embodiment, even in the second modification example, the calculation of creating the pattern as the connection wiring CW1 can be simplified, and the same effect as the first embodiment is achieved.

Further, similarly to a third modification example of a second embodiment below, a maximum value W1max of the width W1 in the entire cut-out area AW13 may be determined in consideration of a maximum value of the protruding distance of the end portion EP11 shifted in the Y axis direction from the end portion EP12. Then, the width WD11 of the end portion EP11 of the wiring WR11 disposed in the cut-out area AW13 may be set to be equal to or more than the maximum value W1max of the determined width W1. Even in this case, the same effect as the second modification example is achieved.

Figure 33:
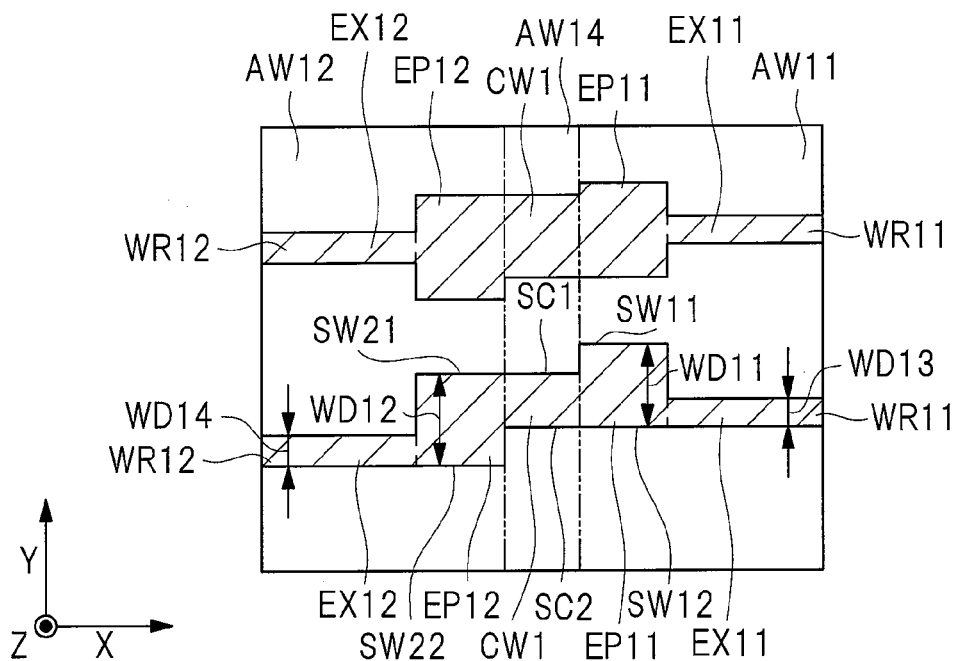
FIG. 33 is a plan view illustrating another example of the wiring layout of the wiring layer of the first layer in the second modification example of the first embodiment.

In addition, similarly to the first embodiment, even in the second modification example, each of the wirings WR11 and WR12 may be not formed in the rectangular shape when seen in a plan view. Such an example is illustrated in FIG. 33. FIG. 33 is a plan view illustrating another example of the wiring layout of the wiring layer of the first layer in the second modification example of the first embodiment.

As illustrated in FIG. 33, the wiring WR11 includes the end portion EP11 on the side closer to the area AW12 and the extending portion EX11 which is connected to the end portion EP11 and extended in the X-axis direction. The width WD11 in the Y-axis direction of the end portion EP11 may be equal to or more than the width WD13 in the Y-axis direction of the extending portion EX11. In addition, the wiring WR12 includes the end portion EP12 on the side closer to the area AW11 and the extending portion EX12 which is connected to the end portion EP12 and extended in the X-axis direction. The width WD12 in the Y-axis direction of the end portion EP12 may be equal to or more than the width WD14 in the Y-axis direction of the extending portion EX12.

Similarly to the case illustrated in FIG. 32, even in the case illustrated in FIG. 33, the pattern as the connection wiring CW1 of the rectangular shape can be easily created for the end portion EP11, the end portion EP12, and the connection wiring CW1 by the same design method as that described using FIGS. 11 to 16. Further, the same effect as the case illustrated in FIG. 32 is achieved.

<Third Modification Example of Wiring Layout and Design Method>

Next, a third modification example of the wiring layout and the design method in the wiring layer will be described.

Figure 34:
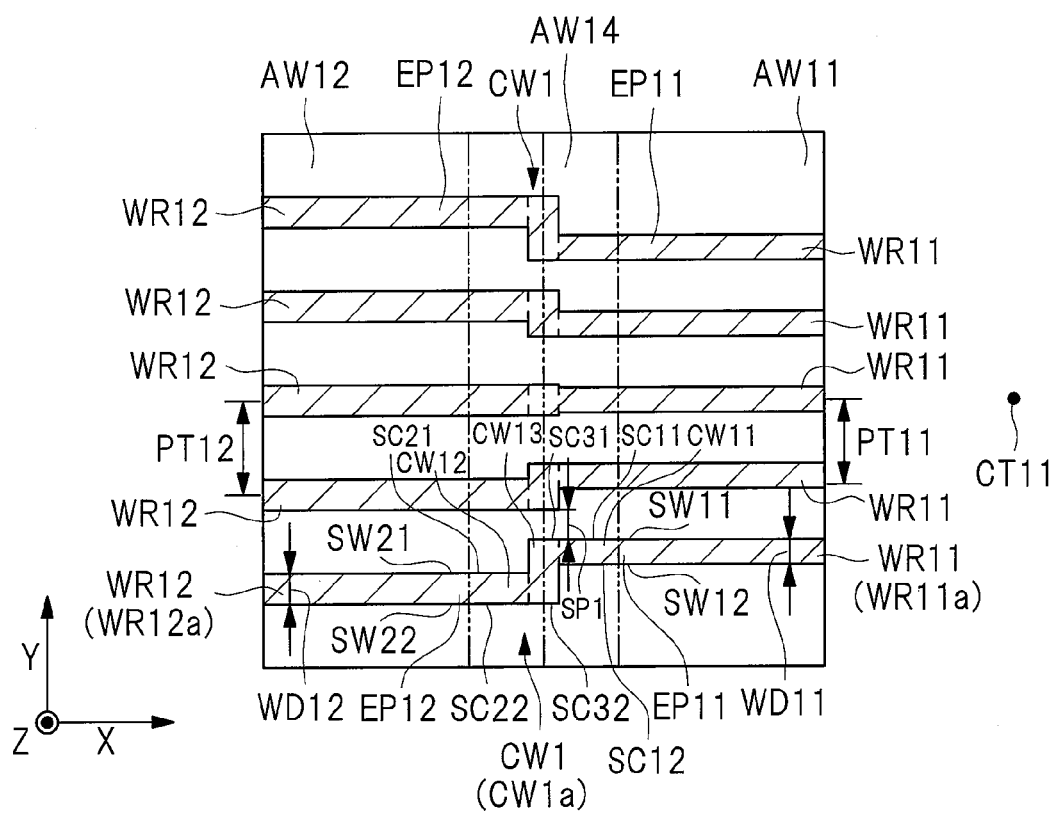
FIG. 34 is a plan view illustrating the wiring layout of the wiring layer of the first layer in a third modification example of the first embodiment.
Figure 35:
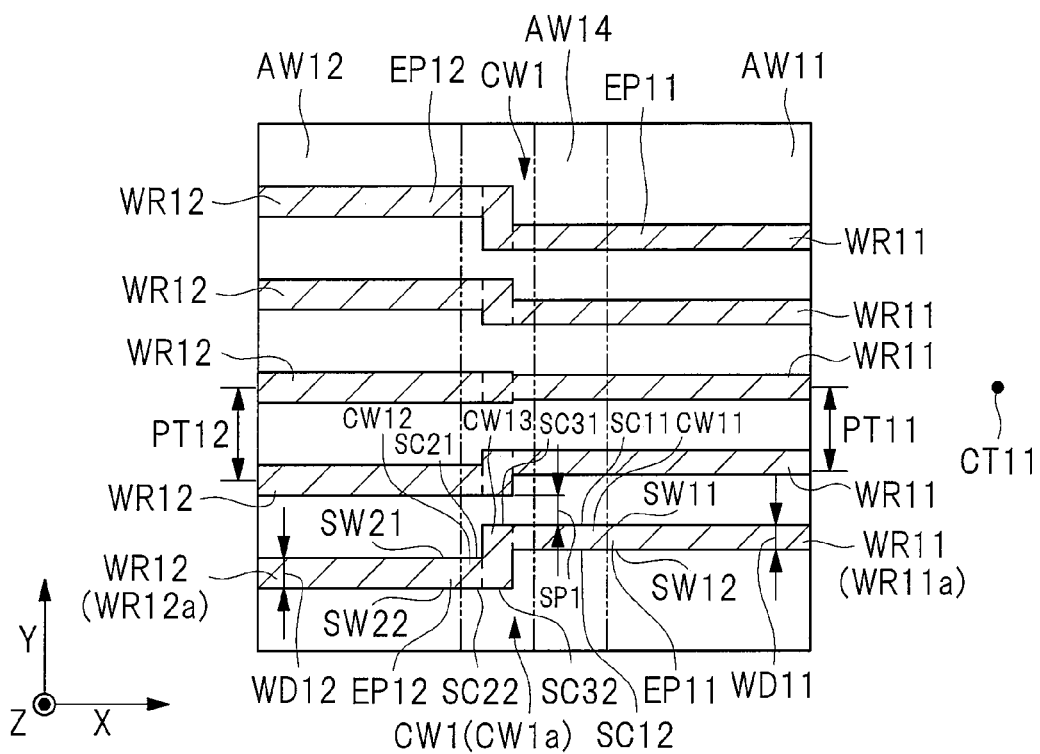
FIG. 35 is a plan view illustrating another example of the wiring layout of the wiring layer of the first layer in the third modification example of the first embodiment.
Figure 36:
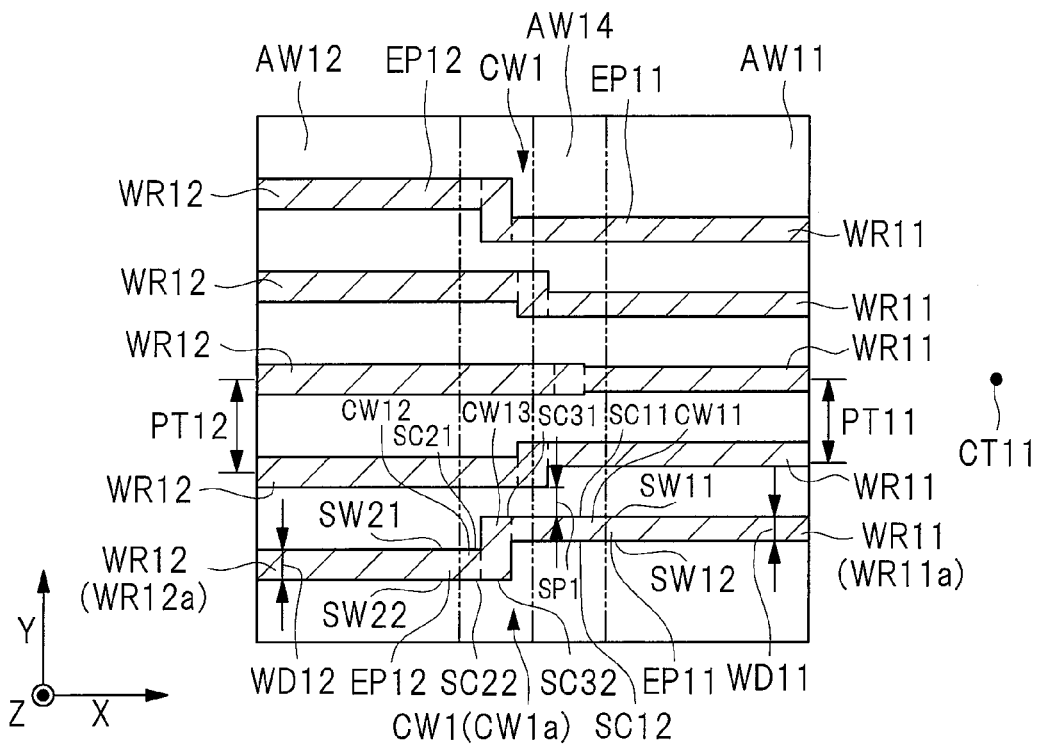
FIG. 36 is a plan view illustrating another example of the wiring layout of the wiring layer of the first layer in the third modification example of the first embodiment.

FIG. 34 is a plan view illustrating the wiring layout of the wiring layer of the first layer in a third modification example of the first embodiment. FIGS. 35 and 36 are plan views illustrating other examples of the wiring layout of the wiring layer of the first layer in the third modification example of the first embodiment.

In the third modification example, the connection wiring CW1 includes an extending portion CW11, an extending portion CW12, and a connection portion CW13. The extending portion CW11 is formed to be continuous to the end portion EP11 on the side closer to the area AW12 of the wiring WR11, and extended in the X-axis direction. The extending portion CW12 is formed to be continuous to the end portion EP12 on the side closer to the area AW11 of the wiring WR12, and extended in the X-axis direction. The connection portion CW13 is extended in the Y-axis direction, and connected to each of the extending portion CW11 and the extending portion CW12.

The connection wiring CW1a in the plurality of connection wirings CW1 is connected to the wiring WR11a in the plurality of wirings WR11, and connected to the wiring WR12a in the plurality of wirings WR12. In addition, the wiring WR11a is disposed to be separated from the wiring WR12a toward the shrink center position CT11 in the Y-axis direction.

A side surface SC11 on the side closer to the shrink center position CT11 in the Y axis direction of the extending portion CW11 of the connection wiring CW1a and the side surface SW11 on the side closer to the shrink center position CT11 in the Y axis direction of the end portion EP11 of the wiring WR11a are formed in the same surface. In addition, a side surface SC12 on the side opposed to the shrink center position CT11 in the Y axis direction of the extending portion CW11 of the connection wiring CW1a and the side surface SW12 on the side opposed to the shrink center position CT11 in the Y axis direction of the end portion EP11 of the wiring WR11a are formed in the same surface.

A side surface SC21 on the side closer to the shrink center position CT11 in the Y axis direction of the extending portion CW12 of the connection wiring CW1a and the side surface SW21 on the side closer to the shrink center position CT11 in the Y axis direction of the end portion EP12 of the wiring WR12a are formed in the same surface. In addition, a side surface SC22 on the side opposed to the shrink center position CT11 in the Y axis direction of the extending portion CW12 of the connection wiring CW1a and the side surface SW22 on the side opposed to the shrink center position CT11 in the Y axis direction of the end portion EP12 of the wiring WR12a are formed in the same surface.

A side surface SC31 on the side closer to the shrink center position CT11 in the Y-axis direction of the connection portion CW13 of the connection wiring CW1a and the side surface SC11 of the extending portion CW11 of the connection wiring CW1a are formed in the same surface. In addition, a side surface SC32 on the side opposed to the shrink center position CT11 in the Y-axis direction of the connection portion CW13 of the connection wiring CW1a and the side surface SC22 of the extending portion CW12 of the connection wiring CW1a are formed in the same surface.

However, as described above, the wiring WR11a is disposed to be separated from the wiring WR12a toward the shrink center position CT11 in the Y-axis direction. Therefore, the side surface SW12 on the side opposed to the shrink center position CT11 in the Y axis direction of the end portion EP11 of the wiring WR11a is disposed on the side closer to the shrink center position CT11 in the Y axis direction from the side surface SW21 on the side closer to the shrink center position CT11 in the Y axis direction of the end portion EP12 of the wiring WR12a. In addition, the side surface SC12 of the extending portion CW11 of the connection wiring CW1a is disposed on the side closer to the shrink center position CT11 in the Y-axis direction from the side surface SC21 of the extending portion CW12 of the connection wiring CW1a.

Here, when a minimum line width in consideration of the mask size effect or the OPC process of the wiring layer ML1 of the first layer is set to the width W00, the width in the X-axis direction of the connection portion CW13 can be set to the width W00. At this point, the pattern as the extending portion CW11 is created by extending the wiring WR11 up to the gap area AW14, and the pattern as the extending portion CW12 is created by extending the wiring WR12 up to the gap area AW14. In addition, the pattern as the connection portion CW13 for connecting the extending portion CW11 and the extending portion CW12 can be created by the same calculation as the first embodiment.

Similarly to the first embodiment, even in the second modification example, the space width SP1 between two adjacent connection wirings CW1 in the Y axis direction is made to be equal to or more than a minimum space width in consideration of the mask size effect or the OPC process in the wiring layer ML1 of the first layer.

In the third modification example, in addition to the same effect as the first embodiment, since the pattern as the connection wiring CW1 is disposed simply by extending at least one of the wirings WR11 and WR12, the pattern as the connection wiring CW1 can be simply created compared to the first embodiment.

Further, as illustrated in FIG. 35, a position in the X-axis direction of the connection portion CW13 may be not set to the center position in the X-axis direction between the area AW11 and the area AW12. Even in such a case, the same effect as the example illustrated in FIG. 34 is achieved.

Alternatively, as illustrated in FIG. 36, the position in the X-axis direction of the connection portion CW13 may be differently set in the plurality of connection wirings CW1. In such a case, in addition to the same effect as the example illustrated in FIG. 34, the space between two adjacent connection wirings CW1 is narrowed on both sides in the Y axis direction by differently setting the position in the X axis direction of the connection portion CW13 between the subject two connection wirings CW1 in the Y axis direction, and disappears depending on the connection portion CW13.

Therefore, it is possible to improve the exposure margin indicating the ratio of the wiring width with respect to the processing accuracy in exposure.

<Fourth Modification Example of Wiring Layout and Design Method>

Next, a fourth modification example of the wiring layout and the design method in the wiring layer will be described.

Figure 37:
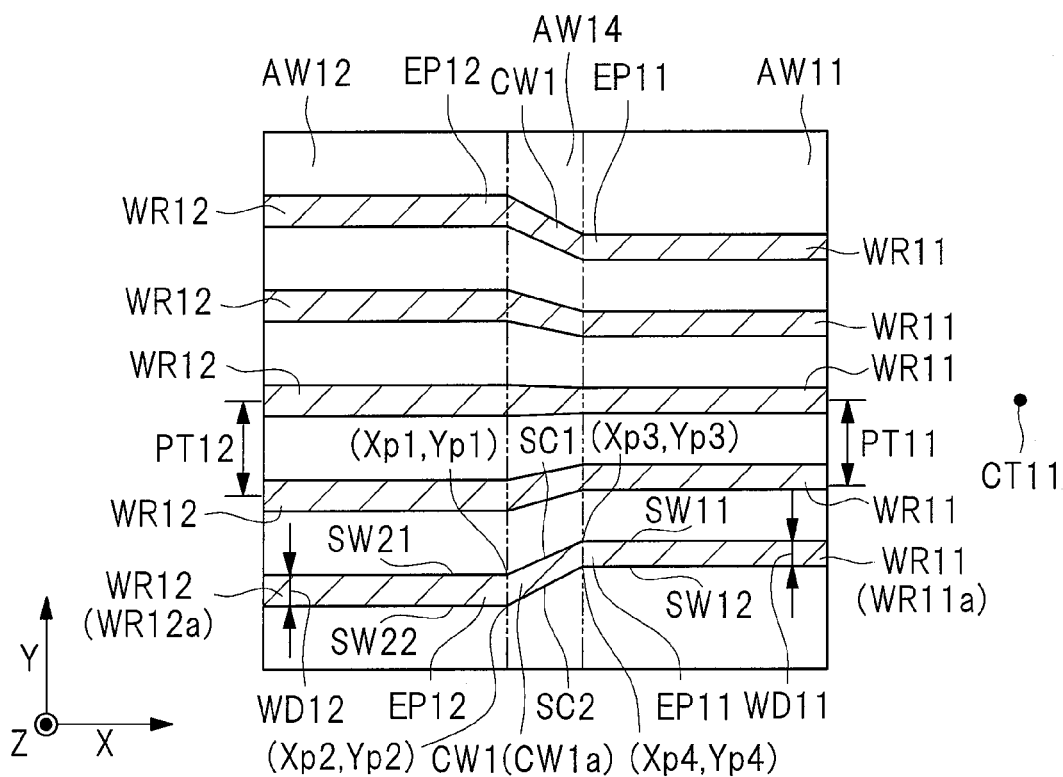
FIG. 37 is a plan view illustrating the wiring layout of the wiring layer of the first layer in a fourth modification example of the first embodiment.
Figure 38:
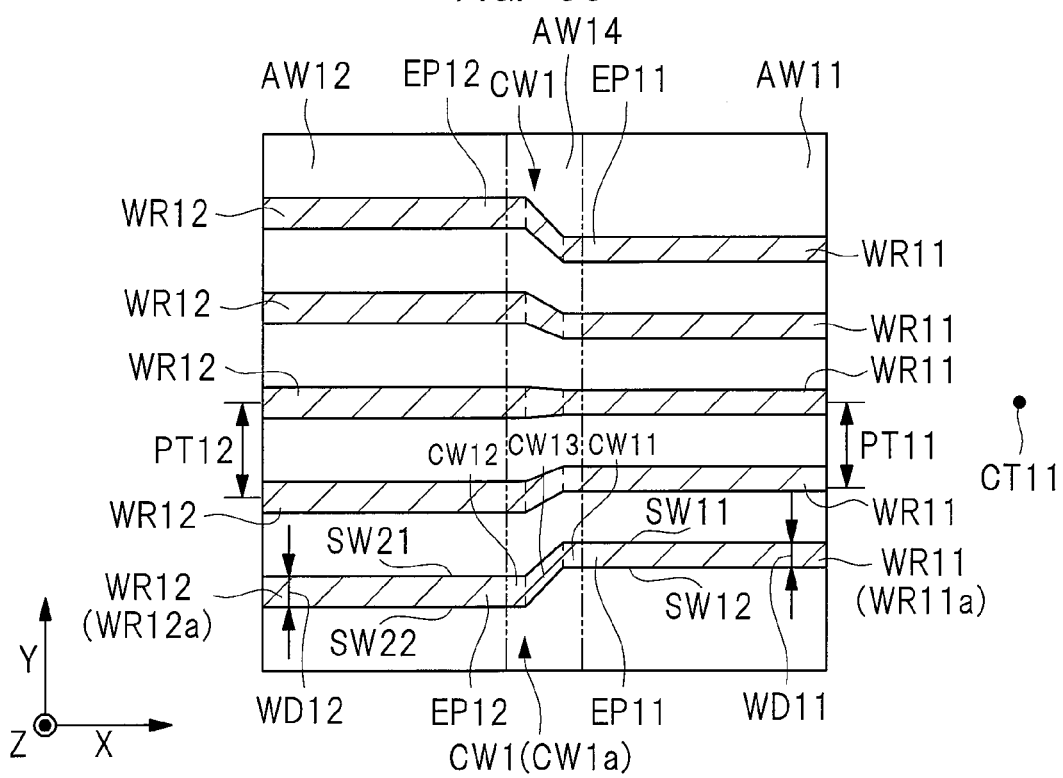
FIG. 38 is a plan view illustrating another example of the wiring layout of the wiring layer of the first layer in the fourth modification example of the first embodiment.

FIG. 37 is a plan view illustrating the wiring layout of the wiring layer of the first layer in the fourth modification example of the first embodiment. FIG. 38 is a plan view illustrating another example of the wiring layout of the wiring layer of the first layer in the fourth modification example of the first embodiment.

In the fourth modification example, the connection wiring CW1 for connecting the end portion EP11 on the side closer to the area AW12 of the wiring WR11 and the end portion EP12 on the side closer to the area AW11 of the wiring WR12 are extended in a straight line, for example, in a direction inclined from the X-axis direction. Then, in a set of the wiring WR11, the connection wiring CW1, and the wiring WR12 connected to each other, the side surface SC1 on the positive side in the Y axis direction of the connection wiring CW1 is continuously connected to both of the side surface SW11 on the positive side in the Y axis direction of the wiring WR11 and the side surface SW21 on the positive side in the Y axis direction of the wiring WR12. In addition, in the set of the wiring WR11, the connection wiring CW1, and the wiring WR12 connected to each other, the side surface SC2 on the negative side in the Y axis direction of the connection wiring CW1 is continuously connected to both of the side surface SW12 on the negative side in the Y axis direction of the wiring WR11 and the side surface SW22 on the negative side in the Y axis direction of the wiring WR12.

In the example illustrated in FIG. 37, the coordinates of the corner formed by the side surface on the positive side in the X axis direction of the end portion EP12 of the wiring WR12 and the side surface SW21 on the positive side in the Y axis direction of the end portion EP12 of the wiring WR12 are set to (Xp1, Yp1). In addition, the coordinates of the corner formed by the side surface on the positive side in the X axis direction of the end portion EP12 of the wiring WR12 and the side surface SW22 on the negative side in the Y axis direction of the end portion EP12 of the wiring WR12 are set to (Xp2, Yp2). On the other hand, the coordinates of the corner formed by the side surface on the negative side in the X axis direction of the end portion EP11 of the wiring WR11 and the side surface SW11 on the positive side in the Y axis direction of the end portion EP11 of the wiring WR11 are set to (Xp3, Yp3). In addition, the coordinates of the corner formed by the side surface on the negative side in the X axis direction of the end portion EP11 of the wiring WR11 and the side surface SW12 on the negative side in the Y axis direction of the end portion EP11 of the wiring WR11 are set to (Xp4, Yp4).

In the fourth modification example, when the gap partial mask data is created, the pattern as the connection wiring CW1 is generated through the pattern calculation using a quadrilateral having apexes of four points indicated by the coordinates (Xp1, Yp1), (Xp2, Yp2), (Xp3, Yp3), and (Xp4, Yp4). Therefore, in the fourth modification example, even though the coordinates of four points are used, the calculation for creating the pattern as the connection wiring CW1 can be simply performed unlike the first embodiment, so that the same effect as the first embodiment is achieved.

As illustrated in FIG. 38, the connection wiring CW1 may include the extending portion CW11, the extending portion CW12, and the connection portion CW13. The extending portion CW11 is formed to be continuous to the end portion EP11 on the side closer to the area AW12 of the wiring WR11, and extended in the X-axis direction. The extending portion CW12 is formed to be continuous to the end portion EP12 on the side closer to the area AW11 of the wiring WR12, and extended in the X-axis direction. The connection portion CW13 for connecting the end portion on the side closer to the area AW12 of the extending portion CW11 and the end portion on the side closer to the area AW11 of the extending portion CW12 is extended in a straight line, for example, in a direction inclined from the X-axis direction.

At this point, the pattern as the extending portion CW11 is formed by extending the wiring WR11 up to the gap area AW14, and the pattern as the extending portion CW12 is formed by extending the wiring WR12 up to the gap area AW14. In addition, the pattern as the connection portion CW13 can be created by the same calculation as the example illustrated in FIG. 37. Therefore, the same effect as the example illustrated in FIG. 37 is achieved in that the quadrilateral pattern having four apexes is created as the connection portion CW13.

In addition, the example illustrated in FIG. 38 has the same configuration as the example illustrated FIG. 34 in the third modification example of the first embodiment except that the connection portion CW13 is parallel to or inclined from the Y axis, so that the similar effect is achieved even in the example illustrated in FIG. 34.

Second Embodiment

In the first embodiment, as illustrated in FIG. 5, the wiring WR11 disposed in the area AW11 subjected to the shrink process is connected to the wiring WR12 disposed in the same layer in the area AW12 other than the area AW11 subjected to the shrink process through the connection wiring CW1 formed in the same layer as that of the wiring WR11. On the other hand, in a second embodiment, as described below using FIG. 40, the wiring WR21 disposed in an area AW21 subjected to the shrink process is connected to a wiring WR22 disposed in the same layer in an area AW22 other than the area AW21 subjected to the shrink process through the connection wiring CW1 formed in the layer different from the wiring WR21.

A configuration of a semiconductor device of the second embodiment is the same as that of the semiconductor device of the first embodiment described using FIGS. 1 to 3, and the description will not be repeated. In addition, a manufacturing method of the semiconductor device of the second embodiment is the same as that of the semiconductor device of the first embodiment described using FIGS. 18 to 24, and the description will not be repeated.

<Wiring Layout>

Next, the wiring layout in the wiring layer will be described. In the following, the description will be made about an example of the wiring layout in the wiring layer ML2 of the second layer, but the wiring layout in the wiring layer (for example, the first layer) other than the second layer can be applied in the same way.

Figure 39:
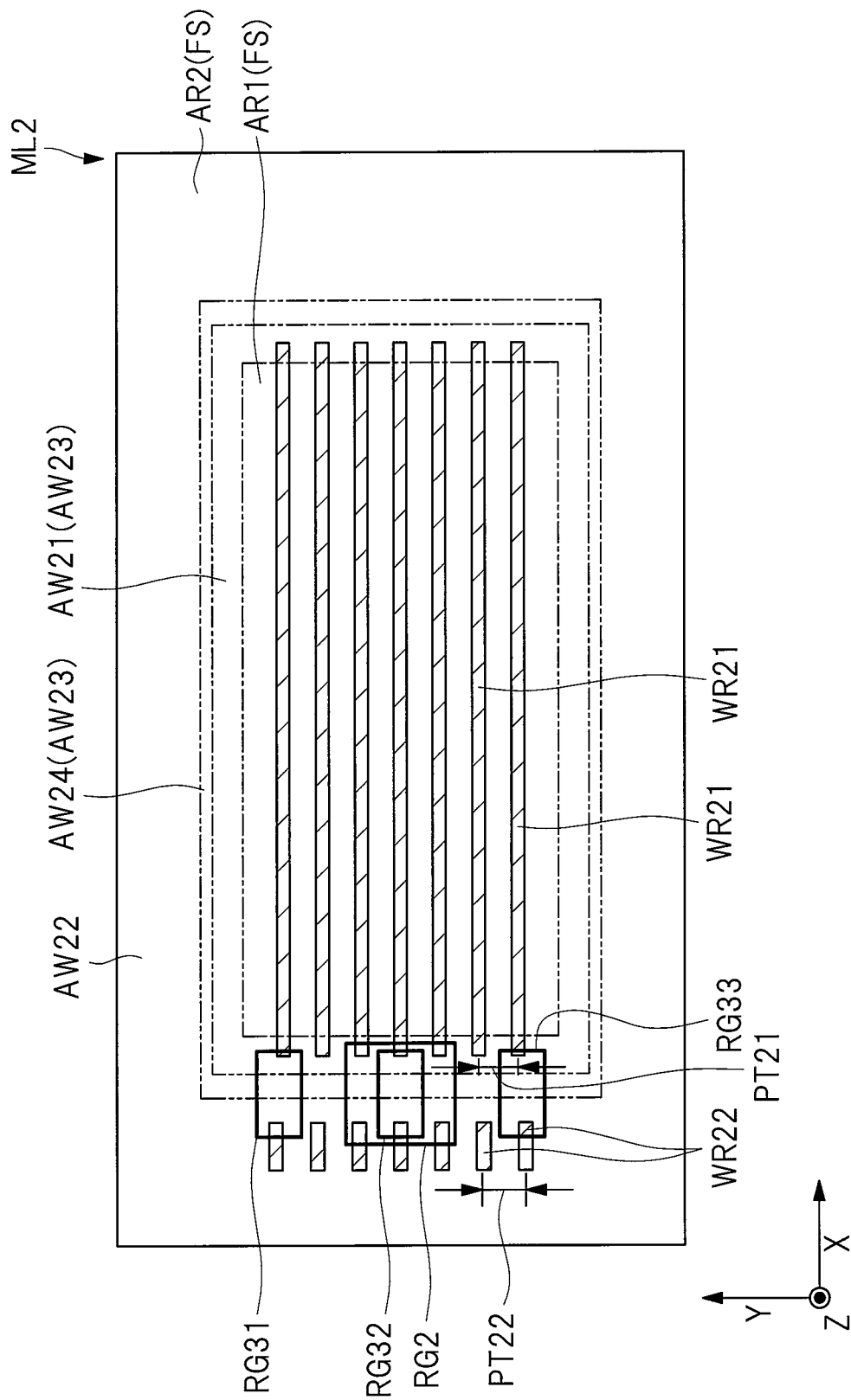
FIG. 39 is a plan view illustrating a wiring layout of a wiring layer of a second layer in a second embodiment.
Figure 40:
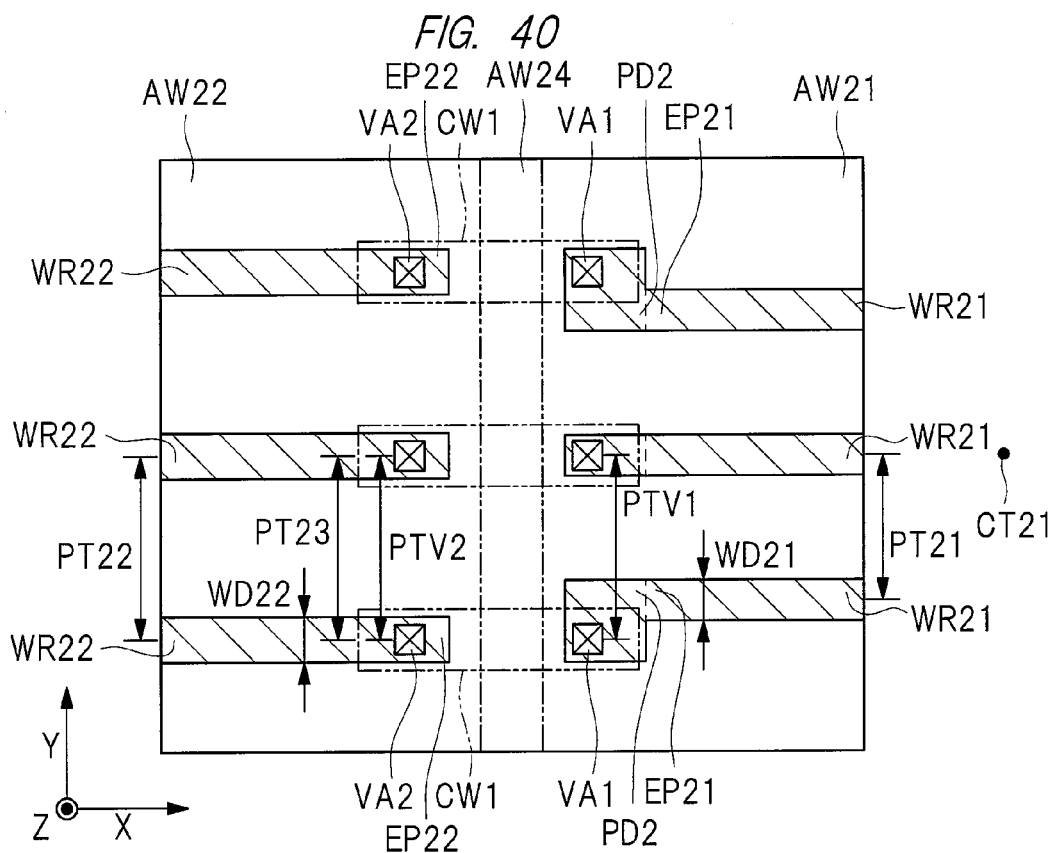
FIG. 40 is a plan view illustrating the wiring layout of the wiring layer of the second layer in the second embodiment.

FIGS. 39 and 40 are plan views illustrating the wiring layout of the wiring layer of the second layer in the second embodiment. FIG. 40 is an enlarged plan view of a region RG2 of FIG. 39.

As illustrated in FIGS. 39 and 40, the wiring layer ML2 of the second layer includes the plurality of wirings WR21 and the plurality of wirings WR22. The plurality of wirings WR21 are formed in the same layer in the wiring layer ML2 of the second layer in the area AW21 of the upper surface as the main surface of the semiconductor substrate SB (see FIG. 3). The plurality of wirings WR22 are formed in the same layer as that of the plurality of wirings WR21 in the area AW22 of the upper surface as the main surface of the semiconductor substrate SB (see FIG. 3). The area AW22 is an area on one side of the area AW21 in the X-axis direction when seen in a plan view. In addition, while not illustrated in FIG. 39, the plurality of pixels PU (see FIG. 1) are formed in the area AW21, and the peripheral circuit is formed in the area AW22.

The plurality of wirings WR21 are extended in the X-axis direction in the area AW21 and arranged at a pitch PT21 in the Y-axis direction when seen in a plan view. The plurality of wirings WR22 are extended in the X-axis direction in the area AW22 and arranged at a pitch PT22 in the Y-axis direction when seen in a plan view.

The wiring layer ML1 of the first layer (see FIG. 3) includes the plurality of connection wirings CW1 illustrated in FIG. 40. The plurality of wirings WR21 are connected to the plurality of wirings WR22 through the plurality of connection wirings CW1. Through such a layout, the plurality of wirings WR21 are electrically connected to the plurality of wirings WR22.

The plurality of wirings WR22 are connected to, for example, transistors included in the peripheral circuit. Therefore, the plurality of wirings WR21 are connected to the peripheral circuit through the plurality of wirings WR22.

As illustrated in FIGS. 39 and 40, the pitch PT21 is smaller than the pitch PT22. Through such a layout, an interval between two adjacent wirings WR21 in the area AW21 where the pixels PU (see FIG. 1) are formed can be made shorter than that between two adjacent wirings WR22 in the area AW22 where the peripheral circuit is formed.

As illustrated in FIG. 40, preferably, a width WD21 in the Y axis direction of an end portion EP21 on the side closer to the area AW22 of each wiring WR21 is narrower than a width WD22 in the Y axis direction of an end portion EP22 on the side closer to the area AW21 of the wiring WR22 connected to each subject wiring WR21 in the plurality of wirings WR22.

As illustrated below using FIGS. 41 to 45, a portion disposed in an area AW23 is cut out of mask data DAT2, the shrink process is performed on the cut-out portion with a position (a shrink center position) CT21 in the cut-out portion as the center, and then attached to the original mask data DAT2 again. Therefore, mask data DAT2a including the plurality of wirings WR21 and the plurality of wirings WR22 can be easily created.

In such a case, any wiring WR21 in the plurality of wirings WR21 is disposed to be shifted on the side closer to the shrink center position CT21 in the Y-axis direction from the wiring WR22 connected to the subject wiring WR21 in the plurality of wirings WR22 when seen in a plan view. In addition, in the plurality of wirings WR21, the wiring WR21 disposed at the end portion on the negative side in the Y axis direction of the array of the plurality of wirings WR21 is disposed to be shifted on the positive side in the Y axis direction from the wiring WR22 connected to the subject wiring WR21 in the plurality of wirings WR22 when seen in a plan view.

Further, in a case where the width WD21 of each wiring WR21 is equal and the width WD22 of each wiring WR22 is equal, the width WD21 of each wiring WR21 may be narrower than the width WD22 of each wiring WR22.

The plurality of connection wirings CW1 are formed in a layer different from the plurality of wirings WR21. In the second embodiment, as an example, the plurality of connection wirings CW1 are formed in the wiring layer ML1 of the first layer lower than the wiring layer ML2 of the second layer where the plurality of wirings WR21 are formed. The plurality of connection wirings CW1 are extended in the X-axis direction and arranged at a pitch PT23 in the Y-axis direction when seen in a plan view. For example, the pitch PT23 can be made equal to the pitch PT22.

A plurality of vias VA1 are formed as electrodes in the same layer between the plurality of wirings WR21 and the plurality of connection wirings CW1. A plurality of vias VA2 are formed as electrodes in the same layer between the plurality of wirings WR22 and the plurality of connection wirings CW1. The plurality of wirings WR21 are electrically connected to the plurality of connection wirings CW1 through the plurality of vias VA1. The plurality of wirings WR22 are electrically connected to the plurality of connection wirings CW1 through the plurality of vias VA2.

The plurality of vias VA1 are arranged at a pitch PTV1 in the Y-axis direction when seen in a plan view, and the plurality of vias VA2 are arranged at a pitch PTV2 in the Y-axis direction when seen in a plan view. Both pitches PTV1 and PTV2 can be made to be equal to the pitch PT22.

The wiring layer ML2 of the second layer includes a plurality of terminals PD2. The plurality of terminals PD2 are formed in the same layer as that of the plurality of wirings WR21 in the area AW21. Each terminal PD2 is connected to the end portion EP21 on the side closer to the area AW22 of wiring WR21.

Each terminal PD2 is overlapped with the connection wiring CW1 when seen in a plan view, and each via VA1 is included in each terminal PD2 of the portion overlapped with each connection wiring CW1 when seen in a plan view. Therefore, each terminal PD2 can be reliably electrically connected to each connection wiring CW1 through each via VA1.

In addition, the width in the Y axis direction of the terminal PD2 connected to the wiring WR21 disposed in the center portion of the array of the plurality of wirings WR21 in the plurality of terminals PD2 is narrower than the width in the Y axis direction of the terminal PD2 connected to the wiring WR21 disposed at the end portion of the array of the plurality of wirings WR21 in the plurality of terminals PD2.

<Design Method of Wiring Layout>

Next, the design method of the wiring layout in the wiring layer will be described in addition to the manufacturing method of the exposure mask. Further, since the wiring layout in the wiring layer ML2 of the second layer can be designed by the same design method as that of the wiring layout in the wiring layer ML1 of the first layer described in the first embodiment, the design method of the wiring layout in the second embodiment will be described focusing on a point different from the design method of the wiring layout in the first embodiment. In addition, the wiring layout in the wiring layer ML3 of the uppermost layer in the second embodiment can be designed by the same design method as that of the wiring layout in the wiring layer ML3 of the uppermost layer in the first embodiment. In addition, the exposure mask in the second embodiment can also be manufactured similarly to the exposure mask in the first embodiment.

FIGS. 41 to 45 are plan views illustrating wiring layout data of the wiring layer of the second layer in the second embodiment.

Figure 41:
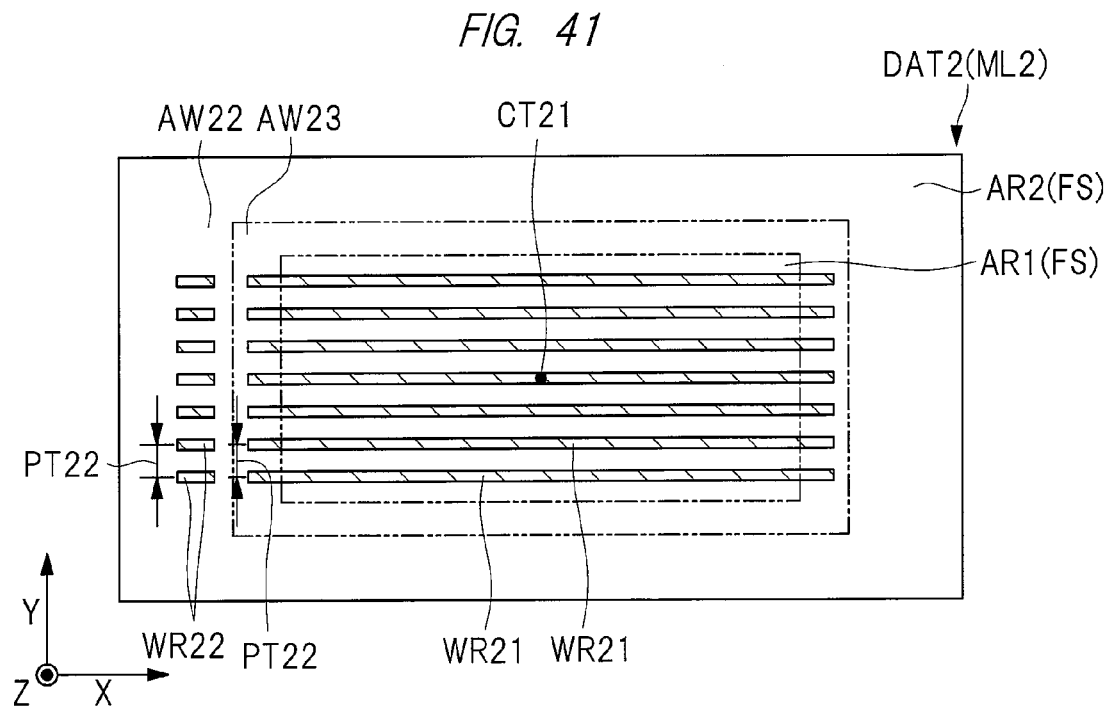
FIG. 41 is a plan view illustrating wiring layout data of the wiring layer of the second layer in the second embodiment.
Figure 42:
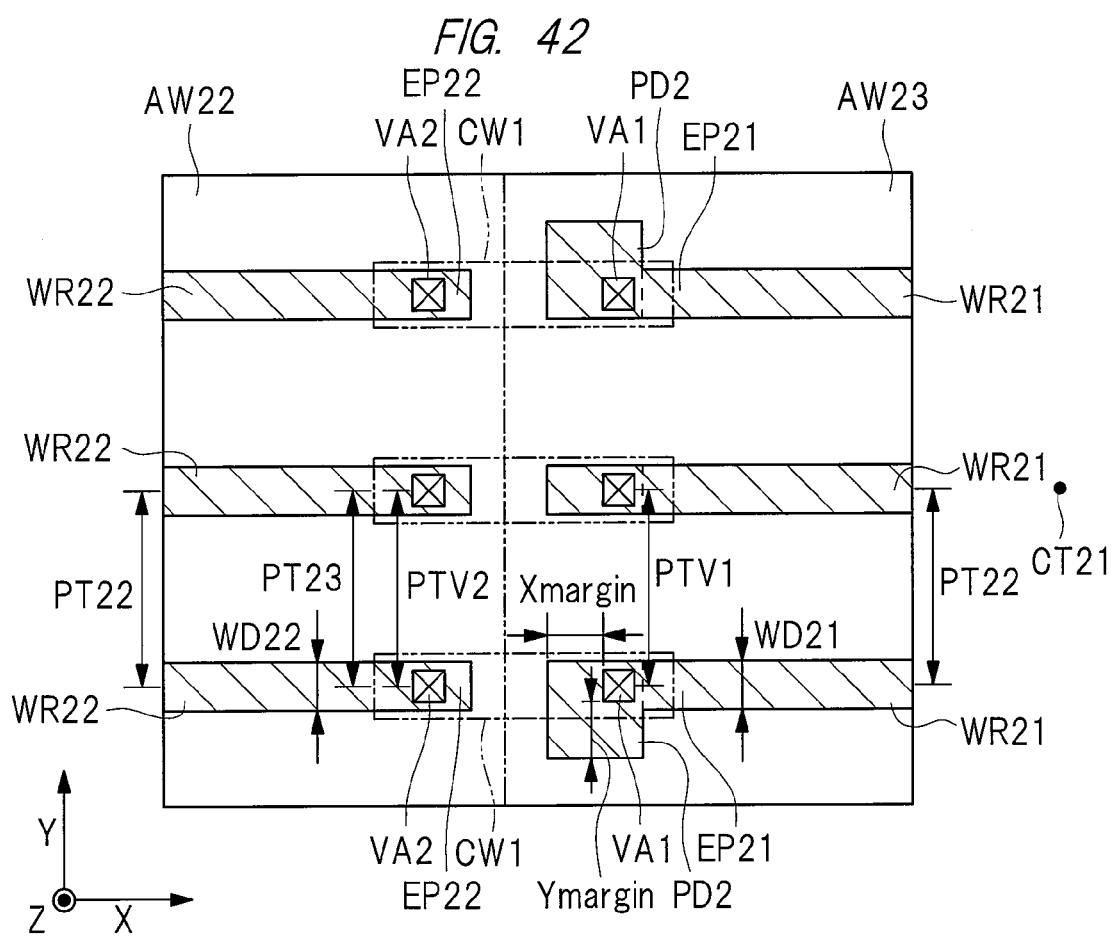
FIG. 42 is a plan view illustrating the wiring layout data of the wiring layer of the second layer in the second embodiment.

First, similarly to the first embodiment, after the chip layout data is created, the same step as Step S1 of FIG. 11 is performed to create the mask data as illustrated in FIGS. 41 and 42. In this step, the layout data in the wiring layer ML2 of the second layer is subjected to a correction process called as the OPC process, and the mask data DAT2 is prepared as the pattern data of the wiring layer ML2 of the second layer. The mask data DAT2 includes the area AR1 which is a partial area of the flat surface FS and the area AR2 which is a partial area of the flat surface FS. While not illustrated in FIG. 41, the plurality of pixels PU (see FIG. 6) are disposed in the area AW23 which is a partial area of the area AR1 as the pixel area. In addition, the area other than the area AW23 in the areas AR1 and AR2 is called the area AW22.

FIG. 41 illustrates the wiring layout before the wiring layout illustrated in the plan view of FIG. 39 is created by the shrink process, and FIG. 42 illustrates the wiring layout before the wiring layout illustrated in the plan view of FIG. 40 is created by the shrink process.

As illustrated in FIGS. 41 and 42, the plurality of wirings (wiring pattern) WR21 are disposed in the area AR1 in the mask data DAT2. The plurality of wirings WR21 are extended in the X-axis direction and arranged at the pitch PT22 in the Y-axis direction. In addition, the plurality of wirings (wiring pattern) WR22 are disposed in the area AR2. The plurality of wirings WR22 are extended in the X-axis direction and arranged at the pitch PT22 in the Y-axis direction. In other words, the mask data DAT2 includes the plurality of wirings (wiring pattern) WR21 which are extended in the X axis direction in the area AW23 and arranged at the pitch PT22 in the Y direction, and the plurality of wirings (wiring pattern) WR22 which are extended in the X axis direction in the area AW22 and arranged at the pitch PT22 in the Y axis direction.

Figure 43:
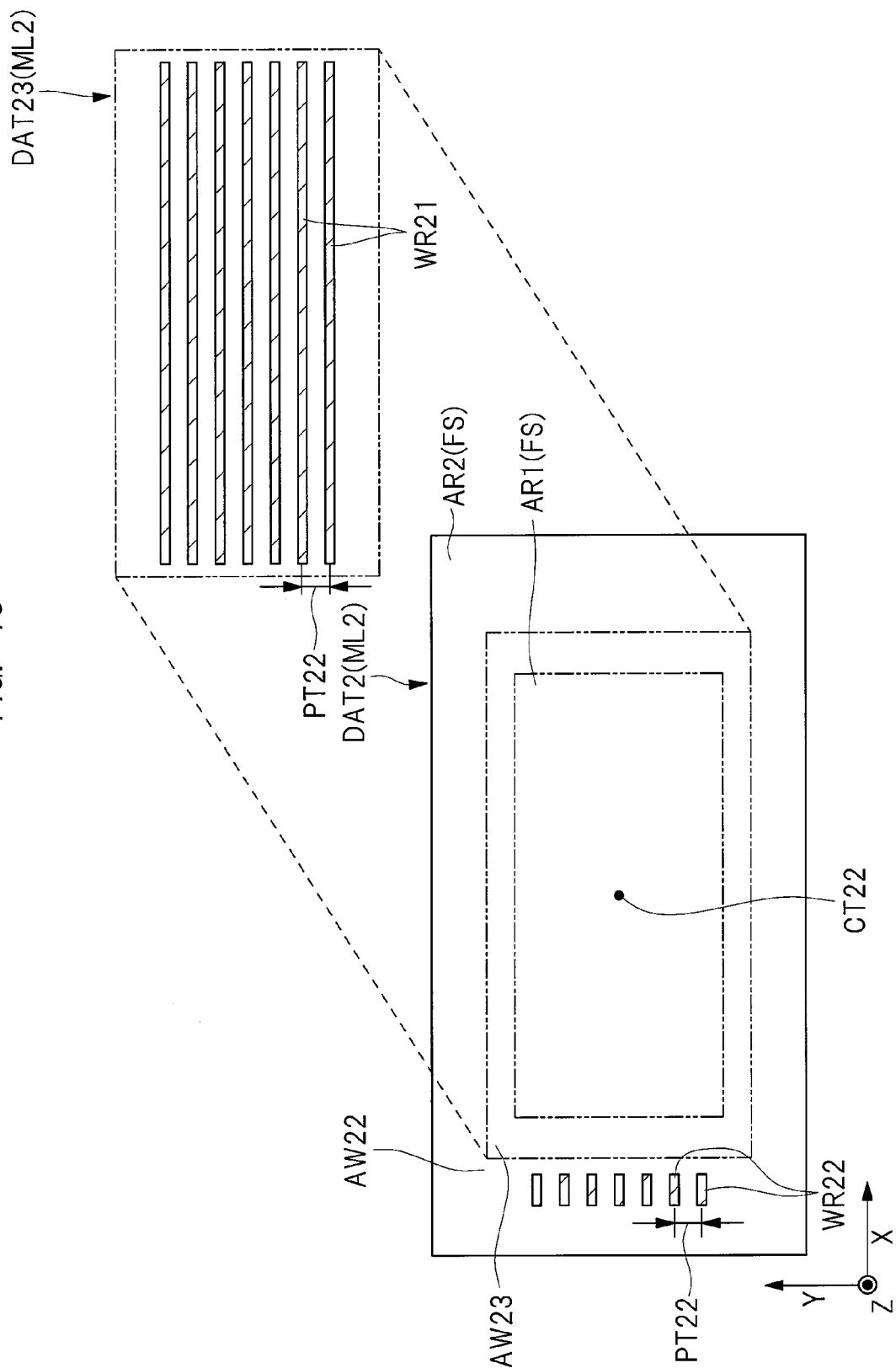
FIG. 43 is a plan view illustrating the wiring layout data of the wiring layer of the second layer in the second embodiment.

Next, the same step as Step S2 of FIG. 11 is performed to cut out partial mask data as illustrated in FIG. 43. In this step, partial mask data DAT23 as the pattern data of the portion disposed in the area AW23 is cut out of the mask data DAT2 of the wiring layer ML2 of the second layer.

Figure 44:
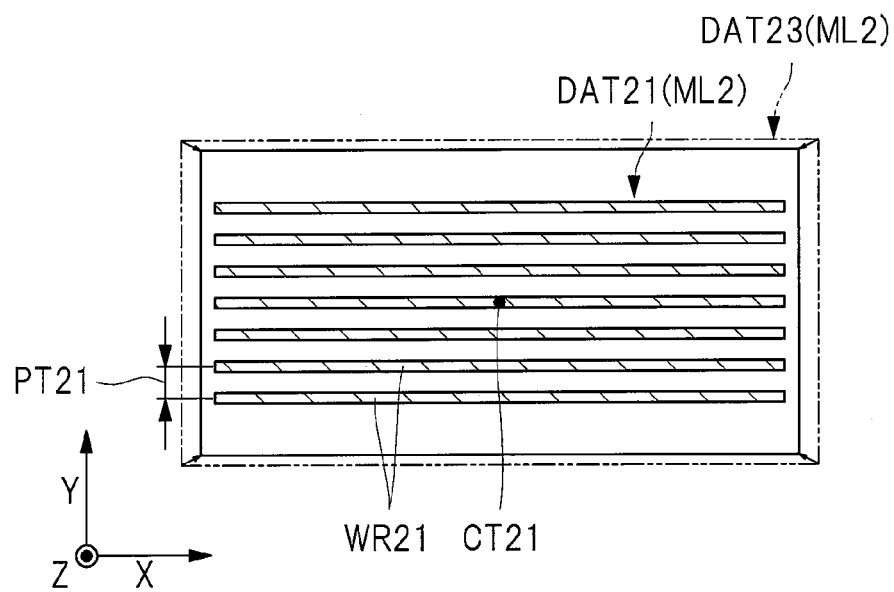
FIG. 44 is a plan view illustrating the wiring layout data of the wiring layer of the second layer in the second embodiment.

Next, the same step as Step S3 of FIG. 11 is performed for the shrink process as illustrated in FIG. 44. In this step, a process of shrinking the cut-out partial mask data DAT23 at a certain magnification with the position CT21 in the partial mask data DAT23 as the center portion (that is, the shrink process) is performed. Therefore, the mask data of partially shrunk region DAT21 made of the respective shrank wirings (wiring pattern) WR21 as the pattern data is created. The plurality of wirings WR21 are extended in the X-axis direction and arranged at the pitch PT21 in the Y-axis direction. The pitch PT21 is smaller than the pitch PT22.

As illustrated in FIG. 42, the terminal PD2 before the shrink process protrudes by a distance Xmargin toward the side opposed to the shrink center position CT21 in the X axis direction with respect to the area where the via VA1 is disposed. In addition, the terminal PD2 before the shrink process protrudes by a distance Ymargin toward the side opposed to the shrink center position CT21 in the Y axis direction with respect to the area where the via VA1 is disposed.

Here, the shrink rate as a shrink magnification of the shrink process in the wiring layer ML2 of the second layer is set to $\alpha$, and the center coordinates of the via VA1 with respect to the shrink center position CT21 are set to (Xv, Yv). In addition, the width in the X axis direction and the Y axis direction of the via VA1 (a diameter in a case where the via VA1 has a circular shape) is set to a width V1, and a margin of an allowable displacement amount of the position of the via VA1 with respect to the wiring layer ML2 of the second layer (that is, the displacement amount) is set to a margin $\Delta$.

At this point, the distance Xmargin and the distance Ymargin are defined by the following Equations (5) and (6).

$$X\text{margin} = (1-\alpha)/\alpha \times (|Xv| + 0.5 \times V1 + \Delta) \quad (5)$$

$$Y\text{margin} = (1-\alpha)/\alpha \times (|Yv| + 0.5 \times V1 + \Delta) \quad (6)$$

On the other hand, a minimum line width in consideration of the mask size effect or the OPC process of the wiring layer ML2 of the second layer is set to a width W0. At this point, the length in the X axis direction of the terminal PD2 (see FIG. 40) after the shrink process becomes equal to or more than (W0+α×(Xmargin+Δ)), and the width in the Y axis direction becomes equal to or more than (W0+α×(Ymargin+Δ)).

In addition, in the wiring layer ML2 of the second layer, the minimum line width is set to the width W0, and a minimum space width is set to the space width S0. At this point, the pattern as the wiring WR21 before the shrink process is disposed by setting a line width Wshrink defined in the following Equation (7) to a minimum line width, and by setting a space width Sshrink defined in the following Equation (8) to the minimum space width.

$$W\text{shrink} = 1/\alpha \times W0 \quad (7)$$

$$S\text{shrink} = 1/\alpha \times S0 \quad (8)$$

Figure 45:
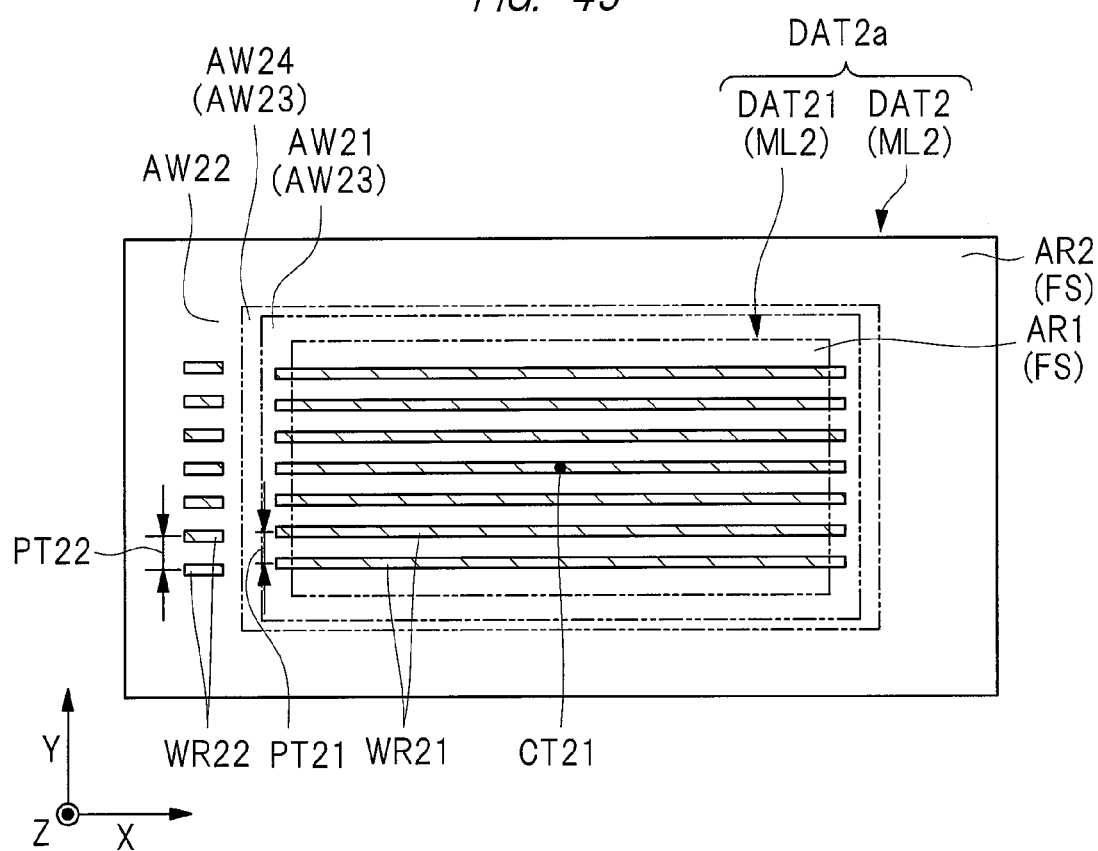
FIG. 45 is a plan view illustrating the wiring layout data of the wiring layer of the second layer in the second embodiment.

Next, the same step as Step S4 of FIG. 11 is performed to attach the mask data of partially shrunk region as illustrated in FIG. 45. In this step, the mask data of partially shrunk region DAT21 is attached to the area AW21 which is in the area AW23 of the flat surface FS and separated from the area AW22 so that the position CT21 in the mask data of partially shrunk region DAT21 comes to be the same coordinates as a position CT22 in the area AW23 (see FIG. 43). At this point, the area between the areas AW21 and AW22 is a gap area AW24 having no mask data created.

Therefore, the mask data DAT2a as the pattern data including the mask data of partially shrunk region DAT21 and the mask data DAT2 is created.

Further, in the second embodiment, the same step as Step S5 of FIG. 11 may be not performed unlike the first embodiment. In addition, the connection wiring is not formed in the gap area AW24.

Figure 46:
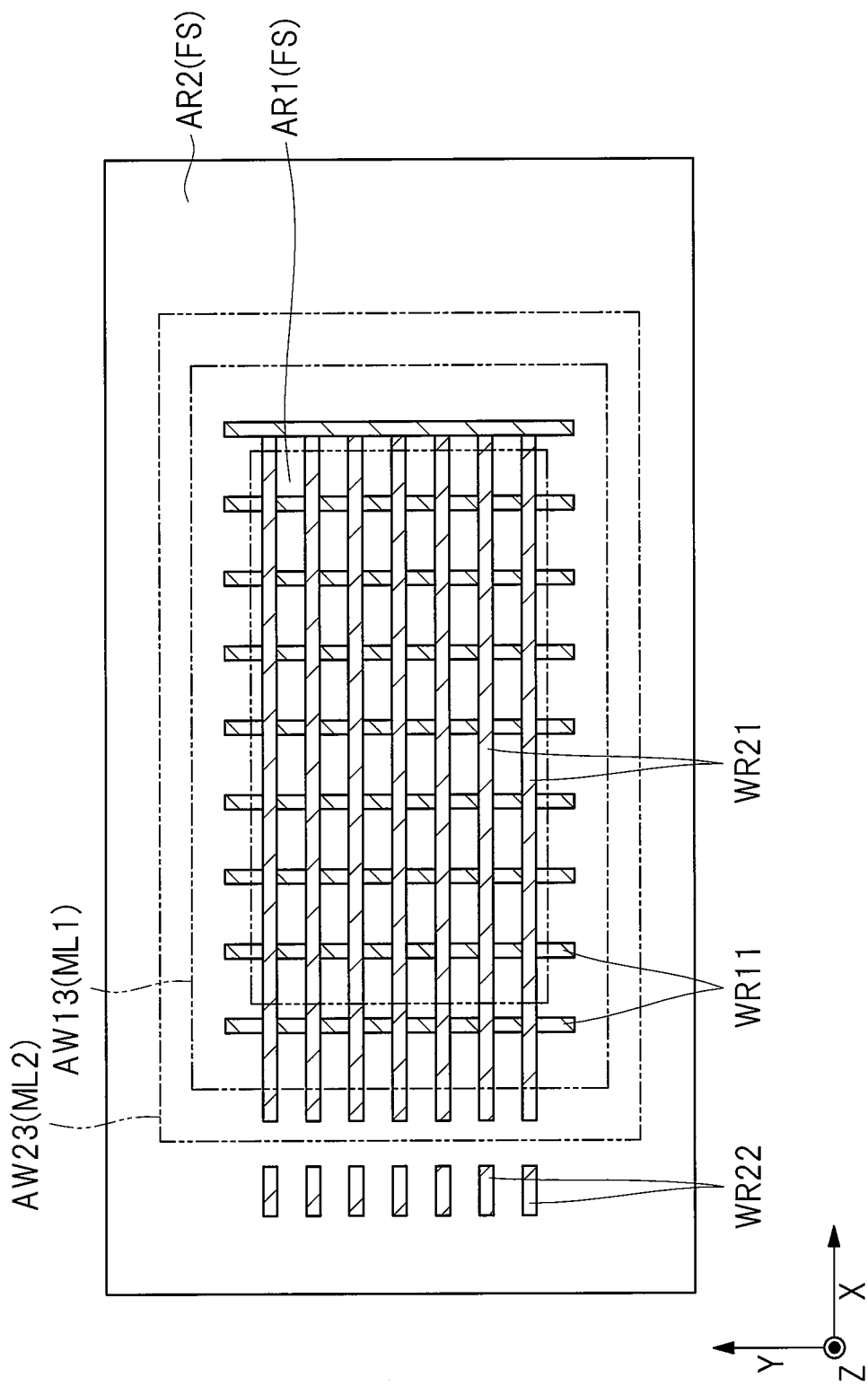
FIG. 46 is a plan view illustrating the wiring layout data of the wiring layer of the second layer in the second embodiment and the wiring layout data of the wiring layer of the first layer in an overlapping manner.

FIG. 46 is a plan view illustrating the wiring layout data of the wiring layer of the second layer in the second embodiment and the wiring layout data of the wiring layer of the first layer in an overlapping manner. In the example illustrated in FIG. 46, the wiring layer ML1 of the first layer is extended in the Y-axis direction, and includes the plurality of wirings WR11 arranged in the X-axis direction.

In the second embodiment, the shrink process is not performed on the connection wiring CW1 included in the wiring layer ML1 of the first layer of the lower wiring layer, and on the vias VA1 and VA2. Therefore, as illustrated in FIG. 46, in a case where the area AW23 having the plurality of pixels PU disposed is cut out of the wiring layer ML2 of the second layer, the area AW23 is larger than the cut-out area AW13 in the wiring layer ML1 of the first layer.

<Main Characteristic and Effect of Present Embodiment>

In the second embodiment, when the mask data of the wiring layer ML2 of the second layer other than the wiring layer ML3 of the uppermost layer is created, the shrink process is performed with any position in the area AW23 including the plurality of pixels PU as the center. Therefore, even in the second embodiment, in the wiring layer ML2 of the second layer other than the wiring layer ML3 of the uppermost layer, the pitch of the wiring WR21 disposed in the area AW21 in the area AW23 is smaller than that of the wiring WR22 disposed in the area AW22 different from the area AW23.

As described in the first embodiment using the comparative example, since the light entering the respective pixels PU is reflected on the wiring included in the wiring layer which is above the semiconductor substrate SB and different from the light shielding film SF1 only by performing the shrink process on the opening OP1 of the light shielding film SF1, it is difficult to prevent or suppress the shading. Therefore, the CMOS image sensor is degraded in sensitivity, and the semiconductor device is degraded in performance.

On the other hand, similarly to the first embodiment, in the second embodiment, the shrink process is performed on the mask data of the wiring layer ML2 of the second layer with the position in the area where the plurality of pixels PU are disposed as the center. With such a configuration, the pitch of the wiring WR21 can be made smaller than that of the wiring WR22, the shading caused by the wiring layer ML2 of the second layer can be prevented or suppressed. Therefore, the CMOS image sensor can be improved in sensitivity, and the semiconductor device can be improved in performance.

In the second embodiment, the periphery of the area AW23 of which the partial mask data DAT23 is cut out does not traverse the plurality of wirings WR21 and the plurality of wirings WR22. Therefore, there is no need to create the partial mask data in the gap area AW24, and the wiring WR21 and the wiring WR22 can be connected between the area AW21 and the area AW22 without performing the calculating in consideration of a difference in pitch of the wiring WR21 before and after the shrink process.

In addition, in the second embodiment, the terminal PD2 before the shrink process protrudes by the distance Xmargin toward the side opposed to the shrink center position CT21 in the X axis direction with respect to the area where the via VA1 is disposed. In addition, the terminal PD2 before the shrink process protrudes by the distance Xmargin toward the side opposed to the shrink center position CT21 in the Y axis direction with respect to the area where the via VA1 is disposed. Therefore, in a case where the mask size effect or the OPC process in the wiring layer ML2 of the second layer are not taken into consideration, and even in a case where the margin Δ is set as Δ=0, the via VA1 is included in the terminal PD2 after the shrink process when seen in a plan view.

According to the design method of the wiring layout in the second embodiment, the wiring WR21 is reliably electrically connected to the via VA1 even after the shrink process when the chip layout data is created as long as the electrical connection between the wiring WR21 the via VA1 is verified. Therefore, in a case where it is verified whether the wiring WR21 is electrically connected to the via VA1 when the chip layout data is created, there is no need to perform the verification again when the mask data of partially shrunk region DAT21 is attached to create the mask data DAT2a after the shrink process.

In addition, a minimum line width in the area AW21 after the shrink process is set to the line width Wshrink (see the above Equation (7)), and the minimum space width in the area AW21 after the shrink process is set to the space width Sshrink (see the above Equation (8)). Therefore, it is possible to dispose the plurality of wirings WR21 such that the minimum line width and the minimum space width in the wiring layer ML2 of the second layer can be secured even after the shrink process.

Further, the shrink process may be performed on the wiring layer other than the wiring layer ML2 of the second layer, or may be performed on the p-type semiconductor layer PW, the n-type semiconductor layer NW, or the gate electrode GE. In addition, the shrink rate α may be set to the same value in each portion of the area subjected to the shrink process, and may be adjusted to be different values.

Furthermore, the second embodiment has been described about an example in which the cut-out area AW23 is formed in the rectangular shape and the wirings WR21 and WR22 are connected in the gap area AW24 between the end portion on the negative side in the X axis direction of the area AW21 and the area AW22. However, the cut-out area AW23 may be not formed in the rectangular shape. Alternatively, the wirings WR21 and WR22 may be connected in the gap area AW24 between the end portion on the positive side in the X-axis direction of the area AW21 and the area AW22. Further, the wirings WR21 and WR22 may be connected in the gap area AW24 between the end portion on the positive or negative side in the Y-axis direction of the area AW21 and the area AW22. Even in either case, the same effect as the second embodiment is achieved.

<First Modification Example of Wiring Layout and Design Method>

Next, a first modification example of the wiring layout and the design method in the wiring layer will be described. In the first modification example, the shrink process is performed even on the plurality of vias VA1.

Figure 47:
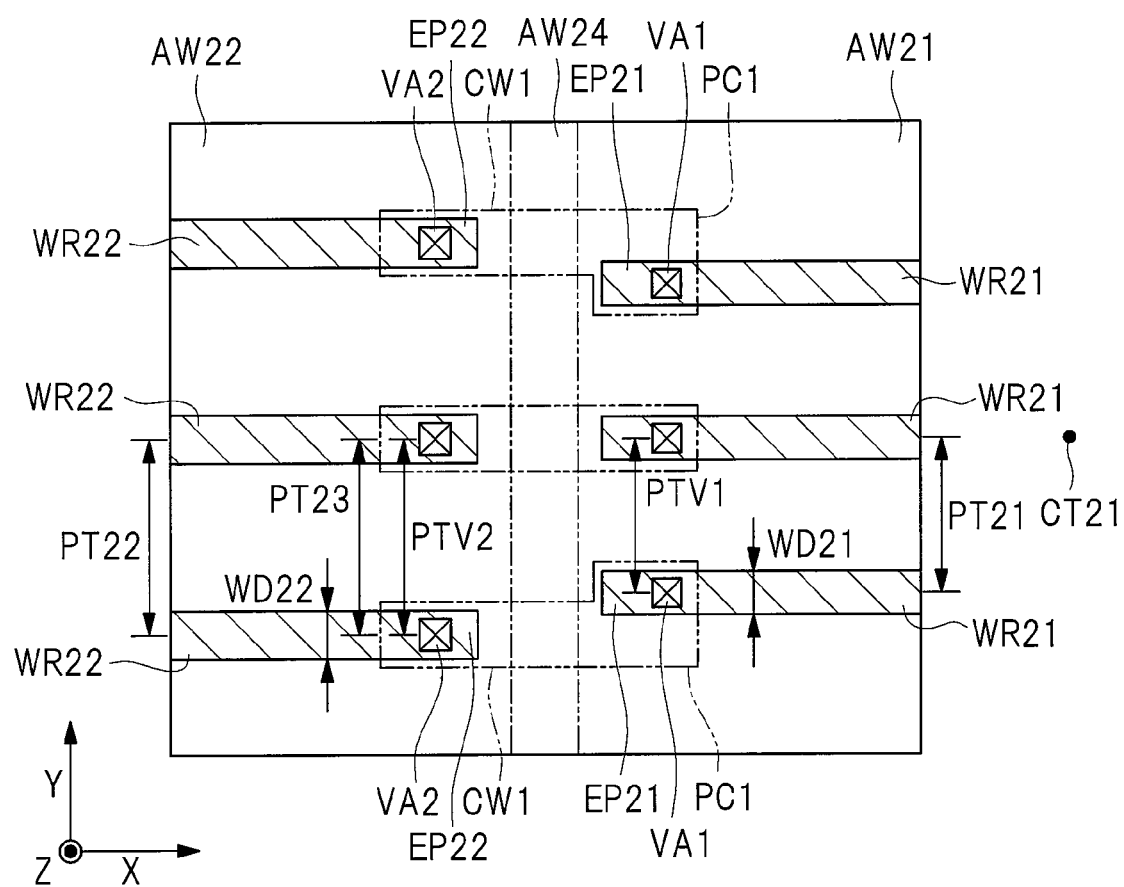
FIG. 47 is a plan view illustrating the wiring layout of the wiring layer of the second layer in a first modification example of the second embodiment.
Figure 48:
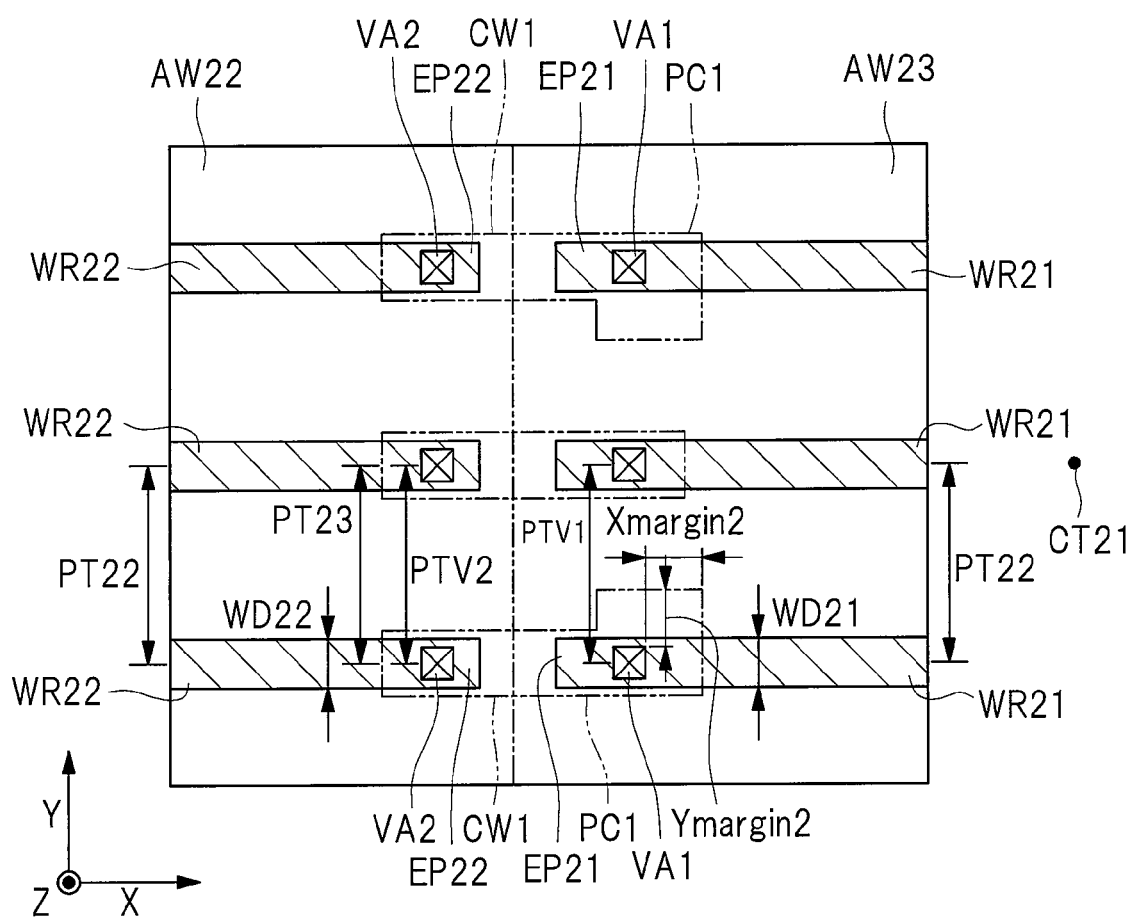
FIG. 48 is a plan view illustrating the wiring layout of the wiring layer of the second layer in the first modification example of the second embodiment.

FIGS. 47 and 48 are plan views illustrating the wiring layout of the wiring layer of the second layer in the first modification example of the second embodiment. FIG. 47 illustrates a layout after the shrink process, and FIG. 48 illustrates a layout before the shrink process.

In the example illustrated in FIGS. 47 and 48, the shrink process is performed on the plurality of vias VA1 at the same shrink rate as that of the plurality of wirings WR21. Therefore, the pitch PTV1 of the array of the plurality of vias VA1 in the Y-axis direction can be made equal to the pitch PT21 of the array of the plurality of wirings WR21 in the Y-axis direction as illustrated in FIG. 47. At this point, the pitch PTV1 becomes smaller than the pitch PT22 of the array of the plurality of wirings WR21 in the Y-axis direction. Further, the pitch PTV2 of the array of the vias VA2 can be set to be equal to the pitch PT22 of the array of the plurality of wirings WR22 in the Y-axis direction.

In addition, the wiring layer ML1 of the first layer includes a plurality of terminals PC1. The plurality of terminals PC1 are formed in the same layer as that of the plurality of connection wirings CW1. Each terminal PC1 is connected to the end portion on the side closer to the area AW21 of each connection wiring CW1.

In the first modification example, the width in the X-axis direction and the Y-axis direction of the via VA1 before the shrink process (a diameter in a case where the via VA1 has a circular shape) is set to a width V1'. At this point, the width V1' is defined by the following Equation (9).

$$V1'=1/\alpha \times V1 \quad (9)$$

As illustrated in FIG. 48, the terminal PC1 before the shrink process protrudes by a distance Xmargin2 toward the shrink center position CT21 in the X axis direction with respect to the area where the via VA1 is disposed. In addition, the terminal PC1 before the shrink process protrudes by a distance Ymargin2 toward the shrink center position CT21 in the Y axis direction with respect to the area where the via VA1 is disposed. The distances Xmargin2 and Ymargin2 are defined by the following Equations (10) and (11). Further, the margin Δ' is set to a margin of an allowable displacement amount (that is, the displacement amount) of the position of the via VA1 with respect to the wiring layer ML2 of the second layer.

$$X\text{margin}2=(1-\alpha)\times(|Xv|-0.5\times V1')+\Delta' \quad (10)$$

$$Y\text{margin}2=(1-\alpha)\times(|Yv|-0.5\times V1')+\Delta' \quad (11)$$

Figure 49:
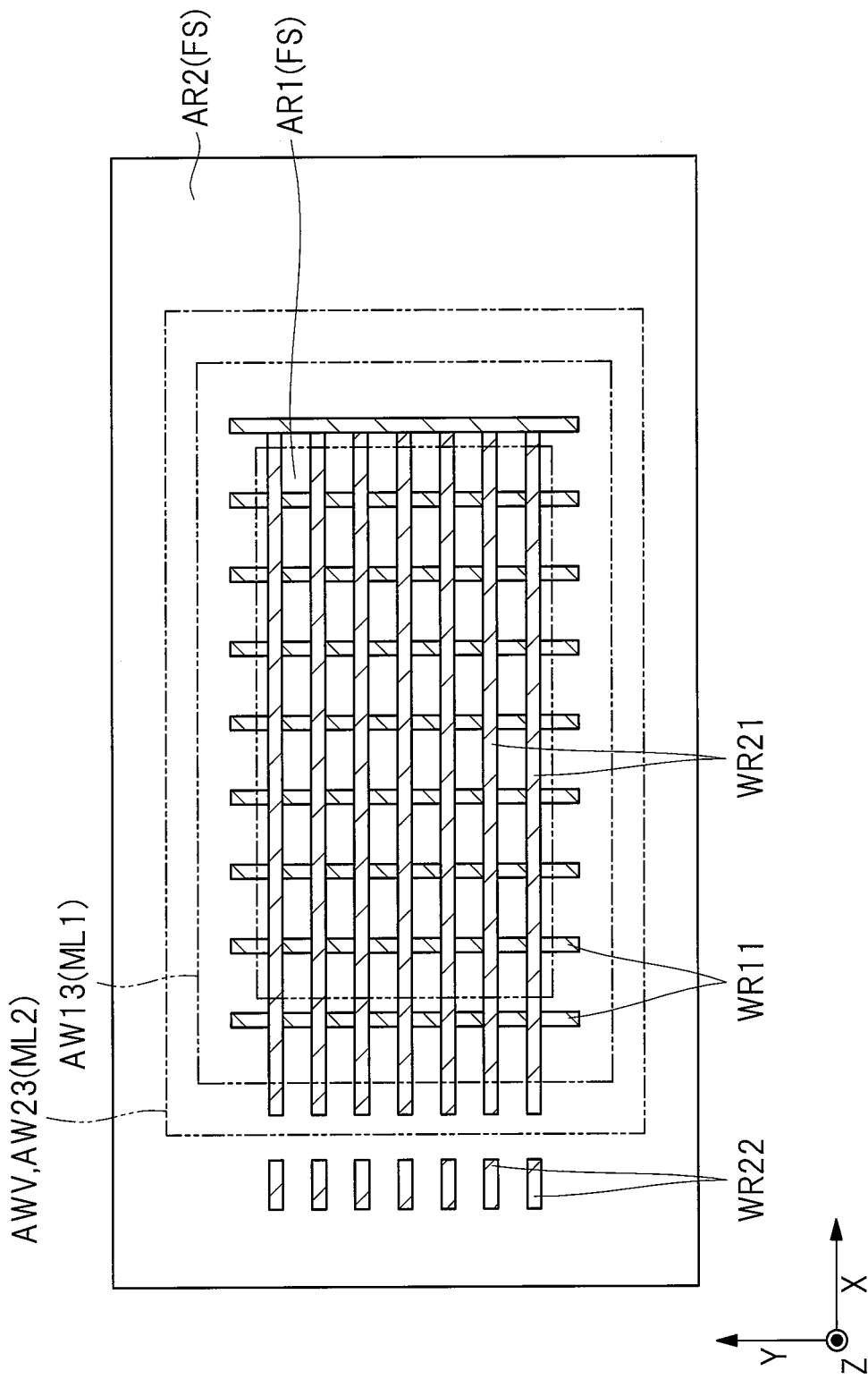
FIG. 49 is a plan view illustrating the wiring layout data of the wiring layer of the second layer in the first modification example of the second embodiment and the wiring layout data of the wiring layer of the first layer in an overlapping manner.

FIG. 49 is a plan view illustrating the wiring layout data of the wiring layer of the second layer in the first modification example of the second embodiment and the wiring layout data of the wiring layer of the first layer in an overlapped manner. In the example illustrated in FIG. 49, the wiring layer ML1 of the first layer includes the plurality of wirings WR11 which are extended in the Y axis direction and arranged in the X axis direction.

In the first modification example, the via VA1 is subjected to the shrink process at the same shrink rate as that of the wiring WR21. Therefore, in a case where an area AWV having the plurality of pixels PU disposed is cut out of the layer of which the via VA1 is cut out, the size of the area AWV is the same as that of the cut-out area AW23 in the wiring layer ML2 of the second layer as illustrated in FIG. 49.

According to the first modification example, the shrink process is performed even on the via VA1 formed lower than the wiring layer ML2 of the second layer at the same shrink rate as that in the wiring layer ML2 of the second layer unlike the second embodiment. However, even in a case where the mask size effect or the OPC process in the wiring layer ML2 of the second layer are not taken into consideration and the margin Δ' is equal to 0, the via VA1 after the shrink process is included in the end portion EP21 when seen in a plan view. In addition, the width V1' in the X-axis direction and the Y-axis direction of the via VA1 before the shrink process is set to a width in consideration of the shrink process. Therefore, the first modification example achieves the same effect as that of the second embodiment while improving the flexibility in design.

Figure 50:
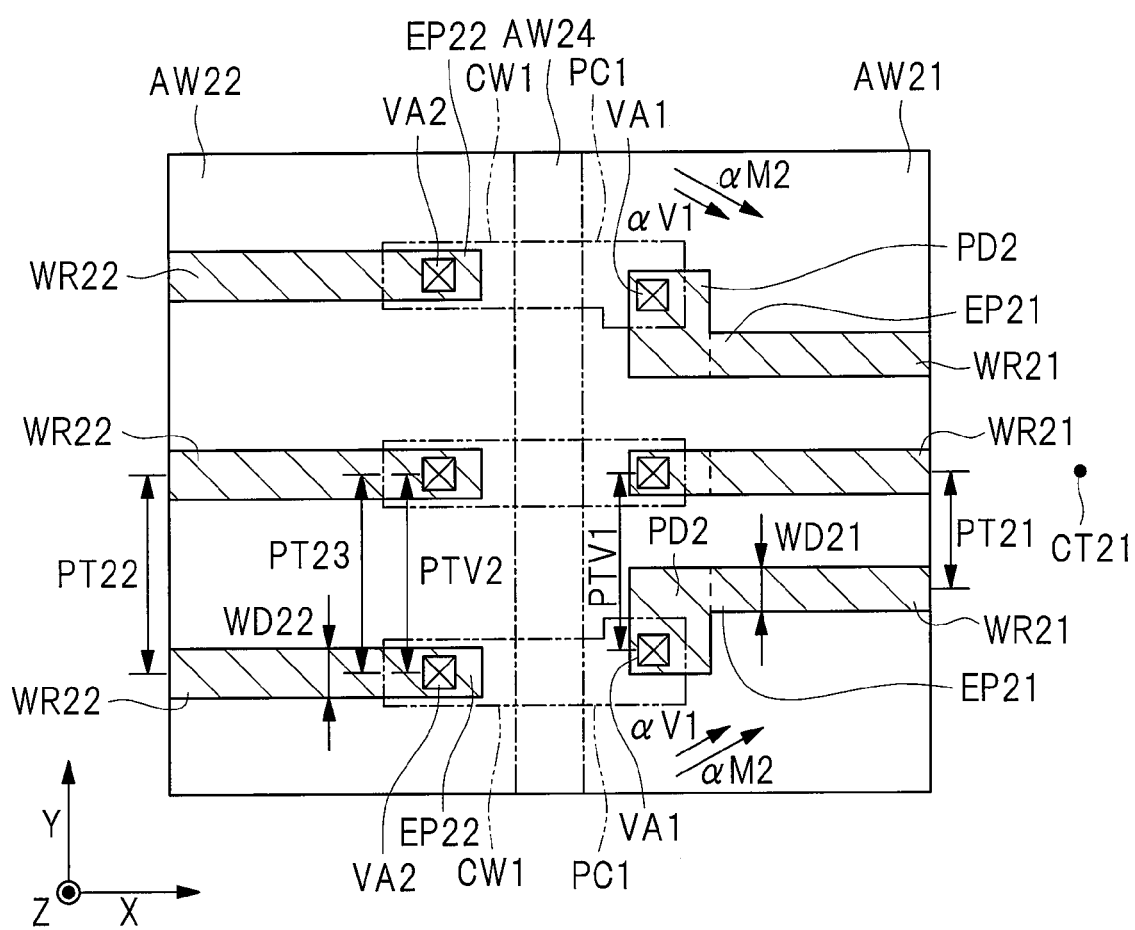
FIG. 50 is a plan view illustrating another example of the wiring layout of the wiring layer of the second layer in the first modification example of the second embodiment.
Figure 51:
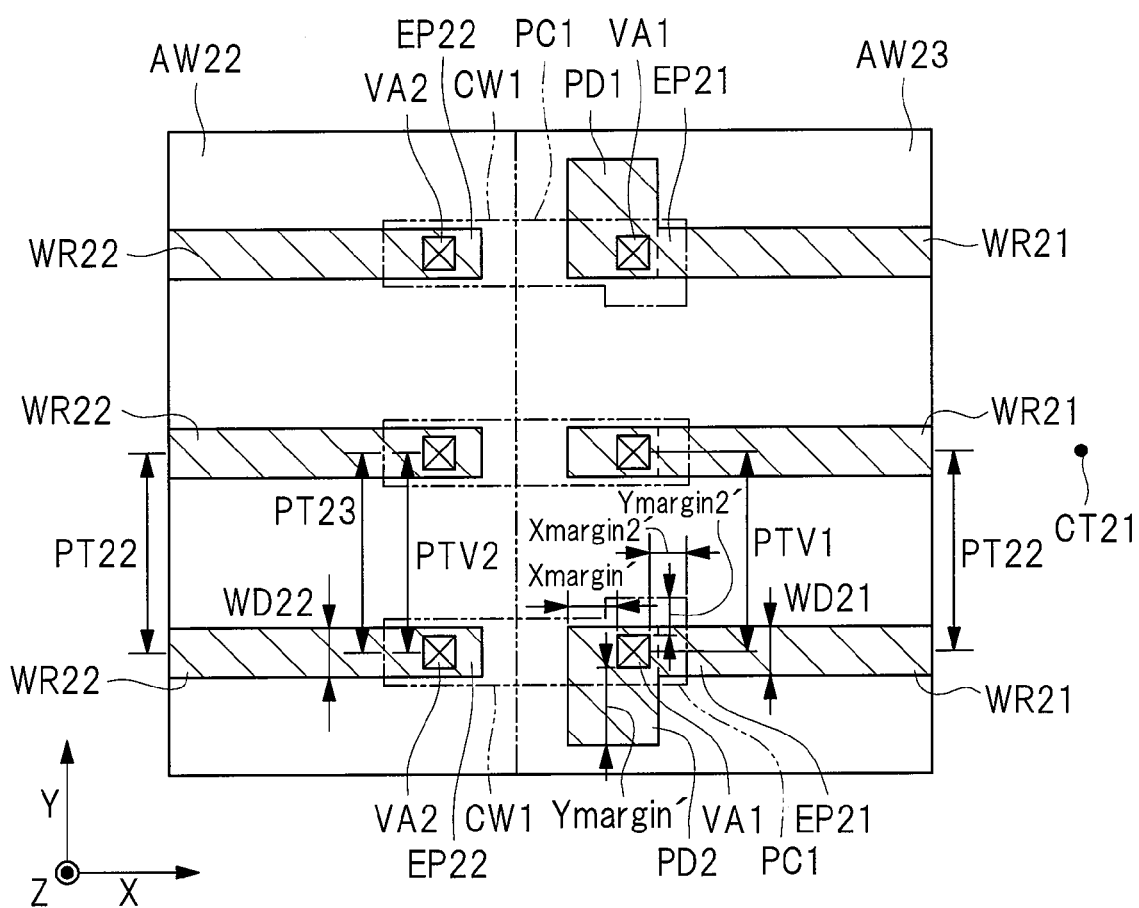
FIG. 51 is a plan view illustrating another example of the wiring layout of the wiring layer of the second layer in the first modification example of the second embodiment.

FIGS. 50 and 51 are plan views illustrating another example of the wiring layout of the wiring layer of the second layer in the first modification example of the second embodiment. FIG. 50 illustrates a layout after the shrink process, and FIG. 51 illustrates a layout before the shrink process.

In the example illustrated in FIGS. 50 and 51, the terminal PD2 and the terminal PC1 are disposed.

In the example illustrated in FIG. 50, when the shrink rate of the plurality of wirings WR21 is set to a shrink rate αM2, the shrink process is performed on the plurality of vias VA1 at a shrink rate αV1 larger than the shrink rate αM2. Therefore, as illustrated in FIG. 50, the pitch PTV1 of the array of the plurality of vias VA1 in the Y axis direction can be made larger than the pitch PT21 of the array of the plurality of wirings WR21 in the Y axis direction, and can be made smaller than the pitch PT22 of the array of the plurality of wirings WR22 in the Y axis direction. For example, when the shrink rate αV1 is set to 0.995, the shrink rate αM2 may be set to 0.99.

As illustrated in FIG. 51, the terminal PD2 before the shrink process protrudes by a distance Xmargin' toward the side opposed to the shrink center position CT21 in the X axis direction with respect to the area where the via VA1 is disposed. In addition, the terminal PD2 before the shrink process protrudes by a distance Ymargin' toward the side opposed to the shrink center position CT21 in the Y axis direction with respect to the area where the via VA1 is disposed. On the other hand, the terminal PC1 before the shrink process protrudes by a distance Xmargin2' toward the side closer to the shrink center position CT21 in the X axis direction with respect to the area where the via VA1 is disposed. In addition, the terminal PC1 before the shrink process protrudes by a distance Ymargin2' toward the side closer to the shrink center position CT21 in the Y axis direction with respect to the area where the via VA1 is disposed.

With such a configuration, the same effect as that of the example illustrated in FIGS. 47 and 48 is achieved even in the example illustrated in FIGS. 50 and 51.

<Second Modification Example of Wiring Layout and Design Method>

Next, a second modification example of the wiring layout and the design method in the wiring layer will be described. In the second modification example, the wiring formed in the lower wiring layer on the side closer to the pixel area is electrically connected to the wiring disposed in the lower wiring layer on the side closer to the peripheral circuit area through the connection wiring formed in the wiring layer upper than the lower wiring layer.

Figure 52:
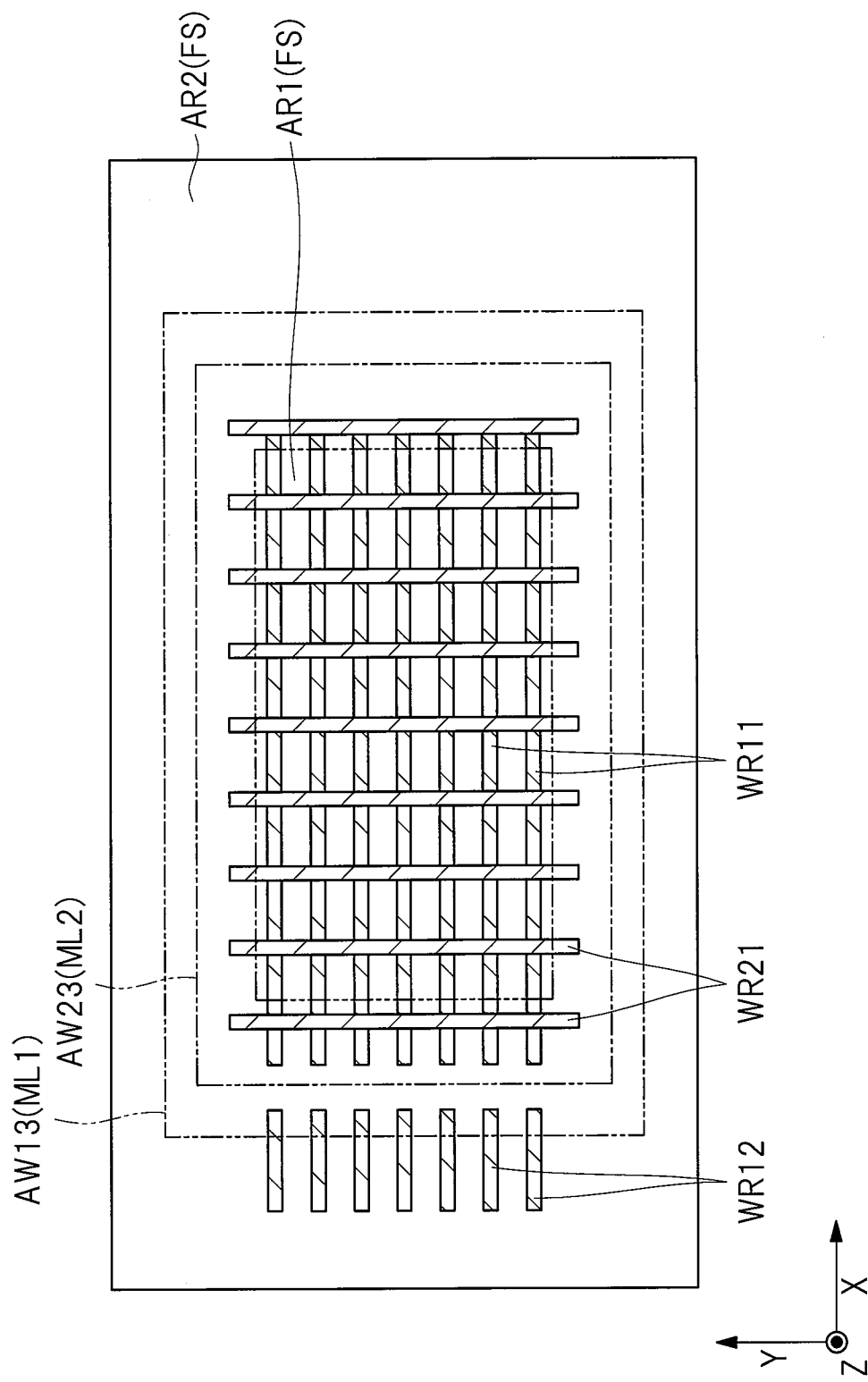
FIG. 52 is a plan view illustrating the wiring layout of the wiring layer of the first layer in a second modification example of the second embodiment and the wiring layout data of the wiring layer of the second layer in an overlapping manner.
Figure 53:
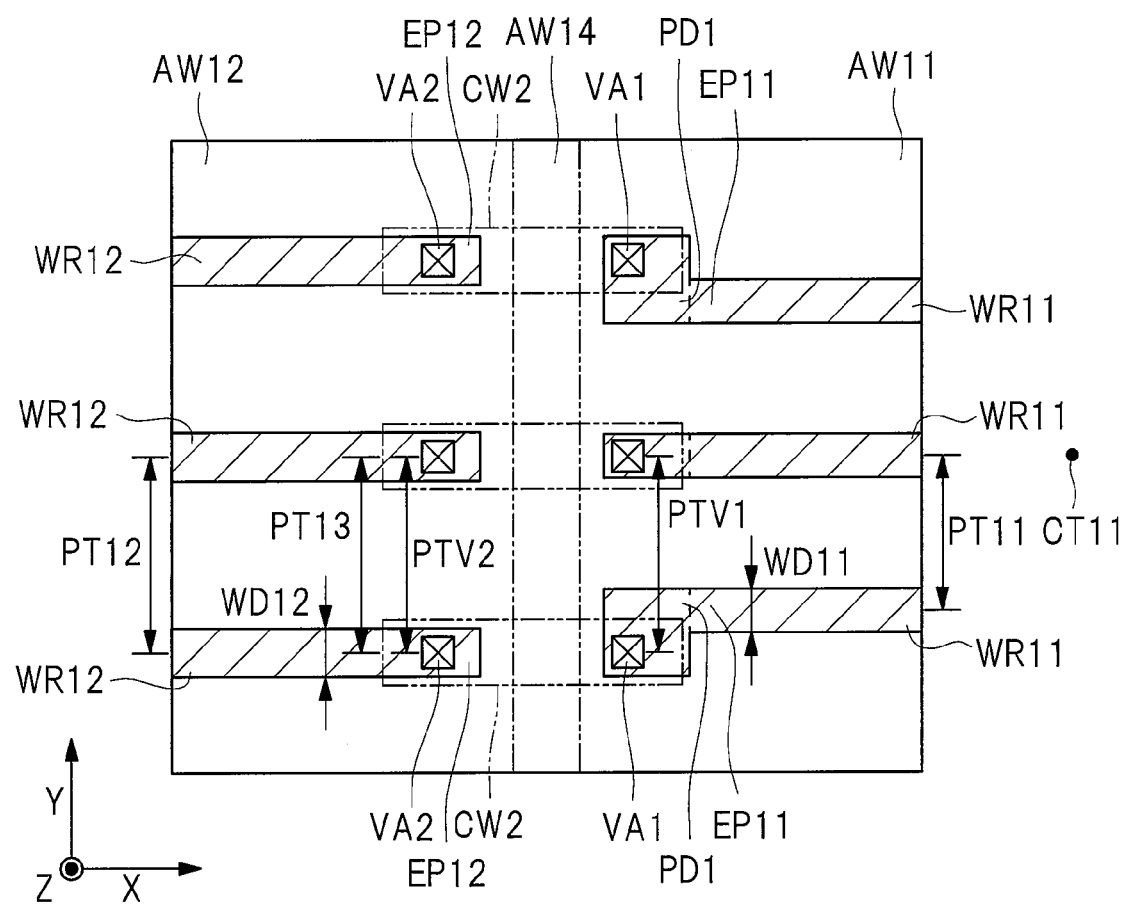
FIG. 53 is a plan view illustrating the wiring layout of the wiring layer of the first layer in the second modification example of the second embodiment.
Figure 54:
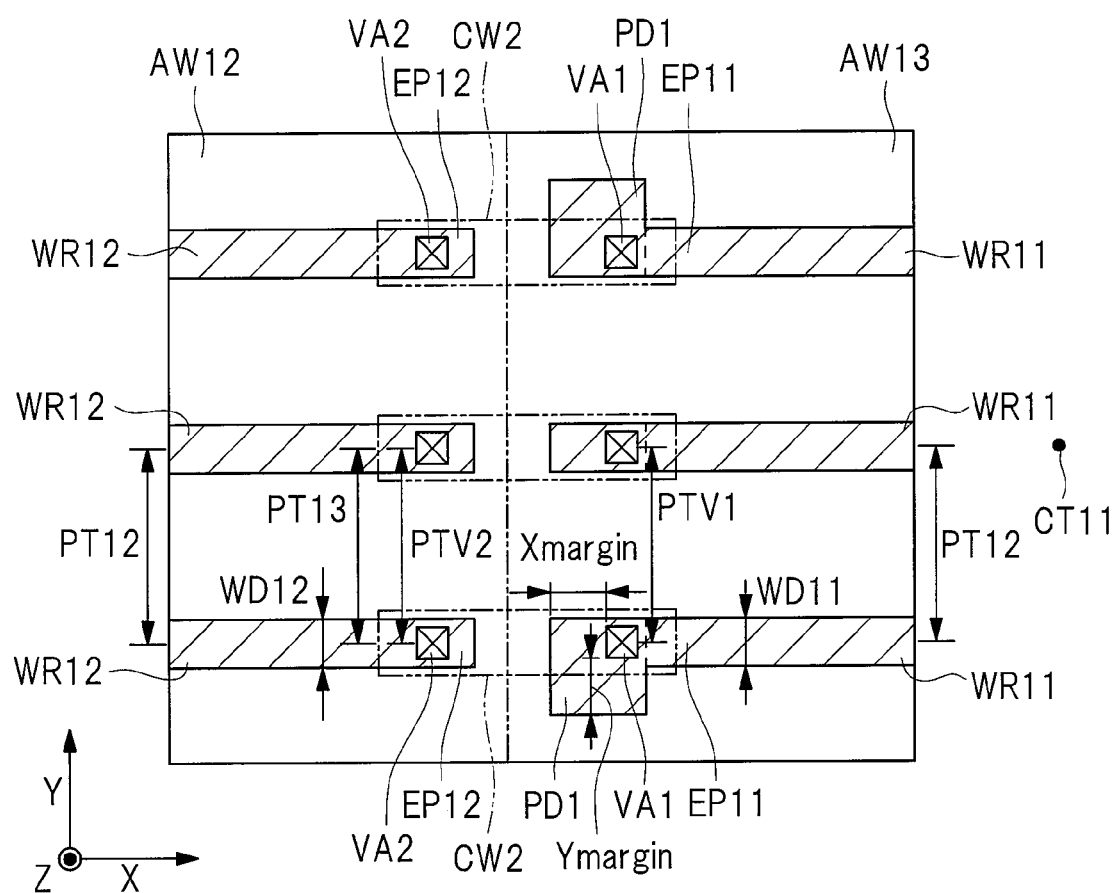
FIG. 54 is a plan view illustrating the wiring layout of the wiring layer of the first layer in the second modification example of the second embodiment.

FIG. 52 is a plan view illustrating the wiring layout of the wiring layer of the first layer in the second modification example of the second embodiment and the wiring layout data of the wiring layer of the second layer in an overlapped manner. FIGS. 53 and 54 are plan views illustrating the wiring layout of the wiring layer of the first layer in the second modification example of the second embodiment. FIG. 53 illustrates a layout after the shrink process, and FIG. 54 illustrates a layout before the shrink process.

As illustrated in FIGS. 52 to 54, in the second modification example, the wiring layer ML1 of the first layer includes the plurality of wirings WR11 and the plurality of wirings WR12. The plurality of wirings WR11 are extended in the X-axis direction and arranged in the Y-axis direction in the area AW11 where the plurality of pixels PU are disposed. The plurality of wirings WR12 are extended in the X-axis direction and arranged in the Y-axis direction in the area AW12 which is different from the area AW11. The plurality of wirings WR11 are electrically connected to the plurality of wirings WR12 through a plurality of connection wirings CW2 formed in the wiring layer ML2 of the second layer upper than the wiring layer ML1 of the first layer. The plurality of connection wirings CW2 are extended in the X-axis direction and arranged in the Y-axis direction.

Further, in the example illustrated in FIG. 52, the wiring layer ML2 of the second layer includes the plurality of wirings WR21 which are extended in the Y axis direction and arranged in the X axis direction.

In the second modification example, as illustrated in FIG. 52, in a case where the area AW13 having the plurality of pixels PU disposed is cut out of the wiring layer ML1 of the first layer, the area AW13 is larger than the cut-out area AW23 in the wiring layer ML2 of the second layer.

In the example illustrated in FIGS. 53 and 54, the shrink process is performed on the plurality of wirings WR11 included in the wiring layer ML1 of the first layer, but not performed on the plurality of connection wirings CW2 included in the wiring layer ML2 of the second layer and the via VA1 formed in the layer between the plurality of wirings WR11 and the plurality of connection wirings CW2.

In other words, in the example illustrated in FIGS. 53 and 54, a relation between the wiring layer ML1 of the first layer and the wiring layer ML2 of the second layer is reversed to a relation between the wiring layer ML1 of the first layer and the wiring layer ML2 of the second layer in the example illustrated in FIGS. 40 and 42.

In the example illustrated in FIGS. 53 and 54, the plurality of wirings WR11, a plurality of terminals PD1, and the plurality of wirings WR12 are disposed instead of the plurality of wirings WR21, the plurality of terminals PD2, and the plurality of wirings WR22 in the example illustrated in FIGS. 40 and 42. The plurality of wirings WR11, the plurality of terminals PD1, and the plurality of wirings WR12 are disposed in the wiring layer ML1 of the first layer. The plurality of wirings WR11 are arranged at the pitch PT11 in the Y axis direction in the area AW11, the plurality of wirings WR12 are arranged at the pitch PT12 in the Y axis direction in the area AW12, and the plurality of connection wirings CW1 are arranged at a pitch PT13 in the Y axis direction. Each of the plurality of terminals PD1 is connected to the end portion EP11 on the side closer to the area AW12 of the wiring WR11. The width WD11 in the Y axis direction of the end portion EP11 is narrower than the width WD12 in the Y axis direction of the end portion EP12 on the side closer to the area AW11 of the wiring WR12.

In addition, in the example illustrated in FIGS. 53 and 54, the plurality of connection wirings CW2 are disposed instead of the plurality of connection wirings CW1 in the example illustrated in FIGS. 40 and 42. The plurality of connection wirings CW1 are disposed in the wiring layer ML2 of the second layer. The plurality of connection wirings CW2 are arranged at the pitch PT13 in the Y-axis direction. The plurality of terminals PD1 are electrically connected to the plurality of connection wirings CW2 through the plurality of vias VA1. In addition, the plurality of wirings WR12 are electrically connected to the plurality of connection wirings CW2 through the plurality of vias VA2.

As illustrated in FIG. 54, the terminal PD1 before the shrink process protrudes by the distance Xmargin toward the side opposed to the shrink center position CT11 in the X axis direction with respect to the area where the via VA1 is disposed. In addition, the terminal PD1 before the shrink process protrudes by the distance Ymargin toward the side opposed to the shrink center position CT11 in the Y axis direction with respect to the area where the via VA1 is disposed.

With such a configuration, even the example illustrated in FIGS. 53 and 54 achieves the same effect as that of the second embodiment illustrated in FIGS. 40 and 42 while improving the flexibility in design.

Figure 55:
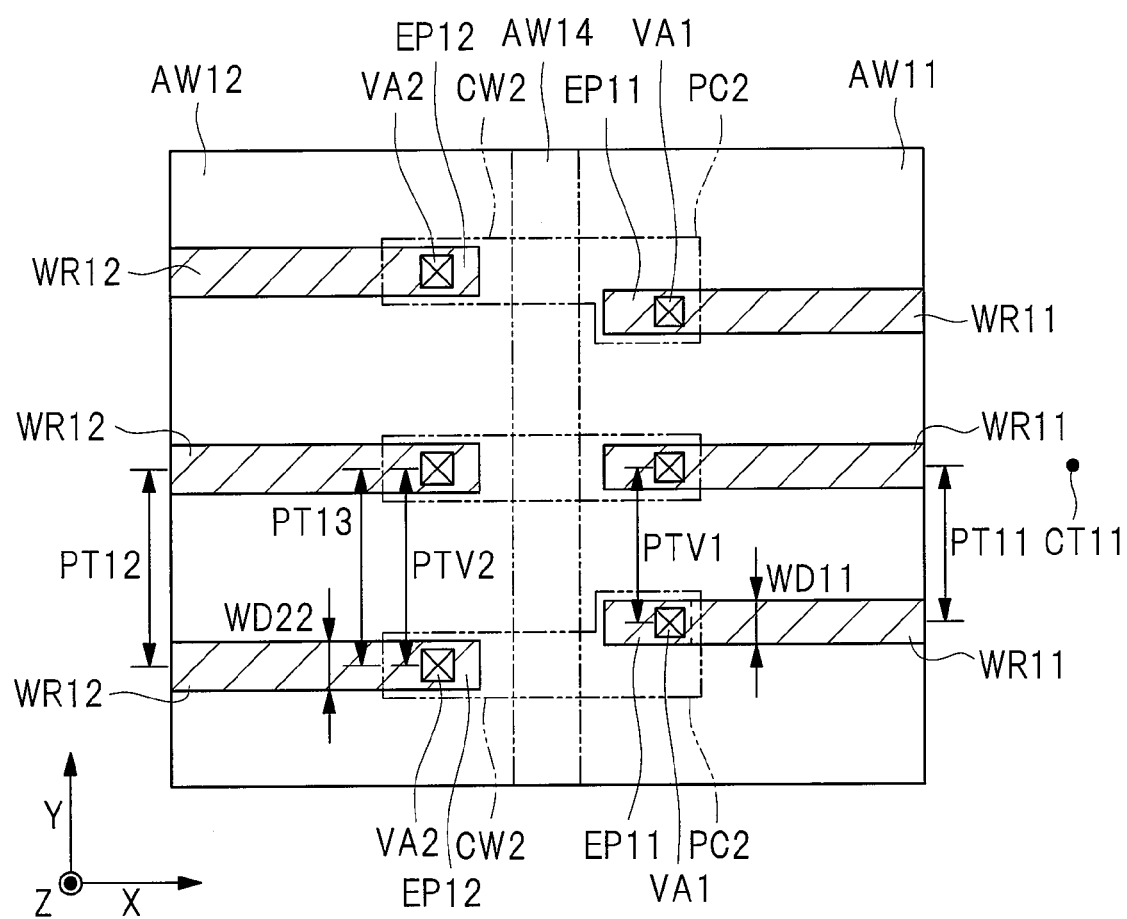
FIG. 55 is a plan view illustrating another example of the wiring layout of the wiring layer of the first layer in the second modification example of the second embodiment.
Figure 56:
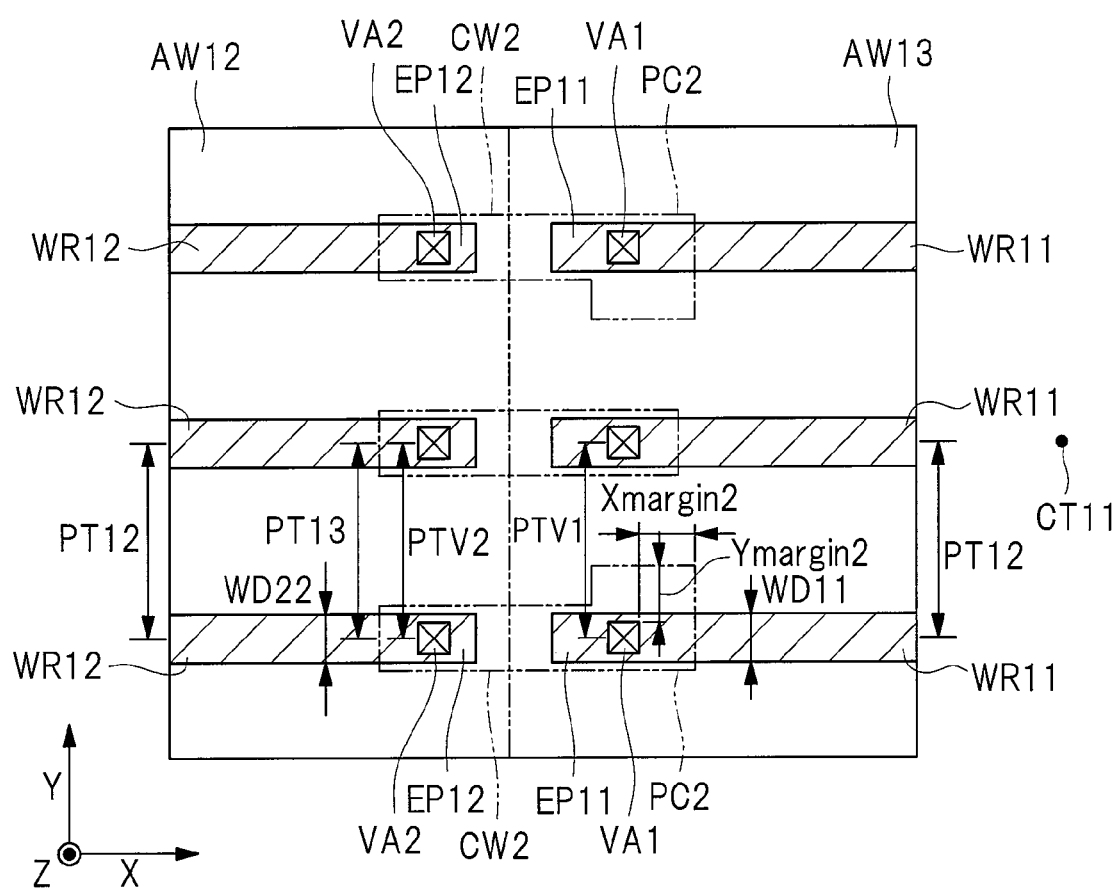
FIG. 56 is a plan view illustrating another example of the wiring layout of the wiring layer of the first layer in the second modification example of the second embodiment.

FIGS. 55 and 56 are plan views illustrating another example of the wiring layout of the wiring layer of the first layer in the second modification example of the second embodiment. FIG. 55 illustrates a layout after the shrink process, and FIG. 56 illustrates a layout before the shrink process.

In the example illustrated in FIGS. 55 and 56, the shrink process is performed even on the via VA1 formed in the layer between the plurality of wirings WR11 and the plurality of connection wirings CW2 in addition to the plurality of wirings WR11 included in the wiring layer ML1 of the first layer. On the other hand, the shrink process is not performed on the plurality of connection wirings CW2 included in the wiring layer ML2 of the second layer.

In other words, in the example illustrated in FIGS. 55 and 56, a relation between the wiring layer ML1 of the first layer and the wiring layer ML2 of the second layer is reversed to a relation between the wiring layer ML1 of the first layer and the wiring layer ML2 of the second layer in the example illustrated in FIGS. 47 and 48. Further, in the example illustrated in FIGS. 55 and 56, a plurality of terminals PC2 are disposed instead of the plurality of terminals PC1 in the example illustrated in FIGS. 47 and 48. Each of the plurality of terminals PC2 is connected to the end portion on the side closer to the area AW11 of the connection wiring CW2. The plurality of terminals PC2 are electrically connected to the end portions EP11 on the side closer to the area AW12 of the plurality of wirings WR11 through the plurality of vias VA1.

As illustrated in FIG. 56, the terminal PC2 before the shrink process protrudes by the distance Xmargin2 toward the side closer to the shrink center position CT11 in the X axis direction with respect to the area where the via VA1 is disposed. In addition, the terminal PC2 before the shrink process protrudes by the distance Ymargin2 toward the side closer to the shrink center position CT11 in the Y axis direction with respect to the area where the via VA1 is disposed.

With such a configuration, even the example illustrated in FIGS. 55 and 56 achieves the same effect as that of the example illustrated in FIGS. 47 and 48.

Figure 57:
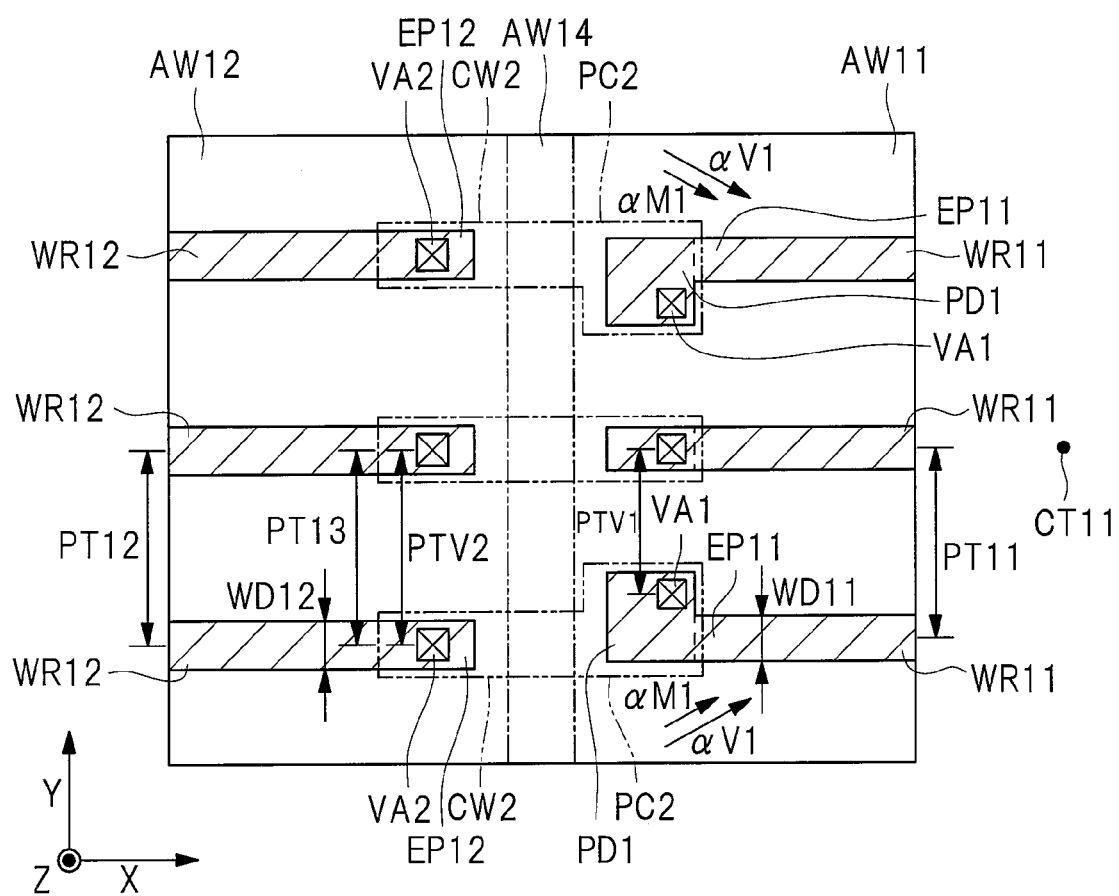
FIG. 57 is a plan view illustrating another example of the wiring layout of the wiring layer of the first layer in the second modification example of the second embodiment.
Figure 58:
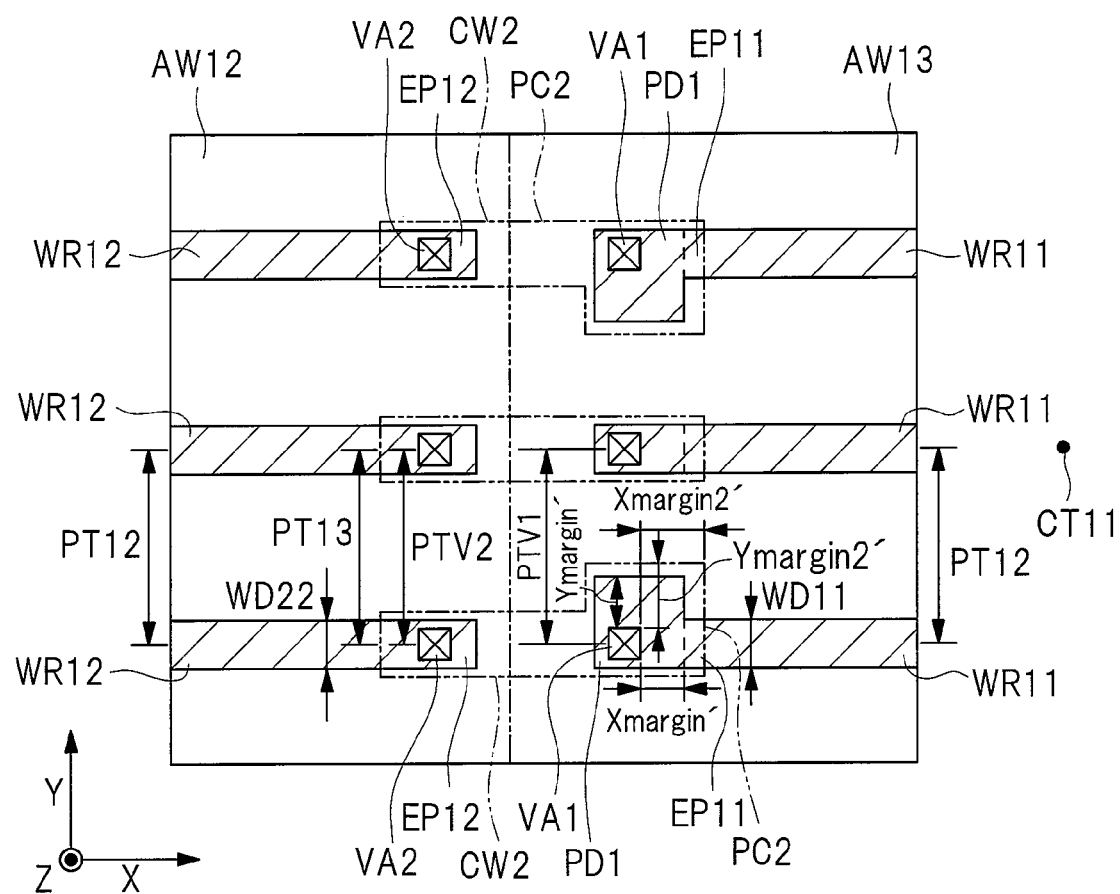
FIG. 58 is a plan view illustrating another example of the wiring layout of the wiring layer of the first layer in the second modification example of the second embodiment.

FIGS. 57 and 58 are plan views illustrating another example of the wiring layout of the wiring layer of the first layer in the second modification example of the second embodiment. FIG. 57 illustrates a layout after the shrink process, and FIG. 58 illustrates a layout before the shrink process.

In the example illustrated in FIGS. 57 and 58, the terminal PD1 and the terminal PC2 are disposed. In other words, in the example illustrated in FIGS. 57 and 58, a relation between the wiring layer ML1 of the first layer and the wiring layer ML2 of the second layer is reversed to a relation between the wiring layer ML1 of the first layer and the wiring layer ML2 of the second layer in the example illustrated in FIGS. 50 and 51.

However, unlike the example illustrated in FIG. 50, in the example illustrated in FIG. 57, the shrink process is performed on the plurality of wirings WR11 at a shrink rate αM1 larger than the shrink rate αV1 when the shrink rate of the plurality of vias VA1 is set to the shrink rate αV1. Therefore, as illustrated in FIG. 57, the pitch PT11 of the array of the plurality of wirings WR11 in the Y axis direction can be made larger than the pitch PTV1 of the array of the plurality of vias VA1 in the Y axis direction, and can be made smaller than the pitch PT12 of the array of the plurality of wirings WR12 in the Y axis direction. For example, when the shrink rate αV1 is set to 0.99, the shrink rate αM1 may be set to 0.995.

As illustrated in FIG. 58, the terminal PD1 before the shrink process protrudes by the distance Xmargin' toward the shrink center position CT11 in the X axis direction with respect to the area where the via VA1 is disposed. In addition, the terminal PD1 before the shrink process protrudes by the distance Ymargin' toward the shrink center position CT11 in the Y axis direction with respect to the area where the via VA1 is disposed. On the other hand, the terminal PC2 before the shrink process protrudes by the distance Xmargin2' toward the shrink center position CT11 in the X axis direction with respect to the area where the via VA1 is disposed. In addition, the terminal PC2 before the shrink process protrudes by the distance Ymargin2' toward the shrink center position CT11 in the Y axis direction with respect to the area where the via VA1 is disposed.

With such a configuration, even the example illustrated in FIGS. 57 and 58 achieves the same effect as that illustrated in FIGS. 50 and 51.

<Third Modification Example of Wiring Layout and Design Method>

Next, a third modification example of the wiring layout and the design method in the wiring layer will be described. In the third modification example, the wiring formed in the upper wiring layer on the side closer to the pixel area is electrically connected to the wiring disposed in the upper wiring layer on the side closer to the peripheral circuit area through the connection wiring formed in the lower wiring layer. In addition, in the third modification example, the shape of each of the plurality of terminals PD2 can be formed to be equal.

Figure 59:
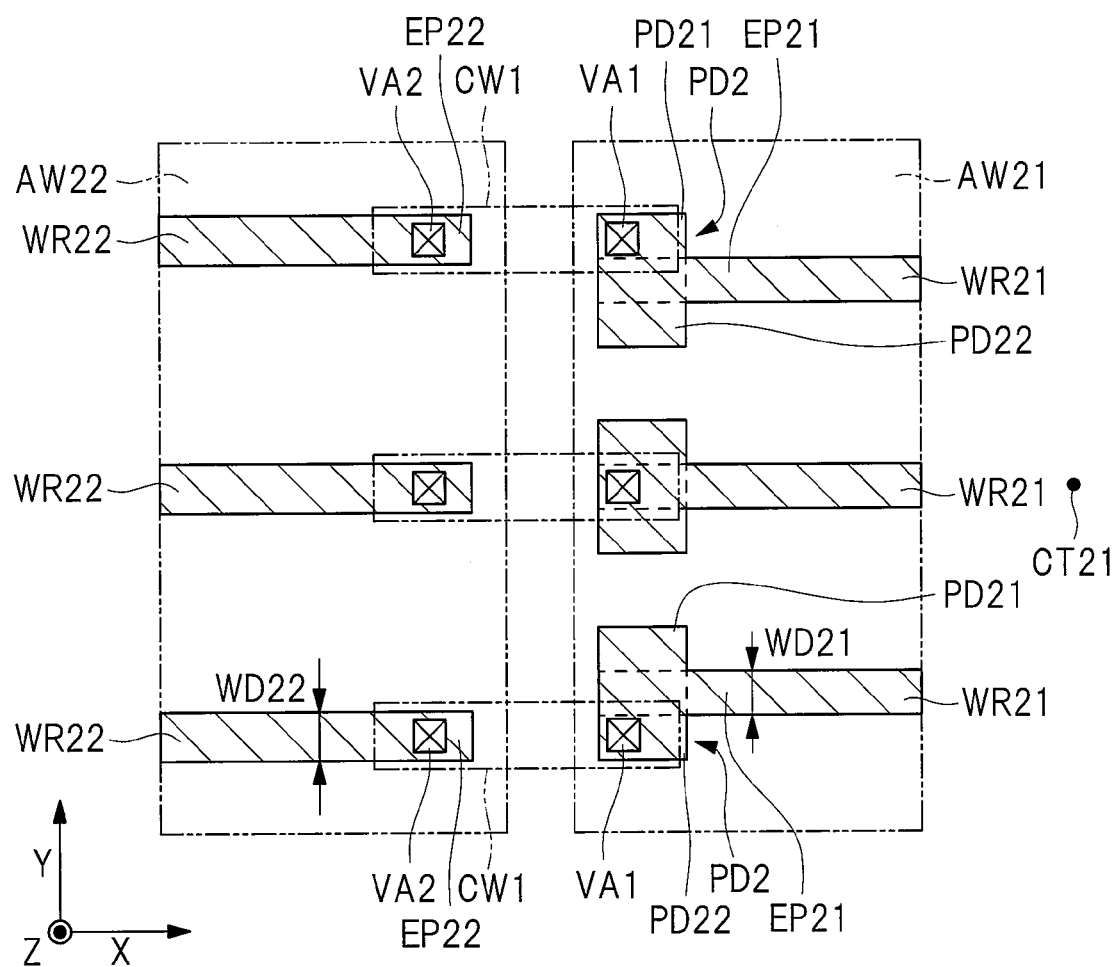
FIG. 59 is a plan view illustrating the wiring layout of the wiring layer of the second layer in a third modification example of the second embodiment.
Figure 60:
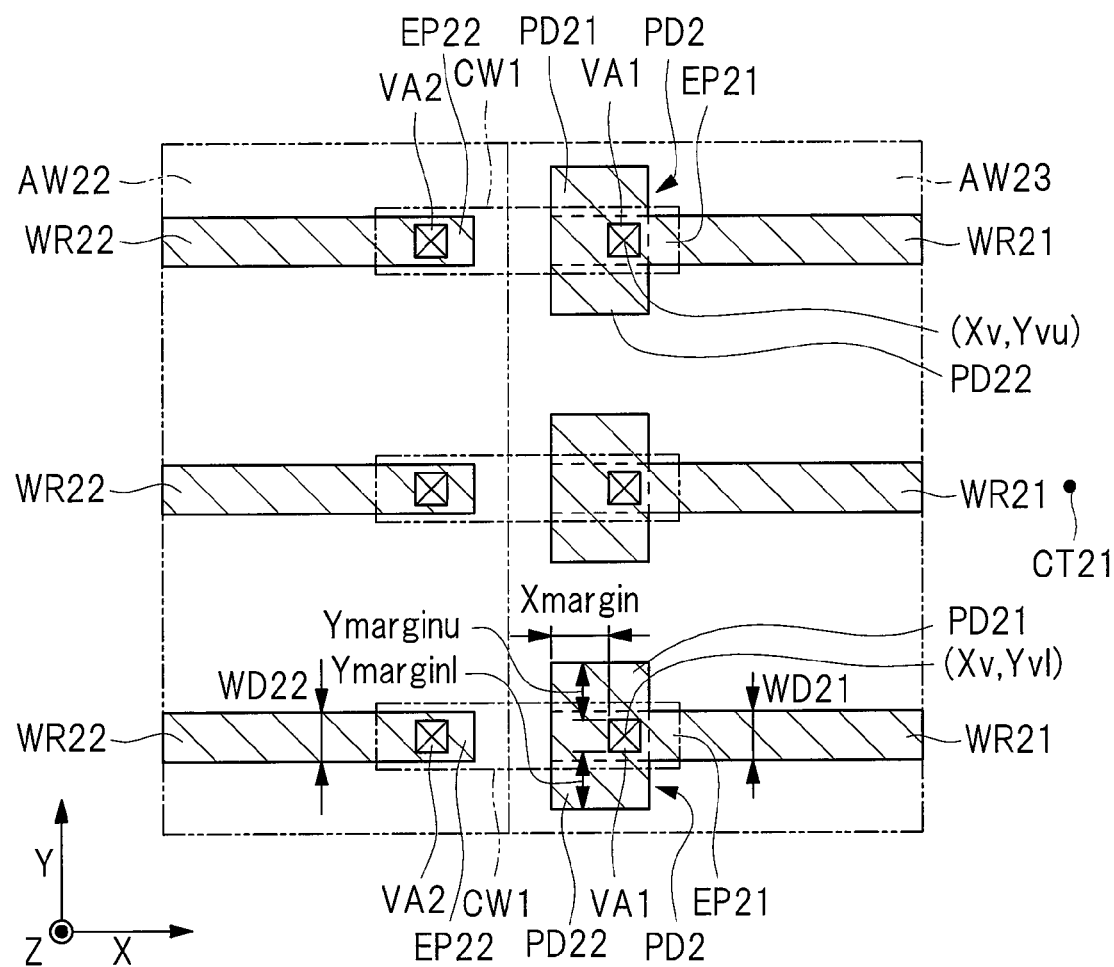
FIG. 60 is a plan view illustrating the wiring layout of the wiring layer of the second layer in the third modification example of the second embodiment.

FIGS. 59 and 60 are plan views illustrating the wiring layout of the wiring layer of the second layer in the third modification example of the second embodiment. FIG. 59 illustrates a layout after the shrink process, and FIG. 60 illustrates a layout before the shrink process. Further, FIGS. 59 and 60 are enlarged plan views of regions RG31, RG32, and RG33 of FIG. 39. In other words, FIGS. 59 and 60 illustrate the wiring disposed at the end portion on the positive side of the array in the Y axis direction, the wiring disposed in the center of the array in the Y axis direction, and the wiring disposed at the end portion on the negative side of the array in the Y axis direction with respect to each of the wiring WR21, the wiring WR22 and the connection wiring CW1.

In the example illustrated in FIGS. 40 and 42 in the second embodiment, the terminal PD2 before the shrink process protrudes by the distance Xmargin toward the side opposed to the shrink center position CT21 in the X axis direction with respect to the area where the via VA1 is disposed. In addition, the terminal PD2 before the shrink process protrudes by the distance Ymargin toward the side opposed to the shrink center position CT21 in the Y axis direction with respect to the area where the via VA1 is disposed. In addition, since the distance Xmargin and the distance Ymargin are different from each other between the plurality of terminals PD2 connected to the plurality of wirings WR21, the shapes of the plurality of terminals PD2 become different from each other in the plurality of terminals PD2.

On the other hand, in the third modification example, the shapes of the plurality of terminals PD2 are equal to each other in the plurality of terminals PD2 as illustrated in FIG. 59.

As illustrated in FIG. 59, even in the third modification example, the plurality of terminals PD2 are electrically connected to the plurality of wirings WR21, and electrically connected to the plurality of connection wirings CW1 through the plurality of vias VA1. In addition, in a set of the wiring WR21, the terminal PD2, the via VA1, and the connection wiring CW1 which are electrically connected, the terminal PD2 includes a projection PD21 protruding toward the positive side in the Y axis direction from the wiring WR21 and a projection PD22 protruding toward the negative side in the Y axis direction from the wiring WR21. In the set of the wiring WR21, the terminal PD2, the via VA1, and the connection wiring CW1 which are electrically connected, the terminal PD2 is overlapped with the connection wiring CW1 when seen in a plan view, and the via VA1 is included in the terminal PD2 of the portion overlapped with the connection wiring CW1 when seen in a plan view.

As illustrated in FIG. 60, the center coordinates of the via VA1 disposed in the end portion on the positive side of the array of the plurality of vias VA1 in the Y axis direction before the shrink process with respect to the shrink center position CT21 are set to (Xv, Yvu). In addition, the center coordinates of the via VA1 disposed in the end portion on the negative side of the array of the plurality of vias VA1 in the Y axis direction with respect to the shrink center position CT21 are set to (Xv, Yvl).

The projection PD21 included in each terminal PD2 before the shrink process protrudes by the distance Xmargin toward the side opposed to the shrink center position CT21 in the X axis direction with respect to the area where the via VA1 is disposed.

On the other hand, the projection PD21 included in each terminal PD2 before the shrink process protrudes by a distance Ymarginu toward the positive side in the Y axis direction with respect to the area where the via VA1 is disposed. In addition, the projection PD22 included in each terminal PD2 before the shrink process protrudes by a distance Ymarginl toward the negative side in the Y axis direction with respect to the area where the via VA1 is disposed.

Here, the distance Xmargin, a distance Ymarginu, and the distance Ymarginl are respectively set to values equal to or more then the values defined in the following Equations (12) to (14).

$$X\text{margin}=(1-\alpha)/\alpha \times (|Xv|+0.5\times V1+\alpha) \tag{12}$$

$$Y\text{margin}u=(1-\alpha)/\alpha \times (|Yvu|+0.5\times V1+\Delta) \tag{13}$$

$$Y\text{margin}l=(1-\alpha)/\alpha \times (|Yvl|+0.5\times V1+\Delta) \tag{14}$$

Only the distance Xmargin and the distance Ymargin described using FIGS. 40 and 42 in the second embodiment are sufficient for the protruding distance of the terminal PD2. However, since the number of terminals PD2 arranged in the Y axis direction is extremely large, in a case where the distance Xmargin and the distance Ymargin are set for each terminal PD2 while confirming the coordinates of the via VA1 corresponding to each terminal PD2 when the mask data is created, the process of creating the mask data becomes complicated. Therefore, as illustrated in FIGS. 59 and 60, a maximum value of the margin of each terminal PD2 (that is, a maximum value of the protruding distance of the terminal PD2 from the area where the via VA1 is disposed) is calculated in the entire cut-out area AW23, and the terminal PD2 of the same shape having the margin equal to or more than the maximum value is disposed. With such a configuration, the process of creating the mask data can be simply achieved compared to the second embodiment in addition to the effect of the second embodiment.

Figure 61:
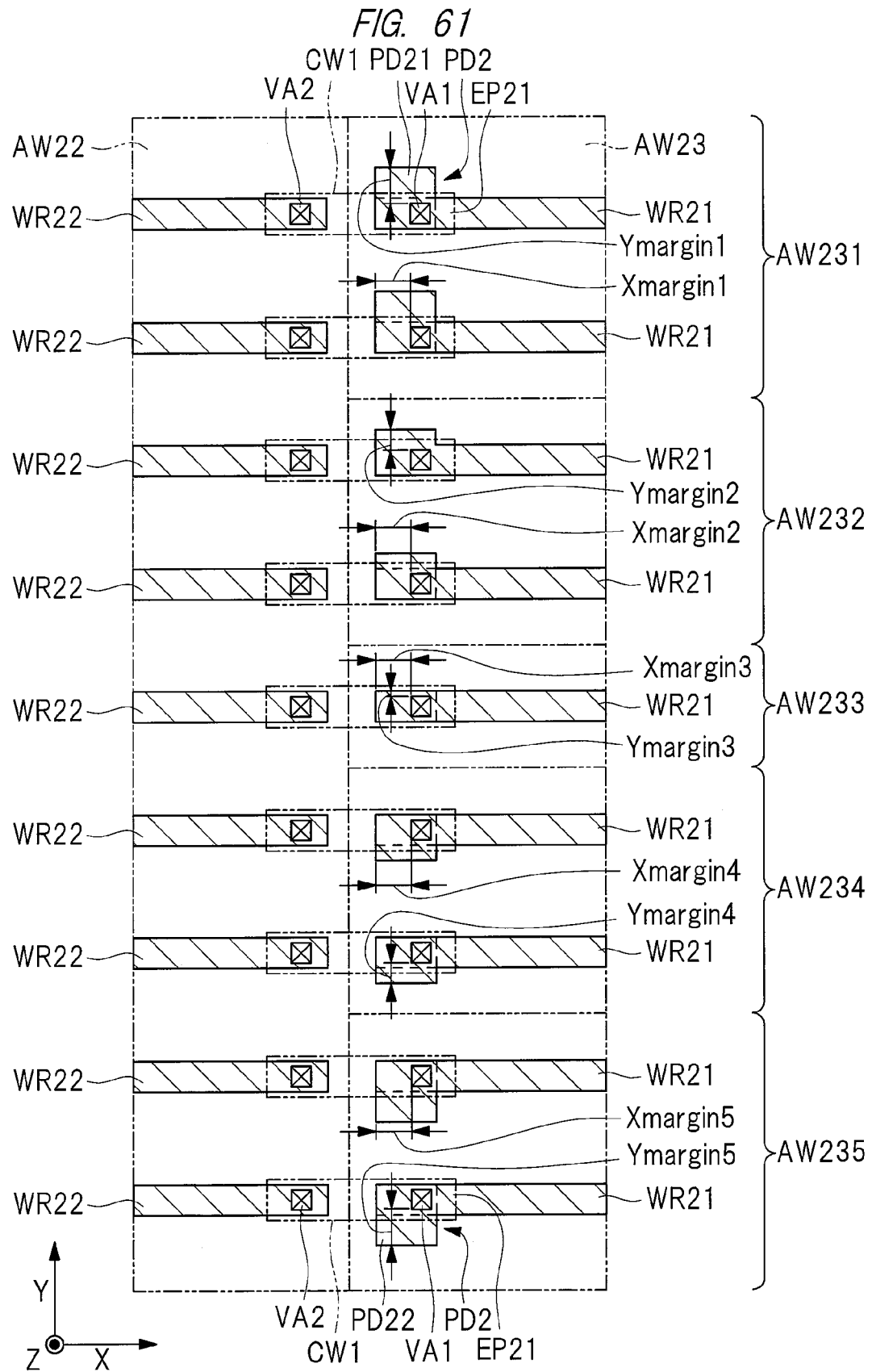
FIG. 61 is a plan view illustrating another example of the wiring layout of the wiring layer of the second layer in the third modification example of the second embodiment.

Furthermore, FIG. 61 illustrates an example derived from the example illustrated in FIGS. 59 and 60. FIG. 61 is a plan view illustrating another example of the wiring layout of the wiring layer of the second layer in the third modification example of the second embodiment. FIG. 61 illustrates a layout before the shrink process.

In the example illustrated in FIG. 61, the cut-out area AW23 is divided into five areas AW231 to AW235 in the Y axis direction. In addition, distances Xmargin1 to Xmargin5 are set while setting a maximum value in each of the areas AW231 to AW235 to the distance Xmargin, and distances Ymargin1 to Ymargin5 are set while setting a maximum value in each of the areas AW231 to AW235 to the distance Ymargin. Then, the terminal PD2 of the same shape having the margin equal to or more than the margin of each of the distances Ymargin1 to Ymargin5 is disposed in each of the areas AW231 to AW235.

At this point, the width in the Y axis direction of the terminal PD2 connected to the wiring WR21 disposed in the center portion of the array of the plurality of wirings WR21 in the plurality of terminals PD2 becomes narrower than the width in the Y axis direction of the terminal PD2 connected to the wiring WR21 disposed at the end portion of the array of the plurality of wirings WR21 in the plurality of terminals PD2.

For example, the cut-out area AW23 is divided by the number of areas which can be easily handled by a layout designer, a maximum value of the margin of each terminal PD2 is calculated for each of the plurality of divided areas, and the terminal PD2 of the same shape having the margin equal to or more than the maximum value is disposed. With such a configuration, even in the example illustrated in FIG. 61, the process of creating the mask data slightly becomes complicated compared to the example illustrated in FIGS. 59 and 60, but can be simply achieved compared to the second embodiment.

Further, while not illustrated in the drawing, the same modification example as the third modification example can be applied even to the first modification example of the second embodiment and the second modification example of the second embodiment.

<Fourth Modification Example of Wiring Layout and Design Method>

Next, a fourth modification example of the wiring layout and the design method in the wiring layer will be described. In the fourth modification example, the shrink process is performed even on the plurality of connection wirings CW1 in addition to the plurality of wirings WR21 and the plurality of vias VA1.

Figure 62:
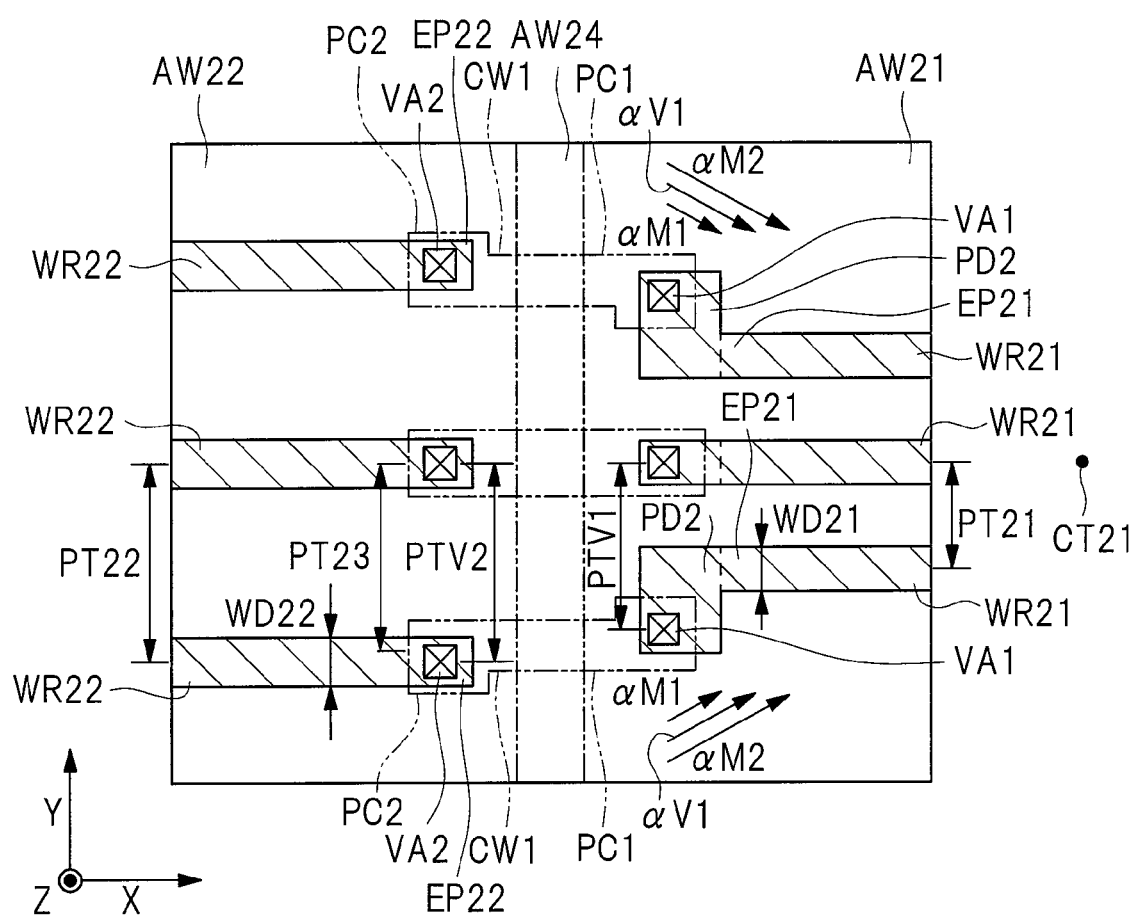
FIG. 62 is a plan view illustrating the wiring layout of the wiring layer of the second layer in a fourth modification example of the second embodiment.
Figure 63:
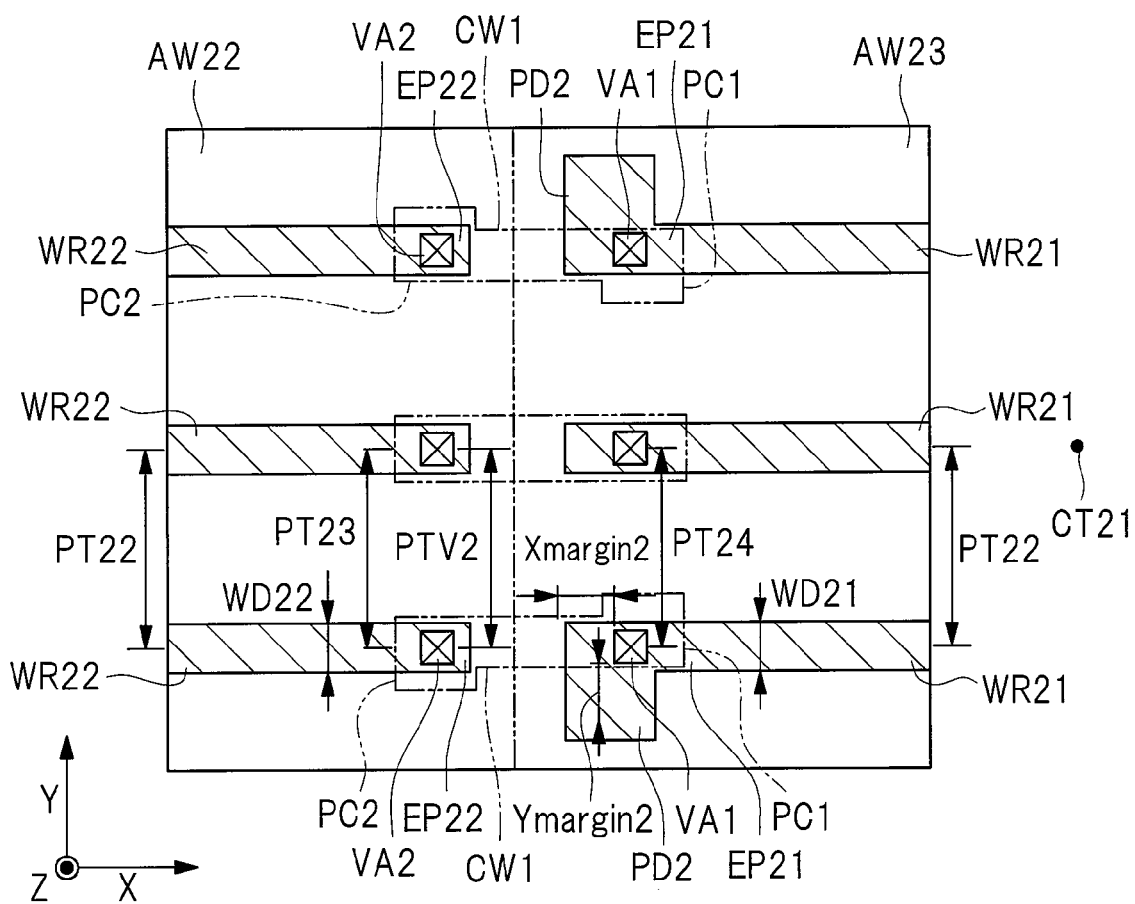
FIG. 63 is a plan view illustrating the wiring layout of the wiring layer of the second layer in the fourth modification example of the second embodiment.

FIGS. 62 and 63 are plan views illustrating the wiring layout of the wiring layer of the second layer in the fourth modification example of the second embodiment. FIG. 62 illustrates a layout after the shrink process, and FIG. 63 illustrates a layout before the shrink process.

In the example illustrated in FIG. 62, similarly to the example illustrated in FIG. 50, the shrink process is performed on the plurality of vias VA1 at the shrink rate αV1 larger than the shrink rate αM2 when the shrink rate of the plurality of wirings WR21 is set to the shrink rate αM2. Therefore, as illustrated in FIG. 62, the pitch PTV1 of the array of the plurality of vias VA1 in the Y-axis direction can be made larger than the pitch PT21 of the array of the plurality of wirings WR21 in the Y-axis direction.

Furthermore, in the example illustrated in FIG. 62, the shrink process is performed on the plurality of connection wirings CW1 at the shrink rate αM1 larger than the shrink rate αV1 unlike the example illustrated in FIG. 50. Therefore, as illustrated in FIG. 62, the pitch PT23 of the array of the plurality of connection wirings CW1 in the Y axis direction can be made larger than the pitch PTV1 of the array of the plurality of vias VA1 in the Y axis direction, and can be made smaller than the pitch PT22 of the array of the plurality of wirings WR22 in the Y axis direction.

In addition, the wiring layer ML1 of the first layer includes the plurality of terminals PC1. The plurality of terminals PC1 are formed in the same layer as that of the plurality of connection wirings CW1. Each of the plurality of terminals PC1 is connected to the end portion on the side closer to the area AW21 of each of the plurality of connection wirings CW1.

Even in the example illustrated in FIGS. 62 and 63, when the mask data is created, the margin is set in consideration of the shrink rates αM2, αV1, and αM1 in each of the wiring WR21, the via VA1, and the connection wiring CW1. With such a configuration, even after the shrink process is performed, the plurality of wirings WR21 can be electrically connected to the plurality of connection wirings CW1 through the plurality of vias VA1, and the plurality of wirings WR22 can be electrically connected to the plurality of connection wirings CW2 through the plurality of vias VA2. Therefore, even the example illustrated in FIGS. 62 and 63 can achieve the same effect as that of the example illustrated in FIGS. 40 and 42 in the second embodiment while improving the flexibility in design.

Further, while not illustrated in the drawing, the same modification example as the fourth modification example can be applied even to the first modification example of the second embodiment, the second modification example of the second embodiment, and the third modification example of the second embodiment.

In the foregoing, the invention made by the inventor of the present invention has been concretely described based on the embodiments. However, it is needless to say that the present invention is not limited to the foregoing embodiments and various modifications and alterations can be made within the scope of the present invention.

REFERENCE SIGNS LIST

AR1, AR2 area
AW11 to AW13, AW21 to AW23, AW231 to AW235 area
AW14, AW24, AW34 gap area
AW31 to AW33, AWV area
BS base member
BW barrier wall
CAP cap insulating film
CF color filter
CT11, CT21 shrink center position (position)
CT12, CT22, CT31, CT32 position
CW1 connection wiring (wiring pattern)
CW1a, CW2, CW2a connection wiring
CW11, CW12 extending portion
CW13 connection portion
DAT1, DAT1a, DAT2, DAT2a, DAT3, DAT3a mask data
DAT11, DAT21, DAT31 mask data of partially shrunk region
DAT13, DAT23, DAT33 partial mask data
DAT14, DAT34 gap partial mask data
DS1 to DS3 displacement amount
EP11, EP12, EP21, EP22 end portion
EX11, EX12 extending portion
FS flat surface
GE gate electrode
GI gate insulating film
IL, IL1 to IL3 interlayer insulating film
IL4 insulating film
ML micro lens
ML1 to ML3 wiring layer
MSK exposure mask
NW n-type semiconductor layer
OP1 opening
PC1, PC2 terminal
PD photo diode
PD1, PD2 terminal
PD21, PD22 projection
PT11 to PT13, PT21 to PT23 pitch
PTN1 to PTN3 exposure pattern
PTV1, PTV2 pitch
PU pixel
PW p-type semiconductor layer
RF1 resist film
RG1, RG2, RG31 to RG33 area
RP1 to RP3 resist pattern
SB semiconductor substrate
SC1, SC11, SC12, SC2, SC21, SC22 side surface
SC31, SC32 side surface
SF1, SF11 to SF13 light shielding film
SP1 space width
SW side wall
SW11, SW12, SW21, SW22 side surface
TR11 to TR13, TR2, TR3 wiring trench
TX transmission transistor
VA1, VA2 via
WC1 width
WD11 to WD14, WD21, WD22 width
WR11, WR12, WR13, WR21, WR22 wiring (wiring pattern)
WR11a, WR12a, WR1a, WR3 wiring
WR21 to WR23, WR2a, WR23, WR3 wiring

The invention claimed is:

1. A semiconductor device comprising:
a semiconductor substrate;
a plurality of photoelectric conversion elements that are formed in a first area of a main surface of the semiconductor substrate, in the main surface of the semiconductor substrate;
a plurality of first wirings that are formed in the first area in a same layer, above the main surface of the semiconductor substrate; and
a plurality of second wirings that are formed in a second area of the main surface of the semiconductor substrate, each of which is in the same layer as that of the plurality of first wirings,
wherein the second area is an area set on a first side of the first area in a first direction when seen in a plan view,
the plurality of first wirings are extended in the first direction and arranged at a first pitch in a second direction intersecting with the first direction when seen in a plan view,
the plurality of second wirings are respectively extended in the first direction and arranged at a second pitch in the second direction when seen in a plan view,
the plurality of first wirings are electrically connected to the plurality of second wirings, respectively, and
the first pitch is smaller than the second pitch.

2. The semiconductor device according to claim 1, comprising:
a plurality of wiring layers that are formed in the first area and the second area and above the main surface of the semiconductor substrate,
wherein the plurality of first wirings and the plurality of second wirings are included in a wiring layer that is at a lower level than a wiring layer of an uppermost layer in the plurality of wiring layers.

3. The semiconductor device according to claim 1,
wherein a first width in the second direction of each of the plurality of first wirings is narrower than a second width in the second direction of each of the plurality of second wirings.

4. The semiconductor device according to claim 1, comprising:
a plurality of connection wirings that are respectively formed in the same layer as that of the plurality of first wirings,
wherein the plurality of first wirings are connected to respective ones of the plurality of second wirings through respective ones of the plurality of connection wirings, respectively.

5. The semiconductor device according to claim 4,
wherein a third width in the second direction of each of the plurality of connection wirings is wider than a fourth width in the second direction of a first end portion on the side closer to the second area of each of the plurality of first wirings, and equal to or more than a fifth width in the second direction of a second end portion on the side closer to the first area of each of the plurality of second wirings.

6. The semiconductor device according to claim 1, wherein one of the plurality of first wirings is shifted toward a second side in the second direction from one of the plurality of second wirings that is connected to said one of the first wirings when seen in a plan view.

7. The semiconductor device according to claim 6, wherein the one of the plurality of first wirings has a third end portion with a portion thereof on the opposite side of the second side in the second direction,
the one of the plurality of second wirings connected to said one of the first wirings has a fourth end portion with a portion thereof on the second side in the second direction, and
the portion of the third end portion on the side closer to the second area comes into contact with the portion of the fourth end portion on the side closer to the first area.

8. The semiconductor device according to claim 5, wherein a first connection wiring in the plurality of connection wirings is connected to one of the plurality of first wirings, and connected to any one of the plurality of second wirings,
a first side surface on a third side in the second direction of the first connection wiring and a second side surface on the third side in the second direction of the first end portion of the one of the first wirings are formed in the same surface, and
a third side surface on the side opposite to the third side in the second direction of the first connection wiring and a fourth side surface on the side opposite to the third side in the second direction of the second end portion of the one of the second wirings are formed in the same plane.

9. The semiconductor device according to claim 8, wherein a fifth side surface on the side opposite to the third side in the second direction of the first end portion of the subject first wiring is disposed closer to the third side in the second direction than a sixth side surface on the third side in the second direction of the second end portion of the one of second wirings when seen in a plan view.

10. The semiconductor device according to claim 4, wherein a second connection wiring in the plurality of connection wirings is connected to any one of the plurality of first wirings, and connected to any one of the plurality of second wirings,
a seventh side surface on a fourth side in the second direction of a third end portion on the side closer to the second area of the subject first wiring is disposed closer to the fourth side in the second direction than an eighth side surface on the side opposed to the fourth side in the second direction of the fourth end portion on the side closer to the first area of the one of the second wiring when seen in a plan view,
a ninth side surface on the side opposed to the fourth side in the second direction of the second connection wiring and the eighth side surface are formed in the same surface, and
a tenth side surface on the fourth side in the second direction of the second connection wiring and the seventh side surface are formed in the same surface.

11. The semiconductor device according to claim 4, wherein an eleventh side surface on a fifth side in the second direction of the connection wiring of a set of the first wiring, the connection wiring, and the second wiring which are connected to each other is connected to both of a twelfth side surface on the fifth side in the second direction of the first wiring and a thirteenth side surface on the fifth side in the second direction of the second wiring, and
a fourteenth side surface on the side opposite to the fifth side in the second direction of the connection wiring of the set is connected to both of a fifteenth side surface on the side opposite to the fifth side in the second direction of the first wiring and a sixteenth side surface on the side opposite to the fifth side in the second direction of the second wiring.

12. The semiconductor device according to claim 1, comprising:
a plurality of connection wirings that are formed in a layer different from that of the plurality of first wirings,
wherein the plurality of first wirings are electrically connected to the plurality of second wirings through the plurality of connection wirings, respectively.

13. The semiconductor device according to claim 12, wherein the plurality of connection wirings are formed in a layer at a lower level than that of the plurality of first wirings.

14. The semiconductor device according to claim 12, comprising:
a plurality of first electrodes that are formed in a layer between the plurality of first wirings and the plurality of connection wirings; and
a plurality of second electrodes that are formed in a layer between the plurality of second wirings and the plurality of connection wirings,
wherein the plurality of first wirings are electrically connected to respective ones of the plurality of connection wirings through respective ones of the plurality of first electrodes,
the plurality of second wirings are electrically connected to respective ones of the plurality of connection wirings through respective ones of the plurality of second electrodes,
the plurality of first electrodes are arranged at a third pitch in the second direction when seen in a plan view,
the plurality of second electrodes are arranged at the second pitch in the second direction when seen in a plan view, and
the third pitch is smaller than the second pitch.

15. The semiconductor device according to claim 12, wherein the plurality of connection wirings are formed in a layer at an upper level than that of the plurality of first wirings.

16. The semiconductor device according to claim 14, comprising:
a plurality of first terminals that are formed in the same layer as that of the plurality of first wirings in the first area,
wherein the plurality of first terminals are electrically connected to respective ones of the plurality of first wirings, and are electrically connected to respective ones of the plurality of connection wirings through respective ones of the plurality of first electrodes,
the first terminal of a set of the first wiring, the first terminal, the first electrode, and the connection wiring which are electrically connected to each other includes a first projection which protrudes toward a sixth side in the second direction from the first wiring and a second projection which protrudes toward the side opposite to the sixth side in the second direction from the first wiring, the first terminal of the set is overlapped with the connection wiring when seen in a plan view, and the first electrode of the set is included in the first terminal of a portion overlapped with the connection wiring when seen in a plan view.

17. The semiconductor device according to claim 14, comprising:
   a plurality of second terminals that are formed in the first area and in the same layer as that of the plurality of first wirings, respectively,
   wherein the plurality of second terminals are electrically connected to respective ones of the plurality of first wirings, and are electrically connected to respective ones of the plurality of connection wirings through respective ones of the plurality of first electrodes,
   the second terminal in a set of the first wiring, the second terminal, the first electrode, and the connection wiring which are electrically connected to each other is overlapped with the connection wiring when seen in a plan view,
   the first electrode in the set is included in the second terminal of a portion overlapped with the connection wiring when seen in a plan view, and
   a sixth width in the second direction of the second terminal connected to the first wiring disposed in a center portion of an array of the plurality of first wirings in the plurality of second terminals is narrower than a seventh width in the second direction of the second terminal connected to the first wiring disposed at an end portion of the array of the plurality of the first wirings among the plurality of second terminals.

18. The semiconductor device according to claim 12,
   wherein the plurality of connection wirings are arranged at a fourth pitch in the second direction when seen in a plan view, and
   the fourth pitch is larger than the first pitch and smaller than the second pitch.

19. A semiconductor device comprising:
   a semiconductor substrate;
   a plurality of photoelectric conversion elements that are formed in a first area of a main surface of the semiconductor substrate, in the main surface of the semiconductor substrate;
   a plurality of first wirings that are formed in the first area, in the same layer above the main surface of the semiconductor substrate; and
   a plurality of second wirings that are formed in a second area of the main surface of the semiconductor substrate and in the same layer as that of the plurality of first wirings,
   wherein the second area is an area set on a first side of the first area in a first direction when seen in a plan view,
   the plurality of first wirings are extended in the first direction and arranged in the second direction intersecting with the first direction when seen in a plan view,
   the plurality of second wirings are extended in the first direction and arranged in the second direction when seen in a plan view,
   the plurality of first wirings are electrically connected to the plurality of second wirings, and
   a first wiring in the plurality of first wirings that is disposed at an end portion on a second side in the second direction of an array of the plurality of first wirings is shifted toward the side opposed to the second side in the second direction from one of the plurality of second wirings that is connected to said first wiring disposed at the end portion when seen in a plan view.

20. The semiconductor device according to claim 1, wherein the first and second wirings are at substantially the same height from the main surface of the semiconductor substrate.

* * * * *